United States Patent [19]
Yamaoka et al.

[11] Patent Number: 5,920,600
[45] Date of Patent: Jul. 6, 1999

[54] BIT PHASE SYNCHRONIZING CIRCUITRY FOR CONTROLLING PHASE AND FREQUENCY, AND PLL CIRCUIT THEREFOR

[75] Inventors: Nobusuke Yamaoka; Takashi Taya; Akira Yoshida; Shuichi Matsumoto, all of Tokyo, Japan

[73] Assignee: Oki Electric Industry Co., Ltd., Tokyo, Japan

[21] Appl. No.: 08/714,269

[22] Filed: Sep. 17, 1996

[30] Foreign Application Priority Data

Sep. 18, 1995 [JP] Japan .................................. 7-238637
Nov. 24, 1995 [JP] Japan .................................. 7-305703
Mar. 21, 1996 [JP] Japan .................................. 8-064755

[51] Int. Cl.$^6$ ........................................... H03D 3/24

[52] U.S. Cl. ........................... 375/376; 327/149; 327/158

[58] Field of Search ....................... 375/354, 371, 375/373, 376; 327/141, 144, 146–149, 152, 153, 155, 156, 158, 161; 331/18, 25

[56] References Cited

U.S. PATENT DOCUMENTS

| | | | |
|---|---|---|---|
| 4,821,297 | 4/1989 | Bergmann et al. | 375/371 |
| 5,022,057 | 6/1991 | Nishi et al. | 375/373 |
| 5,446,766 | 8/1995 | Wray | 375/373 |
| 5,687,203 | 11/1997 | Baba | 375/376 |

FOREIGN PATENT DOCUMENTS

| | | |
|---|---|---|
| 5-227145 | 9/1993 | Japan . |
| 7-74737 | 3/1995 | Japan . |
| 7-249965 | 9/1995 | Japan . |

OTHER PUBLICATIONS

"A 150/30 Mb/s CMOS Non–Oversampled Clock and Data Recovery Circuits with Instantaneous Locking and JItter Rejection", 1995 IEEE International Solid–State Circuits Conference, Feb. 1995.

"A 660Mb/s CMOS Clock Recovery Circuit with Instantaneous Locking for NRZ Data and Burst–Mode Transmission", *1993 IEEE International Solid–State Circuits Conference*, Feb. 1993.

"A Bit Synchronization Circuit for Burst Signals for High Speed PDS Systems", *Technical Report, The Institute of Electronics, Information and Communication Engineers,* Sep. 1995.

"A 45–Mbit/s CMOS VLSI Digital Phase Aligner", *IEEE Journal of Solid–State Circuits*, Apr. 1988.

*Primary Examiner*—Amanda Le
*Attorney, Agent, or Firm*—Rabin & Champagne, P.C.

[57] ABSTRACT

In bit phase synchronizing circuitry, received data with an unknown phase and triphase clocks output from a reset VCO (Voltage Controlled Oscillator) are input to a timing decision circuit. If preselected one of the triphase clocks and the received data have an adequate relation, the decision circuit causes the current clock phase to be maintained. If otherwise, the decision circuit determines whether the current clock phase should be advanced or retarded. The resulting decision signal output from the decision circuit is fed to a selector controller. The decision circuit latches the received data with the preselected one of the triphase clocks and outputs them together with the clock used for latching. A phase controller causes the reset VCO to selectively operate in a phase shift mode or in a multiplication PLL (Phase Locked Loop) mode. The circuitry is capable of setting up bit phase synchronization stably and rapidly with a simple configuration without regard to the phase of the received data. In addition, the circuitry is little susceptible to noise.

19 Claims, 38 Drawing Sheets

→ TIME

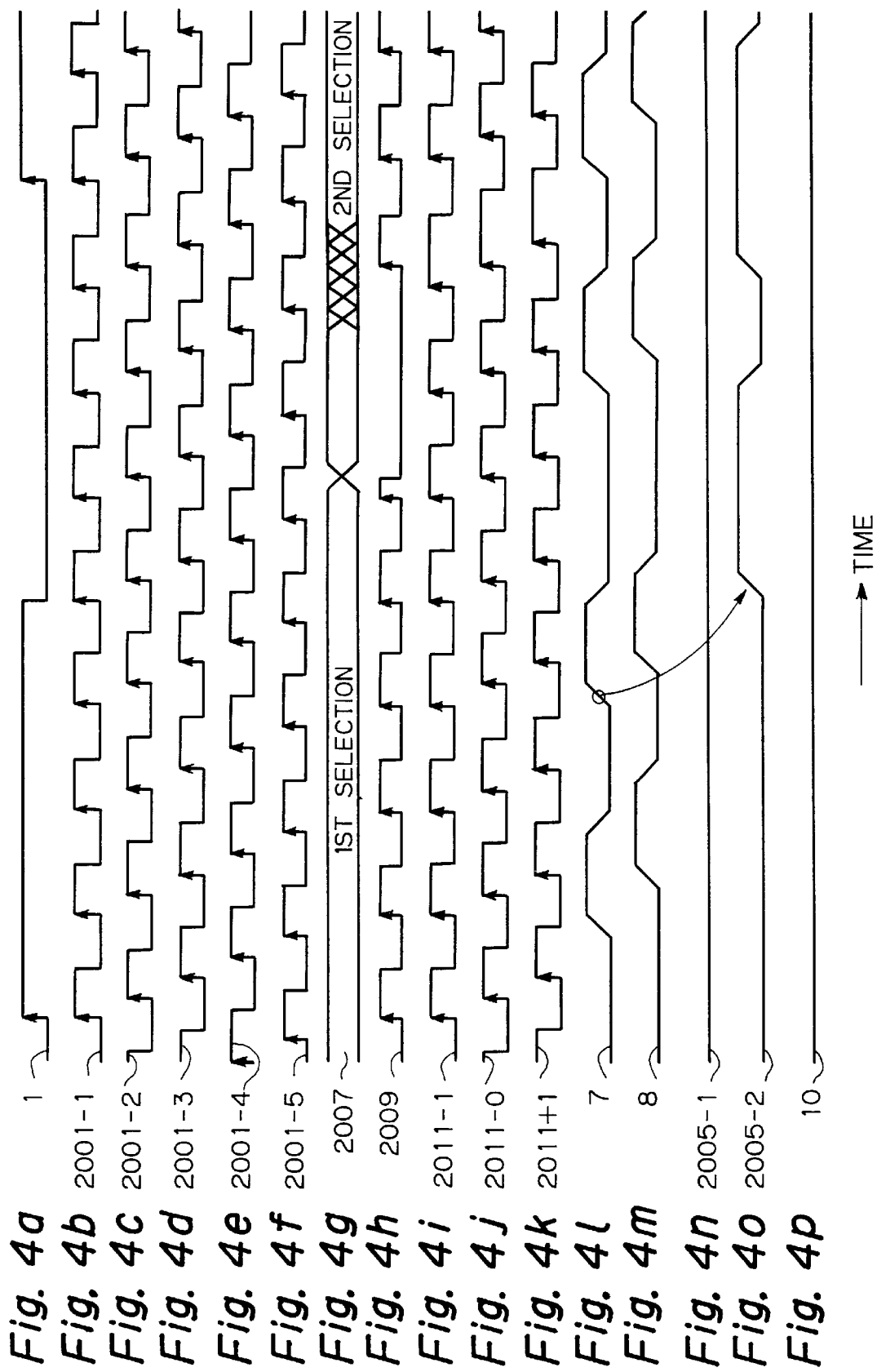

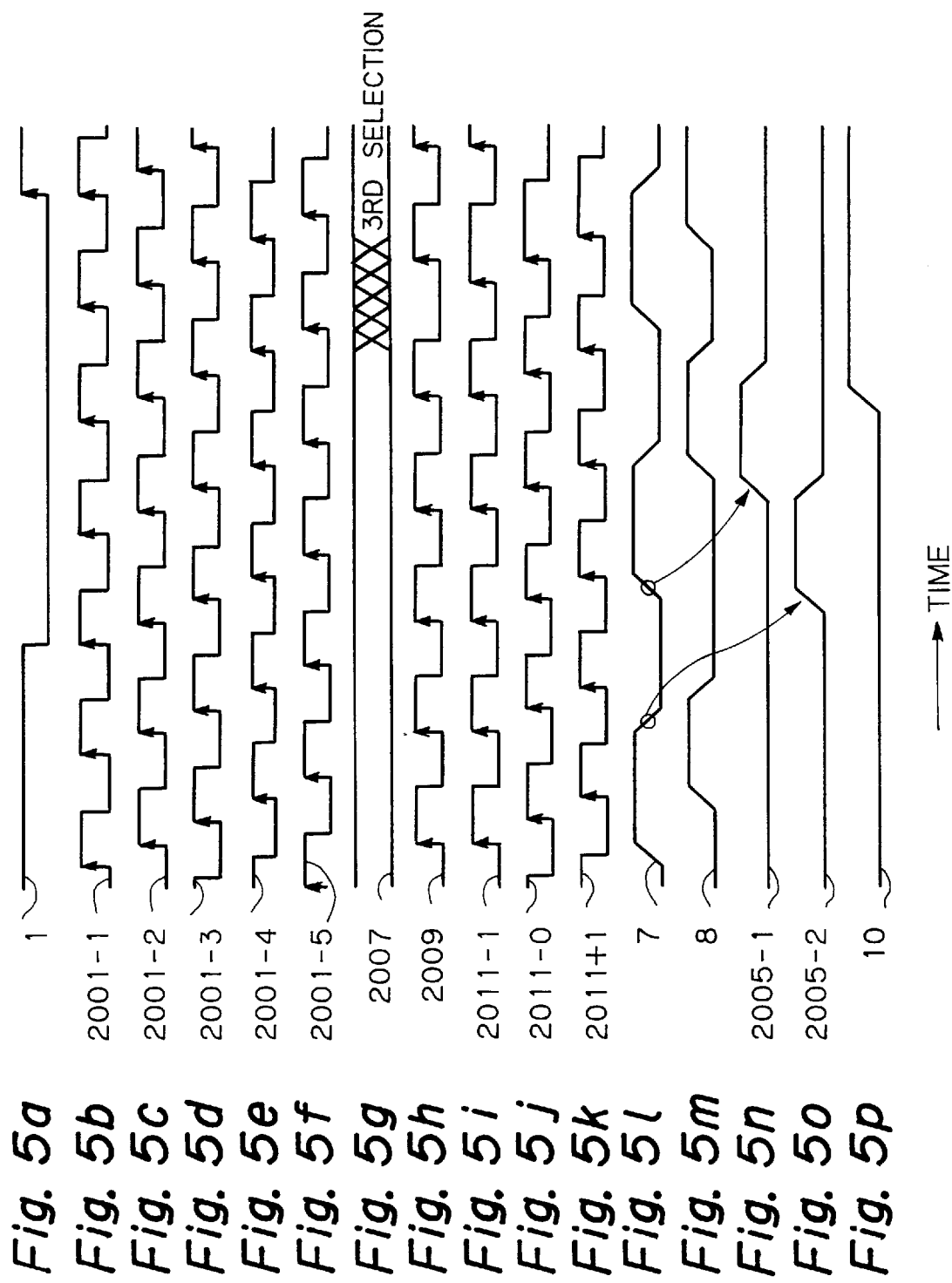

5,920,600

BIT PHASE SYNCHRONIZING CIRCUITRY FOR CONTROLLING PHASE AND FREQUENCY, AND PLL CIRCUIT THEREFOR

BACKGROUND OF THE INVENTION

1. Field of the Art

The present invention relates to bit phase synchronizing circuitry advantageously applicable to a transmission system, switching system or similar high-speed data transmission system, and a PLL circuit therefor.

2. Description of the Background Art

Conventional bit phase synchronizing systems select one of multiphase clocks each having a particular phase which is determined to have an adequate relation to received data in relation to timing. In this type of system, a selector selects one of the multiphase clocks. Received data are input to a timing decision circuit. The timing decision circuit determines whether or not the timing of the clock selected and that of the input data are adequate. A selection controller generates a control signal based on the output of the decision circuit and controls the selector therewith. Such a procedure is repeated until bit phase synchronization has been set up.

However, the above conventional system has the following problems. Because the selector switches the clocks, conventional control over the selector causes noise to be superposed on the clocks. Such noise cannot be obviated without the selector control being more sophisticated and without arranging the selection controller and selector with extreme precision for timing adjustment. This kind of arrangement is not readily practicable.

A communication system using burst-mode transmission has recently been proposed in various forms. For example, Atsushi Iwamura et al. teach "A Bit Synchronization Circuit for Burst Signals for High-Speed PDS Systems", Technical Report, The Institute of Electronics, Information and Communication Engineers of Japan, September, 1995, SSE95-83, IN-95-54, and CS95-103. Specifically, a high speed clock whose rate is several times as high as a transmission rate is frequency-divided in order to generate multiphase clocks each having a particular phase. After the input of a reset signal, data are sampled on the basis of the multiphase clocks. Transition points are detected from the data sampled in the respective phase. Finally, the data sampled in the phase estimated to be stable is selected.

The problems with the above burst adaptive synchronization scheme are as follows. The clock whose rate is several times as high as the transmission rate naturally results in expensive high speed devices for constituting, e.g., an LSI (Large Scale Integrated circuit). Further, bit phase synchronizing circuitry has customarily been designed to be reset by a reset signal appearing at the boundary between burst cells, to set up synchronization based on the transition point of the subsequent burst cell, and to hold it until the next reset signal appears. It is therefore necessary to bring the clock frequency being used by the synchronizing circuitry and the transmission rate into accurate coincidence, or to make the length of a burst cell short enough to obviate synchronization errors attributable to a difference in frequency. This cannot be done unless the synchronization with burst data which is more strict than synchronization with continuous data, is effected in an extremely short period.

SUMMARY OF THE INVENTION

It is therefore an object of the present invention to provide bit phase synchronizing circuitry capable of outputting, without regard to the phase of received data, stable and rapid synchronized data and a synchronizing clock in a stable and rapid manner with a simple arrangement, and a PLL (Phase Locked Loop) circuit therefor.

In accordance with the present invention, circuitry for bit phase synchronizing received data and a first clock having a clock frequency which is $\alpha$ (natural number) times as high as or $1/a$ of the bit rate of the received data has an n-phase clock generator (n being 2 or greater natural number) having a PLL circuit. The PLL circuit generates, out of a reference clock having a rate m (m>0) times as high as or $1/m$ of the clock frequency of the first clock, n-phase clocks with a frequency which is $\alpha$ times as high as or $1/a$ of the bit rate of the received data, and sequentially shifted in phase by a value produced by equally dividing one bit width of the received data, and also generates a frequency control signal. A selector selects one of the n-phase clocks in response to a selection control signal. A clock generator generates the first clock and has a reset VCO (Voltage Controlled Oscillator) circuit for receiving the frequency control signal and one clock selected by the selector as a phase control signal to thereby execute phase control and frequency control. A timing decision circuit detects a difference in phase between the first clock and the received data, generates the selection control signal based on a phase difference signal representative of the difference, and feeds the selection control signal to the selector. At the same time, the decison circuit latches the received data with the first clock and outputs bit phase synchronized data.

Also, in accordance with the present invention, a PLL circuit for bit phase synchronizing circuit has a reset VCO circuit, a phase comparison control circuit, an input terminal for receiving a phase switching signal, and a phase controller. When the phase switching signal has a preselected state, the phase controller feeds a phase control signal to the reset VCO to thereby set up a phase shift mode in which only the reset VCO oscillates. When the phase switching signal does not have the preselected state, the phase controller feeds the phase control signal to the phase comparison control circuit to thereby set up a PLL mode.

BRIEF DESCRIPTION OF THE DRAWINGS

The objects and features of the present invention will become more apparent from the consideration of the following detailed description taken in conjunction with the accompanying drawings in which:

FIGS. 4a–4p are timing charts demonstrating the operation of the embodiment;

FIGS. 5a–5p are timing charts which are the continuation of FIGS. 4a–4p, respectively;

DESCRIPTION OF THE PREFERRED EMBODIMENTS

Figure 2:
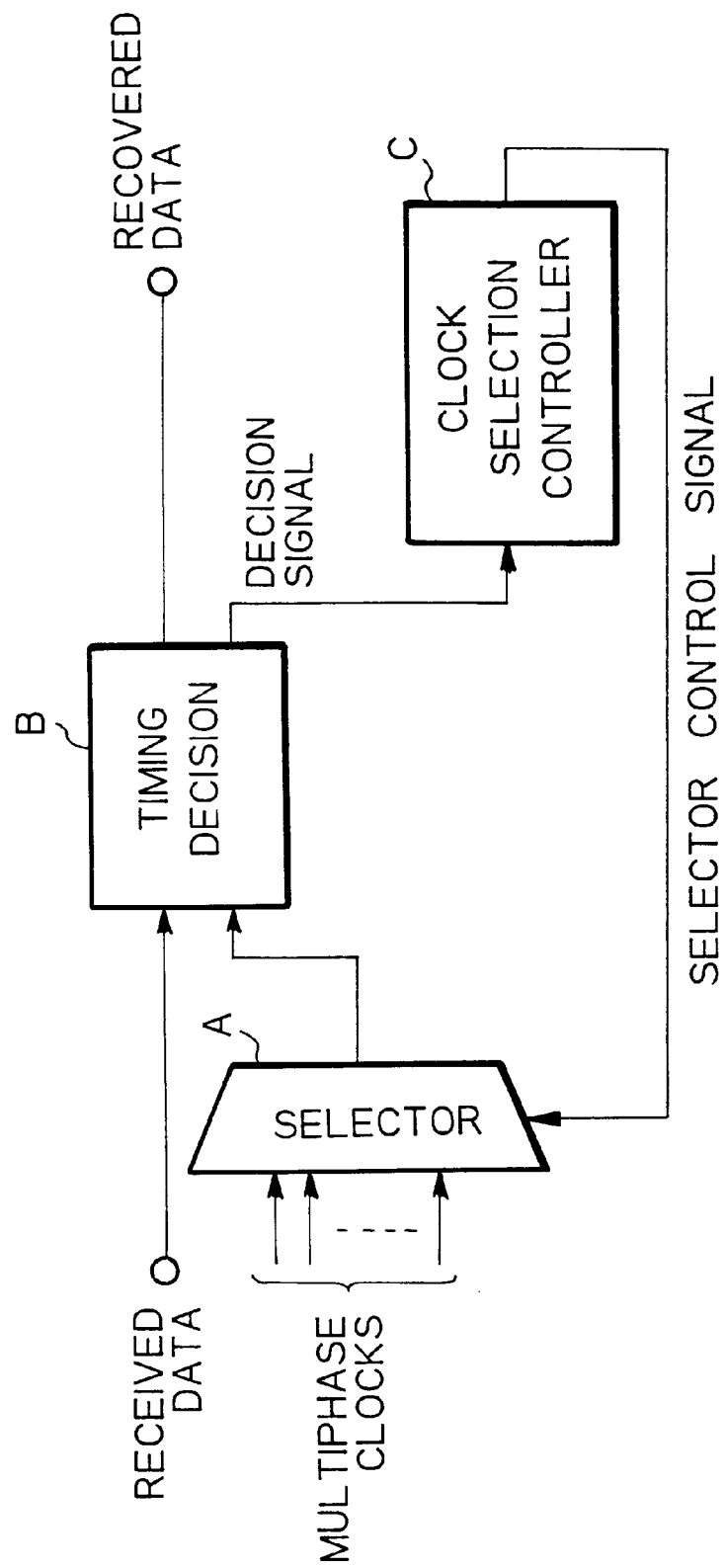
FIG. 2 is a block diagram schematically showing conventional bit phase synchronizing circuitry.

To better understand the present invention, a brief reference will be made to a conventional system for selecting one of the multiphase clocks which is synchronous to received data, shown in FIG. 2. As shown, a selector A receives multiphase clock inputs and receives a control signal output from a selection controller C. The selector A selects one of the multiphase clocks in accordance with the control signal and feeds it to a timing decision B. Received data are also input to the timing decision B. The timing decision B determines whether or not the timing of the input clock and that of the input data are adequate. The resulting output of the decision B is applied to the selection controller C. The selection controller C generates a control signal based on the output of the decision B, i.e., the result of decision, and feeds it to the selector A. Such a procedure is repeated until bit phase synchronization has been set up. This kind of system, however, has some problems left unsolved, as discussed earlier.

Figure 1:
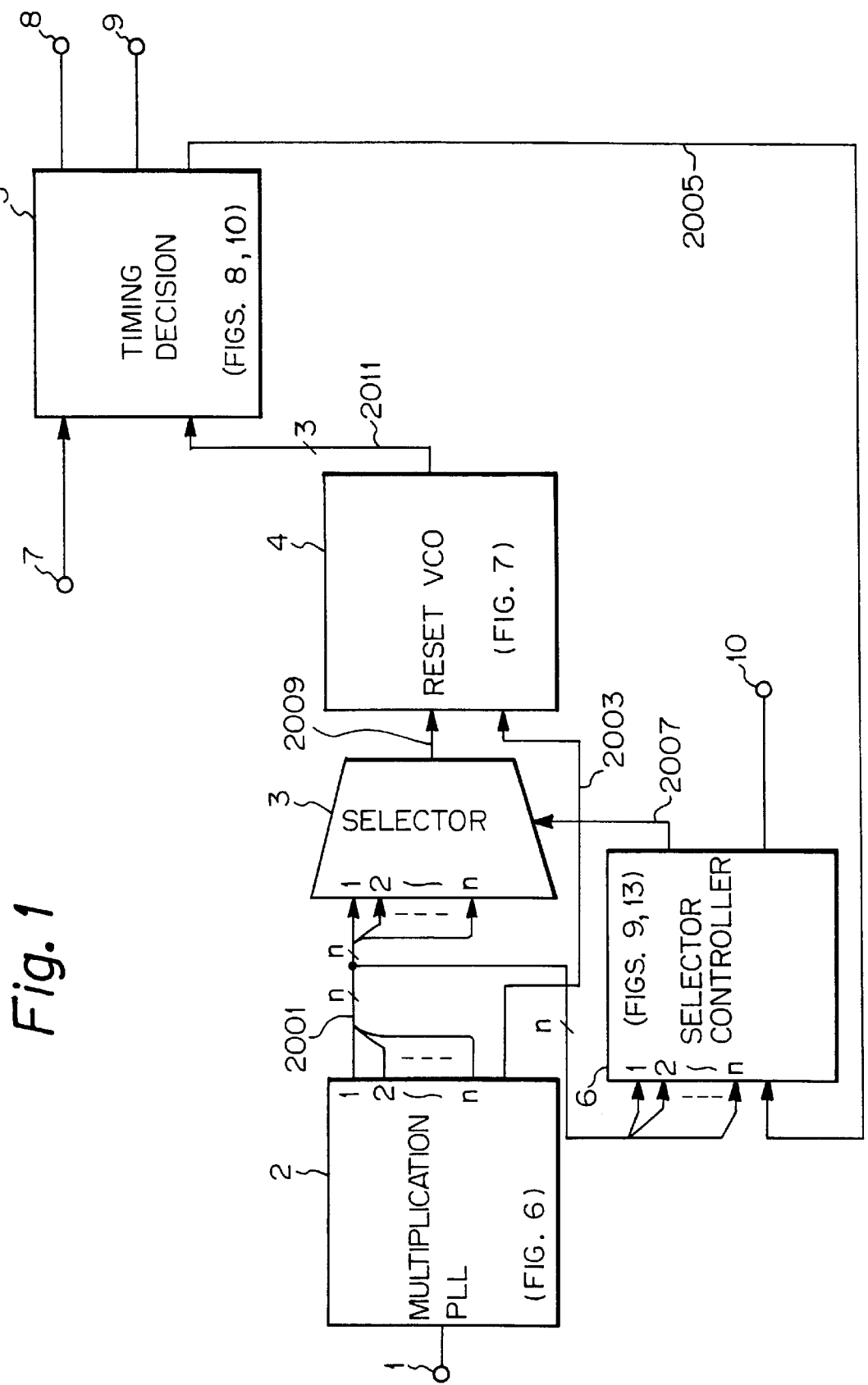
FIG. 1 is a block diagram schematically showing bit phase synchronizing circuitry embodying the present invention.

Referring to FIG. 1, bit phase synchronizing circuitry embodying the present invention will be described. As shown, the circuitry has a multiplication PLL 2, a selector 3, a reset VCO 4, a timing decision 5, and a selection controller 6. A reference clock is applied to the multiplication PLL 2 via an input terminal 1. The reference clock has a rate which is m (m>0) times as high as the frequency of the bit rate of received data. The PLL 2 generates a clock equal in frequency to the bit rate of received data. In addition, the PLL 2 implemented by a ring oscillator or similar VCO is capable of generating multiphase clocks each having a particular phase. The multiphase clocks appear on output terminals 2001-1 through 2001-n, respectively. As shown in FIGS. 4b–4f, the multiphase clocks are sequentially shifted in phase by a value produced by equally dividing one clock period of the clock to be multiplied by the PLL 2. Specifically, the phase is sequentially delayed, starting at a multiphase clock 1 and ending at a multiphase clock n. In addition, the PLL 2 produces a frequency control voltage on its output terminal 2003 for controlling the the reset VCO 4. It is to be noted that various signals appearing in the circuitry are designated by the reference numerals attached to the associated connection lines.

The selection controller 6 receives the multiphase clocks from the PLL 2 via its input terminals 2001 (1–n) and receives a decision signal 2005 representative of the result of decision from the timing decision 5 via another input terminal. In response, the controller 6 sends a selection control signal 2007 to the selector 3. After the controller 6 has changed the selection control signal 2007, it waits until a preselected guard time elapses for allowing the change to be accurately reflected on the output of the timing decision 5. Thereafter, the controller 6 again changes the selection control signal 2007 in response to the next output of the timing decision 5.

Specifically, the selection controller 6 outputs a plurality of control signals 2007 each being assigned to one of the multiphase clocks 2001-1 through 2001-n input to the selector 3, thereby controlling them one by one. The guard time of the selection controller 6 should be longer than a period of time necessary for a signal output from the controller 6 to be fed back to the same via the selector 3, reset VCO 4, and timing decision 5. The feedback time is as short as three to ten periods of the oscillation output of the PLL 2, although it depends on the configuration of the reset VCO 4 and that of the timing decision 5.

The selector 3 selects one of the multiphase clocks 2001 fed from the PLL 2, as indicated by the control signals 2007 fed from the selection controller 6. The clock 2001 selected appears on an output terminal 2009.

Figure 3A:
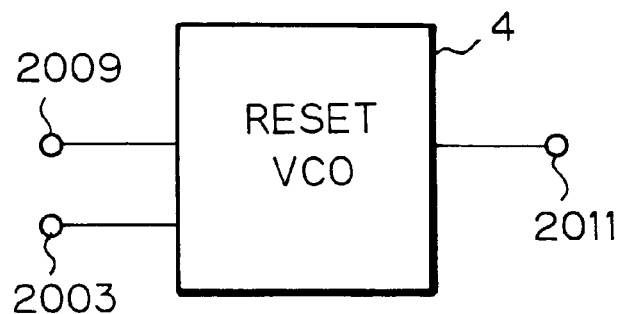
FIGS. 3a and 3b show a reset VCO included in the embodiment specifically.
Figure 3B:
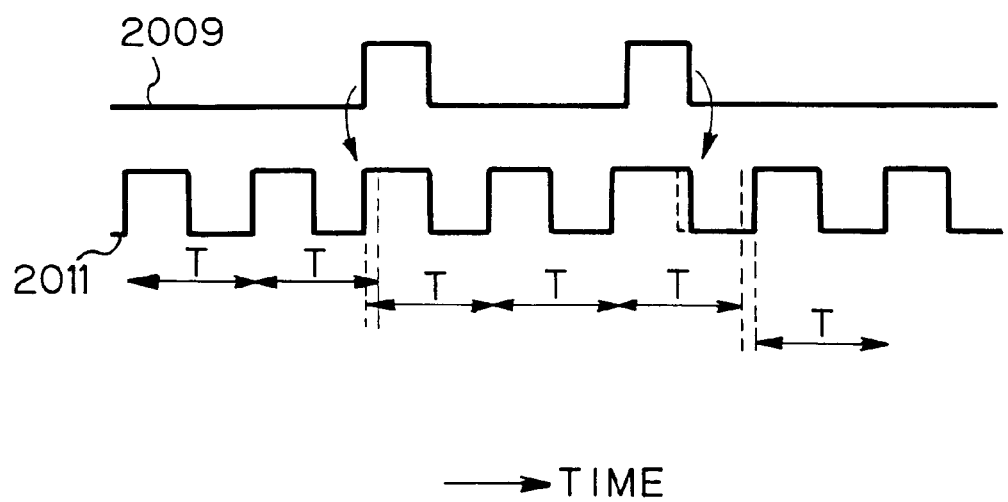

As shown in FIGS. 3a and 3b, the reset VCO 4 has timing information and can directly advance or retard its oscillation phase in response to the clock signal or pulses 2009. The VCO 4 is capable of generating an output clock 2011 corresponding in phase to the input clock 2009 in a period of time (control response time) as short as one to five periods of the oscillation clock. Specific configurations of the VCO 4 are disclosed in, e.g., Japanese patent laid-open publication Nos. 227145/1993, 74737/1995 and 249965/1995 as well as in Japanese patent application No. 35669/1995.

More specifically, the reset VCO 4 has an input terminal 2009 for receiving the clock or phase control signal output from the selector 3, and an input terminal 2003 for receiving the frequency control voltage signal from the PLL 2. The VCO 4 forcibly controls the phase of the output clock 2011 on the basis of the pulse phase of the phase control signal 2009. That is, the VCO 4 selectively receives one of the pulse signals each having one of n different phases, and produces an output clock 2011 corresponding to the received pulse signal. So long as the significant control signal 2009 is not input to the VCO 4, the VCO 4 self-runs at a frequency determined by the frequency control voltage signal 2003. If a VCO constituting the VCO 4 is provided with the same configuration as a VCO constituting the PLL 2, then the VCO 4 will self-run at a frequency substantially identical with the oscillation frequency of the PLL 2.

Furthermore, the VCO 4 produces on its output terminal 2011 three different clocks each having a particular phase, i.e., a given reference phase clock 0, a clock −1 next to the reference clock, but advanced in phase, and a clock +1 next to the reference clock, but retarded in phase. The three clocks or triphase clocks −1, 0 and +1 are respectively applied to input terminals −1, 0 and +1 included in the timing decision 5.

The timing decision 5 receives data of unknown phase via a data input terminal 7, while receiving the triphase clocks 2011 from the reset VCO 4. In response, the decision 5 outputs a decision signal 2005 based on the relation in phase between the clock 0 and the received data. If the above relation in phase is adequate, the decision signal 2005 indicates that the current clock phase should be maintained. If the relation is inadequate, the decision signal 2005 indicates that the current clock phase should be advanced or retarded. The signal 2005 is fed from the timing decision 5 to the selection controller 6.

Further, the timing decision 5 latches the received input data 7 with the triphase clock 0 and delivers the latched data to a recovered data output terminal 8 via its data output terminal. At the same time, the decision 5 delivers the clock used to latch the received data to a clock output terminal 9.

The operation of the illustrative embodiment will be described with reference to FIGS. 4a–4p and 5a–5p. FIGS. 4a–4p are continued to FIGS. 5a–5p, respectively. In FIGS. 4a–4p and 5a–5p, it is assumed that the frequency division ratio m of the reference clock 1 to the bit rate of the received data is "8", and that the number of phases n of the multiphase clocks 2001 is "5". Assume that the clock 1 (FIGS. 4a and 5a) whose frequency is m (m>0) times as high as the frequency of the bit rate of the data 7 (FIGS. 4l and 5l) is applied to the multiplication PLL 2 first. Then, the multiplication PLL 2 outputs a clock identical in frequency with the bit rate of the data 7. Further, the PLL 2 outputs the multiphase clocks 2001 (FIGS. 4b–4f and 5b–5f) sequentially shifted in phase by the previously stated value. The clocks 2001 are applied to the selector 3 and selection controller 6. In addition, the PLL 2 delivers the frequency control voltage signal 2003 to the reset VCO 4.

In response to the multiphase clocks 2001, the selection controller 6 waits until the previously mentioned guard time expires, and then outputs the selection control signals 2007 (FIGS. 4g and 5g) in response to the decision signal 2005 output from the timing decision 5. The decision signal 2005 is fed to the selection controller 6 and capable of controlling, one by one, the clocks 2001-1 through 2001-n input to the selector 3. The selection controller 6 is provided with the previously stated guard time longer than the feedback time which can be as short as three to ten periods of the oscillation clock of the PLL 2.

The selector 3 selects one of the multiphase clocks 2001 in accordance with the control signal 2007 and delivers it to the reset VCO 4 via its output terminal 2009 (FIGS. 4h and 5h). If two or more of the control signals 2007 go high at the same time, then the selector 3 produces an OR of the clocks 2001 corresponding to the control signals 2007 gone high. The output 2009 of the selector 3 is input to the phase control signal input terminal of the reset VCO 4. In response, the VCO 4 forcibly controls the phase of the output clock 2011, i.e., outputs a clock corresponding in phase to one of the pulses 2001 having any one of the n different phases. When no pulses are input to the input terminal 2009, the reset VCO 4 self-runs at a frequency determined by the voltage signal 2003 fed from the PLL circuit 2. As a result, three clocks respectively having phases 2011-1, 2011-0 and 2011+1 are fed from the VCO 4 to the timing decision 5.

Assume that the phase control signal 2009 input to the reset VCO 4 is active high. Then, the selection control signals 2007 are each latched, before output via the output terminal 2007, in a phase opposite to the phase of the multiphase clocks 2001. When a plurality of selection control signals 2007 go high at the same time, the selector 3 outputs an OR of the clocks 2001 corresponding to the signals 2007 gone high.

When the selector 3 switches input clocks, one pulse of the phase control signal 2009 is sometimes lost. In such a case, the reset VCO 4 self-runs in accordance with the frequency control voltage signal 2003 without controlling the phase. When the phase control signal 2009 is active low, the reset VCO 4 uses the positive phase of the corresponding multiphase clock 2001 for the clock of the latch stage of the control signal.

The timing decision 5 determines whether or not the phase of the clock 2011–0 output from the reset VCO 4 together with the clocks 2011–1 and 2011+1 has an adequate relation in phase to the received data 7. If the answer of this decision is positive, the decision 5 outputs the received data 7 and clock 2011–0 via the output terminals 8 and 9, respectively. If the answer of the above decision is negative, the decision 5 delivers the decision signal 2005 (FIGS. 4n and 5n or FIGS. 4o and 5o) to the selection controller 6, causing it to adjust the phase of the clock. The decision 5 latches the received data 7 with the clock 2011–0 and outputs the latched data as recovered data 8 (FIGS. 4m and 5m). At the same time, the decision 5 outputs the clock 2011 used for latching via the output terminal 9 as a clock for the recovered data.

Assume that the decision signal 2005 appeared within the guard time and contains both the information for advancing the phase of the reset VCO 4 and the information for retarding it. Then, the selection controller 6 determines that noise has been superposed on the received data 7, or that the input value is indefinite due to, e.g., the shut-off of the input channel, or that a tracking error has occurred in the output clock 2011 of the reset VCO 4 relative to the received data 7. In this case, the controller 6 delivers a timing error signal (FIGS. 4p and 5p) to a timing error output terminal 10.

Figure 6:
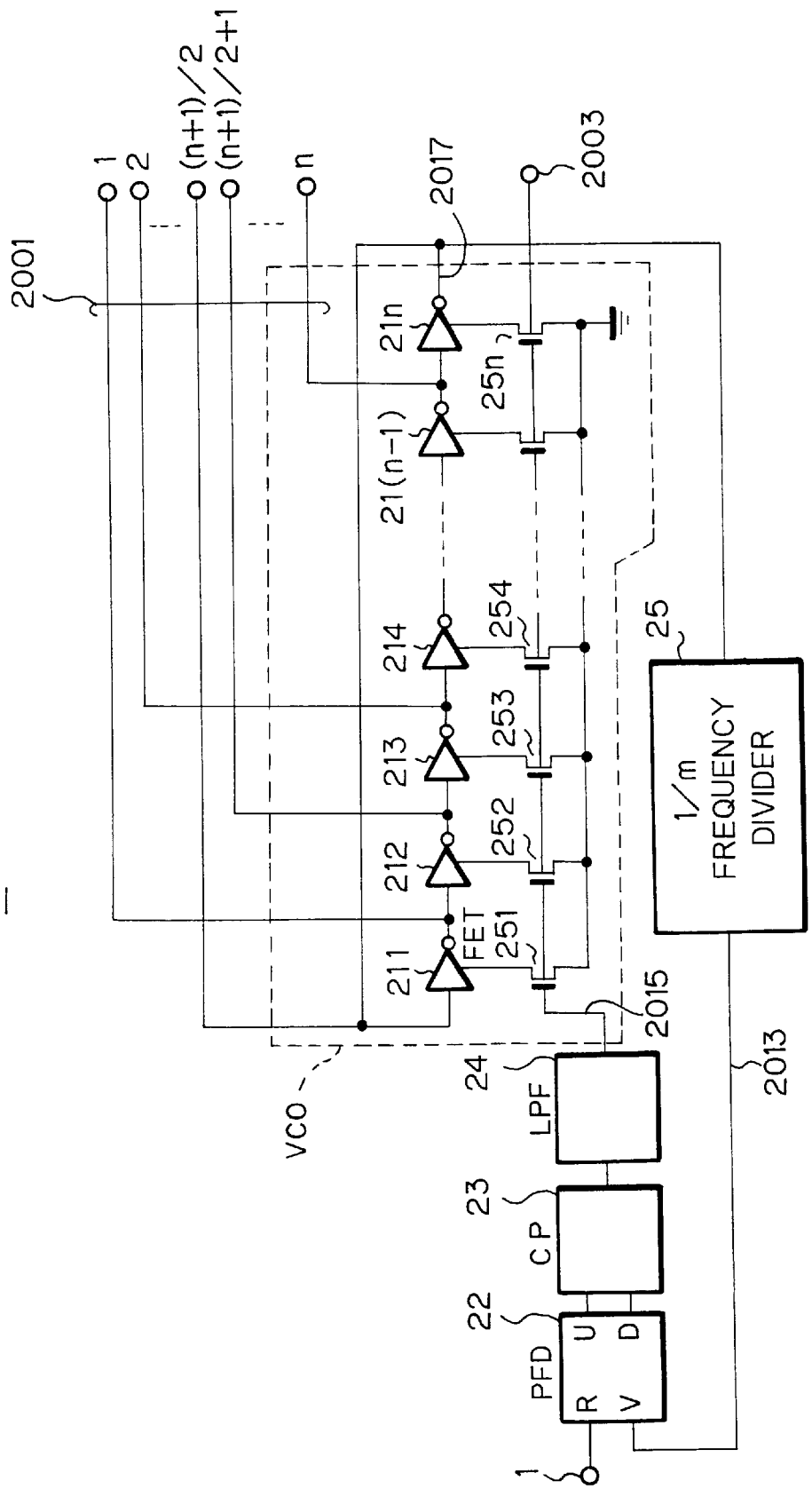
FIG. 6 is a block diagram schematically showing a specific configuration of a multiplication PLL circuit included in the embodiment.

FIG. 6 shows a specific configuration of the multiplication PLL 2. As shown, the PLL 2 has voltage control delay inverters 211–211n, FETs (Field Effect Transistors) 251–25n, a phase/frequency detector (PFD) 22, a charge pump (CP) 23, a low pass filter (LPF) 24, and a 1/m frequency divider 25. The PFD 22 receives the reference clock 1, compares the phase of the reference clock 1 with the phase of a clock 2013 output from the 1/m frequency divider 25, and then applies an up (U) or a down (D) signal representative of the result of comparison to the CP 23. In response, the CP 23 performs a charging pump function using, e.g., analog and digital circuit devices and thereby shapes the waveforms of the input U or D signal. The LPF 24 filters the output of the CP 23 and delivers its output to the gate terminals 2015 of the FETs 251–25n. At the same time, the output of the LPF 24 is fed out via the frequency control voltage output terminal 2003.

The voltage control delay inverters 211–21n and FETs 251–25n as enclosed by a dashed line in FIG. 6 constitute a VCO. On receiving the output 2015 of the LPF 24, the VCO generates clocks of n different phases and delivers them via the clock output terminals 2001, while returning a part 2017 of the clocks to the frequency divider 25. Specifically, the outputs 2017 of the delay inverters 211–21n are fed out via the clock output terminals 2001-1 through 2001-n while the output 2017 of the delay inverter 21n is fed to the frequency divider 25. The frequency divider 25 divides the output 2017 of the delay inverter 21n by m (real number greater than 1 inclusive) and feeds the result of division to the the input 2013 of the PFD 22. With this configuration, the VCO is capable of generating the multiphase clocks 2001 and frequency control voltage signal 2003 based on the reference clock 1.

Figure 7:
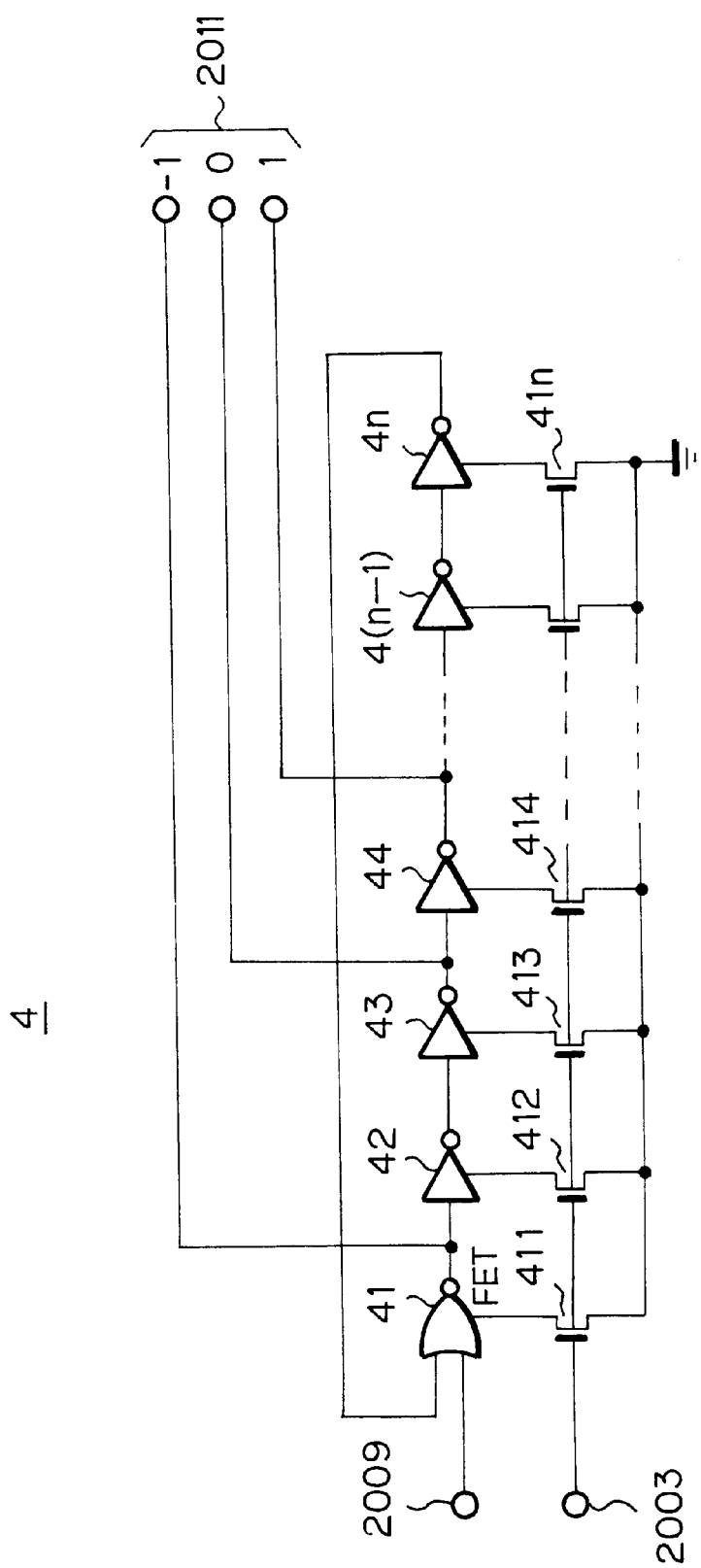
FIG. 7 is a block diagram schematically showing a specific configuration of the reset VCO included in the embodiment.

FIG. 7 shows a specific arrangement of the reset VCO 4. As shown, the VCO 4, like the VCO of the multiplication PLL 2, is implemented as a ring oscillator. Specifically, the VCO 4 is made up of a biinput voltage control delay NOR gate 41, voltage control delay inverters 42-4n, and FETs 411-41n. The frequency control voltage signal arrived at the input terminal 2003 assigned thereto is applied to the gate terminals of the FETs 411-41n. The voltage signal controls the drain currents of the FETs 411-41n and thereby controls the propagation delays of the NOR gate 41 and delay inverters 42-4n.

The phase control signal is fed to one input of the NOR gate 41 via the input terminal 2009 assigned thereto and controls the phase of the oscillation signal. The ring oscillator consisting of the NOR gate 41 and delay inverters 42-4n generate the triphase clocks and delivers them via the clock output terminals 2011. Specifically, the clock 2011-1 is produced from the output of the NOR gate 41. The clocks 2011-0 and 2011+1 are respectively produced from the output of the delay inverter 43 following the NOR gate 41 and the output of the delay inverter 44 following the inverter 43. In this manner, the clocks of three different phases are generated on the basis of the phase control signal 2009 and frequency control voltage signal 2003. Because the reset VCO 4 identical configuration with the VCO of the PLL 2 is capable of self-running at substantially the same frequency as the PLL 2, time and labor for circuit design can be reduced.

Figure 8:
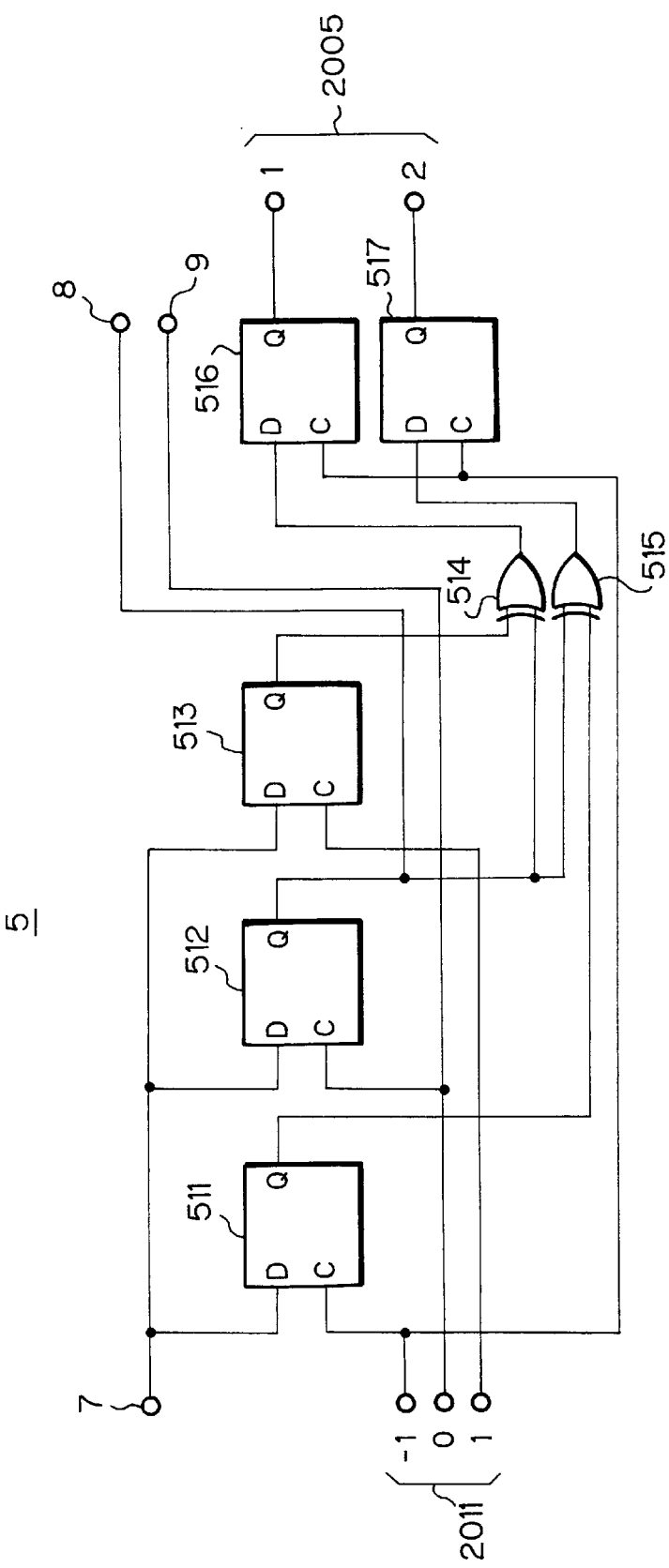
FIG. 8 is a block diagram schematically showing a timing decision included in the embodiment.

FIG. 8 shows a specific configuration of the timing decision 5. As shown, the decision 5 consists of D-type flip-flops 511–513, 516 and 517 and Exclusive OR (EXOR) gates 514 and 515. The received data 7 are applied to the data input terminals D of the D-type flip-flops 511–513. The triphase clocks 2011-1, 2011-0 and 2011+1 are respectively applied to the clock input terminals C of the D-type flip-flops 511, 512 and 513. The flip-flop 511 produces a signal representative of the latched data 7 on its data output terminal Q. This signal is applied to one input of the EXOR gate 515. Likewise, the flip-flop 512 produces a signal representative of the latched data 7 and delivers it to the EXOR gates 514 and 515 via its data output terminal Q. At the same time, the output of the flip-flop 512 is delivered to the data output terminal 8. Further, the flip-flop 513 delivers a signal representative of the latched data 7 to one input of the EXOR gate 514 via its data output terminal Q.

The EXOR gate 514 produces an EXOR D of the outputs Q of the flip-flops 512 and 513 and feeds it to the data terminal D of the flip-flop 516. The clock 2011-1 is applied to the clock input terminal C of the flip-flop 516 in order to latch the EXOR D. The output of the flip-flop 516 (for advancing the phase) is delivered to a EXOR output terminal 2005-1. The other EXOR gate 515 produces an EXOR D of the outputs Q of the flip-flops 511 and 512 and feeds it to the data input terminal of the D-type flip-flop 517. The clock 2011-1 is applied to the clock input terminal C of the flip-flop 517 also. The flip-flop 517 latches the EXOR D in response to the clock 2011-1 and feeds it to an EXOR output terminal 2005-2. The output of the flip-flop 517 is used to retard the phase.

With the above configuration, the timing decision 5 determines whether or not the input clock 2011-0 has an adequate relation in phase to the received data 7. The output 2005 of the decision 5 indicates, if the relation is adequate, that the clock phase should be maintained as it is or indicates, if it is inadequate, that the clock phase should be advanced or retarded. Further, the decision 5 latches the received data 7 in response to the clock 2011-0 and delivers it via the data output terminal 8 while delivering the clock 2011-0 used to latch the data 7 via the output 9.

Figure 9:
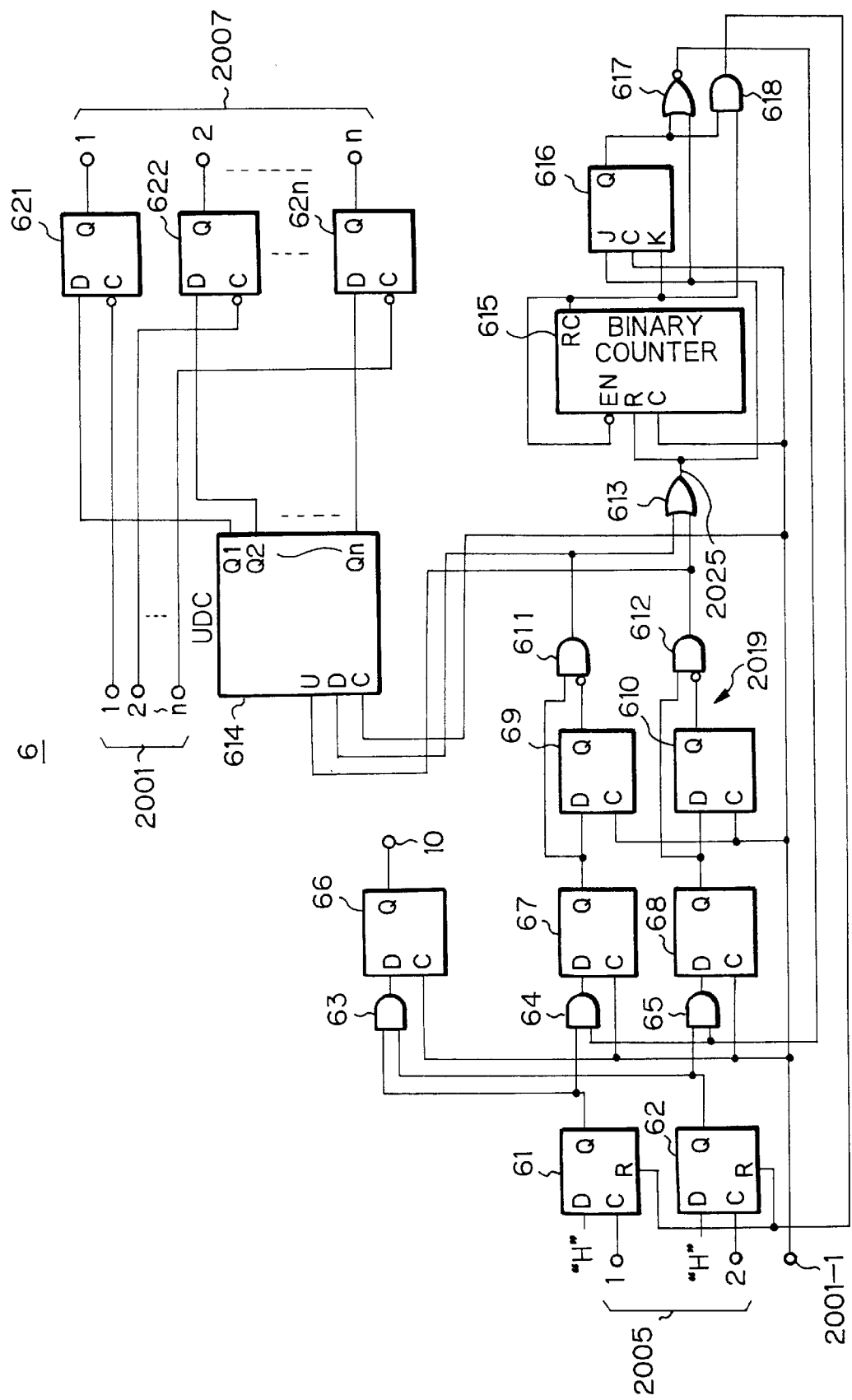
FIG. 9 is a block diagram schematically showing a specific configuration of a selection controller included in the embodiment.

FIG. 9 shows a specific configuration of the selection controller 6. As shown, the selection controller 6 has D-type flip-flops 61, 62, 66–69, 610 and 621–62n, biinput AND gates 611 and 612 each having one inverting input, an OR gate 613, an up/down counter 614 (UDC), a binary counter 615, a JK-type flip-flop 616, and a biinput NOR gate 617. One of the two EXORs or decision signals 2005 output from the timing decision 5 and for advancing the clock phase is applied to the clock input terminal C of the flip-flop 61 via an input terminal 2005-1. The other decision signal for retarding the clock phase is applied to the clock input terminal C of the flip-flop 62 via an input terminal 2005-2. A signal of high level is applied to the data input terminals D of the flip-flops 61 and 62. When the signal on the clock input terminal C of the flip-flop 61 or 62 goes high, the flip-flop 61 or 62 latches the high level signal and outputs it via its data output terminal Q.

The outputs Q of the flip-flops 61 and 62 are respectively applied to the biinput AND gates 63 and 64 and to the biinput AND gates 63 and 65, as illustrated. During period others than the guard time based on the count of the binary counter 615, the outputs of the AND gates 64 and 65 are respectively latched by the flip-flops 67 and 68. The flip-flops 67 and 68 deliver their outputs Q to the flip-flops 69 and 610, respectively. The flip-flops 67–69 and 610 and AND gates 611 and 612 constitute a circuit 2019 for forming a pulse having a single clock width by detecting a positive-going edge of the decision signal 2005.

Assume that the circuit 2019 has detected a positive-going edge of the decision signal 2005-1 which advances the clock phase. Then, the resulting pulse output from the circuit 2019 is fed from the AND gate 611 to the down input D of the UDC 614. When the circuit 2019 detects a positive-going edge of the decision signal 2005-2, it forms a pulse and feeds it to the up input U of the UDC 614.

On receiving the D signal, the UDC 614 is decremented in order to cause a clock of advanced phase relative to the current clock 2001 to be selected. For example, the UDC 614 is sequentially decremented from 3 to (n−1) via 2, 1, and n while delivering down-count signals to the flip-flops 621–62n via its output terminals Q1–Qn. On receiving the U signal, the UDC 514 is incremented in order to cause a clock of retarded phase relative to the current clock 2001 to be selected. For example, the UDC 614 is incremented from (n−1) to 3 via n, 1 and 2 while delivering up-count signals to the flip-flops 621–62n. The outputs Q1–Qn of the UDC 614 operate at timings opposite in phase to the clocks 2001 which are to be selected thereby. The flip-flops 621–62n equal in number to the clocks 2001 respectively latch the outputs Q1–Qn of the UDC 614 and deliver them to selection control signal output terminals 2007-1 through 2007-n.

A pulse R derived from the positive-going edge of the decision signal 2005-1 or 2005-2, as stated above, clears the binary counter 615. Subsequently, the binary counter 615 outputs a carry signal RC after counting several pulses. The interval between the pulse R and the carry signal RC is used as a guard time. During the guard time, the inputs D to the flip-flops 67 and 68 are fixed at their low level. In this condition, the AND gate 618 produces an AND of the carry signal RC and a guard pulse (output Q of the JK-type flip-flop 616) and feeds it to the reset terminals R of the flip-flops 61 and 62, thereby resetting them. The carry signal RC disables the binary counter 615. When the decision signals 2005-1 and 2005-2 are both input, the flip-flop 66 latches them and then produces a timing error signal 10 on its output terminal Q.

As stated above, the illustrative embodiment is capable of outputting data and a clock aligned in bit phase in an extremely stable and rapid manner with a simple construction without regard to the phase of received data. Specifically, the reset VCO 4 and the VCO of the multiplication PLL 2 have the same configuration as each other. The frequency control voltage 2003 output from the PLL 2 is used as a frequency control voltage for the VCO 4. As a result, the self-running frequency of the VCO 4 is substantially coincident with the oscillation frequency of the PLL 2.

Also, in the above embodiment, the selector 3 selects one of the multiphase clocks 2001 output from the PLL 2 and feeds it to the phase control input 2009 of the VCO 4. The resulting phase-controlled clock 2011 output from the VCO 4 and the received data 7 are compared with respect to the timing. If the timing of the clock 2011 is adequate, then the clock 2009 currently selected is used to control the phase of the VCO 4. Therefore, the VCO 4 can output the clock 2011 as stable as the clock 2001 output from the PLL 2.

If the timing of the clock 2011 is inadequate, the selector 3 selects, without introducing any noise, one of the multiphase clocks 2001 estimated to be adequate which will shift the output clock 2011 of the reset VCO 4 in the direction determined to be adequate. This allows the VCO 4 to output a clock having the new phase at an extremely high response speed corresponding to about one to five clock periods.

Further, even when data are received in bursts, the embodiment is capable of setting up bit phase synchronization rapidly. This is also true when the received data contain jitter. So long as the received data are stable, the embodiment allows the VCO 4 to output a clock as stable as the PLL 2 only if the bit synchronization is set up once. Consequently, the continuous endurance against codes of the same data can be made almost infinite. In addition, the embodiment is capable of detecting errors in the received data 7 or the reset VCO 4 easily.

When the embodiment with the above advantages is applied to a device for recovering data from the received data 7, the device can achieve extremely high performance easily and at low cost.

Figure 10:
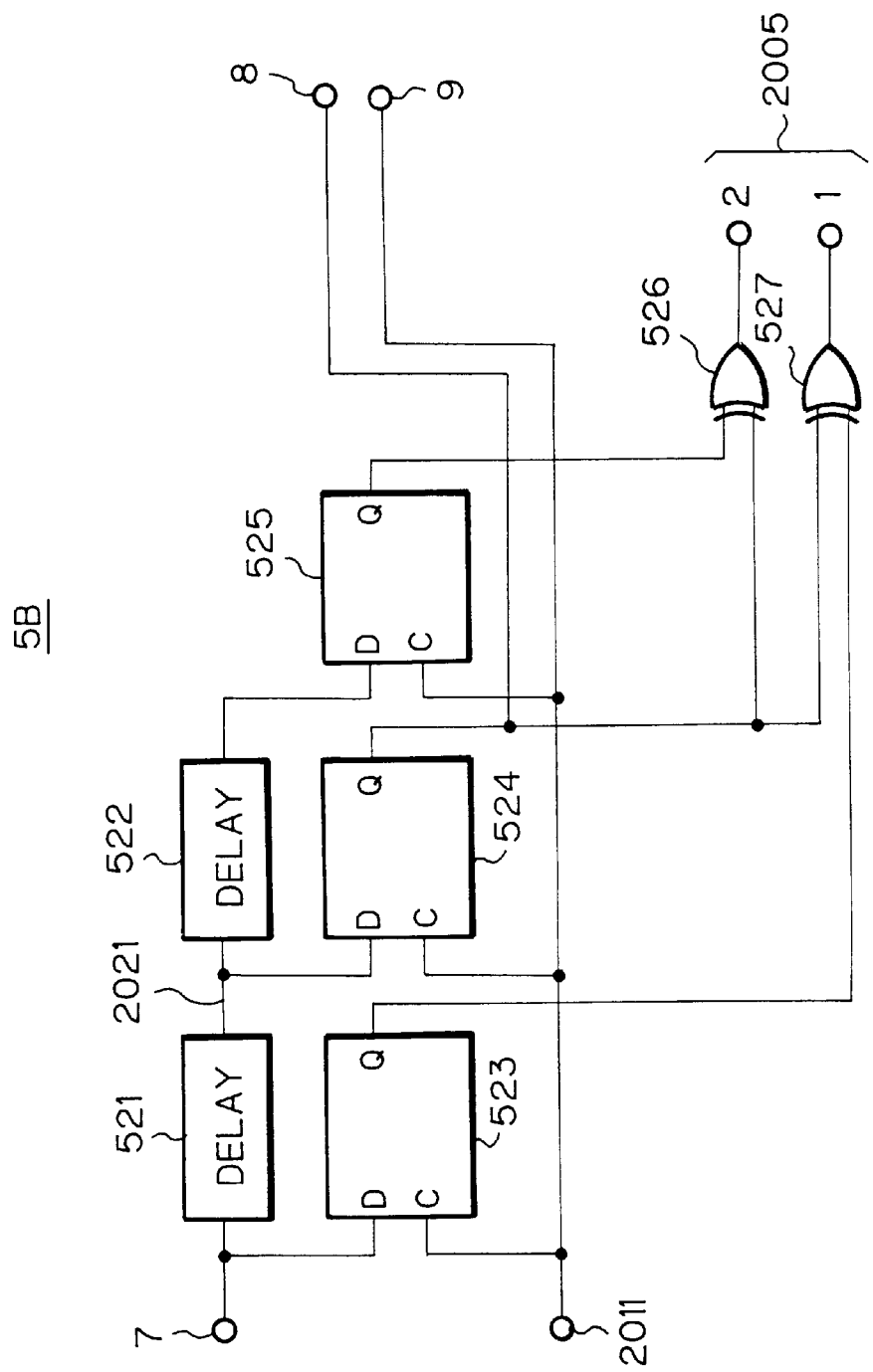
FIG. 10 is a block diagram schematically showing a specific configuration of a timing decision included in an alternative embodiment of the present invention.

An alternative embodiment of the present invention will be described with reference to FIG. 10. This embodiment is identical with the above embodiment except for the configuration of the timing decision 5. As shown, a timing decision 5B is made up of delays 521 and 522, D-type flip-flops 523–525, and EXOR gates 526 and 527. The clock 2011 is applied to the clock input terminals C of the flip-flops 523–525. The flip-flop 523 receives the received data 7 via its data input terminal D and delivers latched data to one input of the EXOR gate 527 via its data output terminal Q. The delay 521 delays the received data 7 and feeds the delayed data to the data input terminal D of the flip-flop 524. The flip-flop 524 latches the delayed received data D in response to the clock 2011 and feeds it to one input of the EXOR gate 526, the other input of the EXOR gate 527, and data output terminal 8.

The input clock 2011 is also output as a clock output 9. The delay 522 delays the delayed data 2021 output from the delay circuit 521 and delivers it to the data input terminal D of the flip-flop 525. The flip-flop 525 latches the input data D in response to the clock 2011 and outputs it to the other input of the EXOR gate 526. The EXOR gate 526 produces an EXOR of the output data Q of the flip-flops 524 and 525 and outputs the EXOR as the second decision signal 2005-2. The other EXOR gate 527 produces an EXOR of the output data Q of the flip-flops 523 and 524 and outputs the EXOR as the first decision signal 2005-1.

This embodiment, like the previous embodiment, can set up bit phase synchronization in an extremely stable and rapid manner, without regard to the phase of received data. Further, the timing decision 5B can receive the data of unknown phase and a clock with an extremely simple configuration. The decision 5B directly outputs the input clock if the clock has an adequate relation in phase to the data. If the relation is not adequate, the decision 5B determines whether the phase should be advanced or retarded, and outputs the result of decision.

Figure 13:
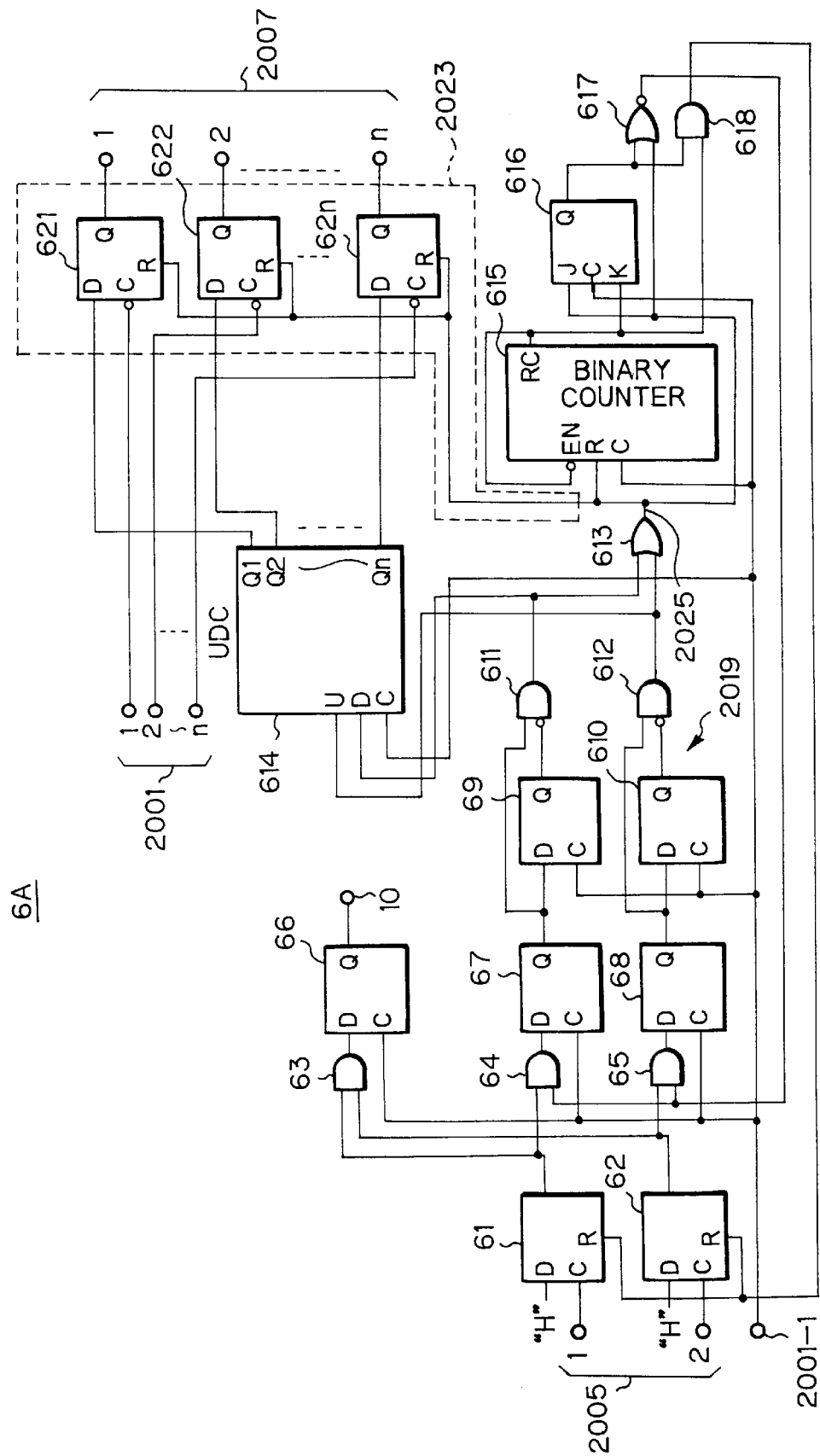
FIG. 13 is a block diagram schematically showing a specific configuration of a selection controller included in the embodiment operating as shown in FIGS. 11a–11p and 12a–12p.

FIG. 13 shows another specific configuration of the selection controller 6 and representative of another alternative embodiment of the present invention. In FIG. 13, a circuit arrangement enclosed by a dashed line 2023 is particular to this embodiment. As shown, the pulse 2025 output from the EXOR gate 613 and derived from a positive-going edge of the decision signal 2005 is applied to the reset input terminal R of the D-type flip-flops 621–62n, so that the pulse 2025 can reset or clear the flip-flops 621–62n.

The selection controller 6A is provided with a guard time long enough for a change of the selection control signals 2007 to be accurately reflected on the decision signal 2005 to be output from the timing decision 5. In response to a decision signal 2005 input on the elapse of the guard time, the controller 6A delivers selection control signals 2007 to the selector 3 via its output terminal 2007. The control signals 2007 are each capable of controlling one of the clocks 2001-1 through 2001-n, as stated earlier.

As to the phase control over the reset VCO 4, when the phase control signal 2009 is in its active high level, the selection control signals 2007 are latched in phases opposite to the phases of the corresponding multiphase clocks 2001 before they are output via the output terminal 2007. The latch stage is asynchronously cleared from the time when the control signals are about to be changed to the time when they are stabilized.

When all the control signals 2007 go low, the selector 3 outputs a signal of low level, i.e., an inactive signal meant for the reset VCO 4. During this period of time, the phase control over the reset VCO 4 is not executed, so that the VCO 4 self-runs based on the frequency control voltage applied to its input terminal 2003.

The operation of the selection controller 6A will be described, concentrating on the difference between it and the selection controller 6. The pulse 2025 output from the EXOR gate 613 and derived from a positive-going edge of the decision signal 2005 clears the flip-flops 621–62n provided in the same number as the multiphase clocks 2001, as stated earlier. Then, the outputs Q1–Qn of the UDC 614 are decoded and respectively latched by the flip flops 621–62n. The flip flops 621–62n, operating at timings opposite in phase to the corresponding clocks 2001 which are controlled thereby, output the selection control signals 2007.

Figure 11:
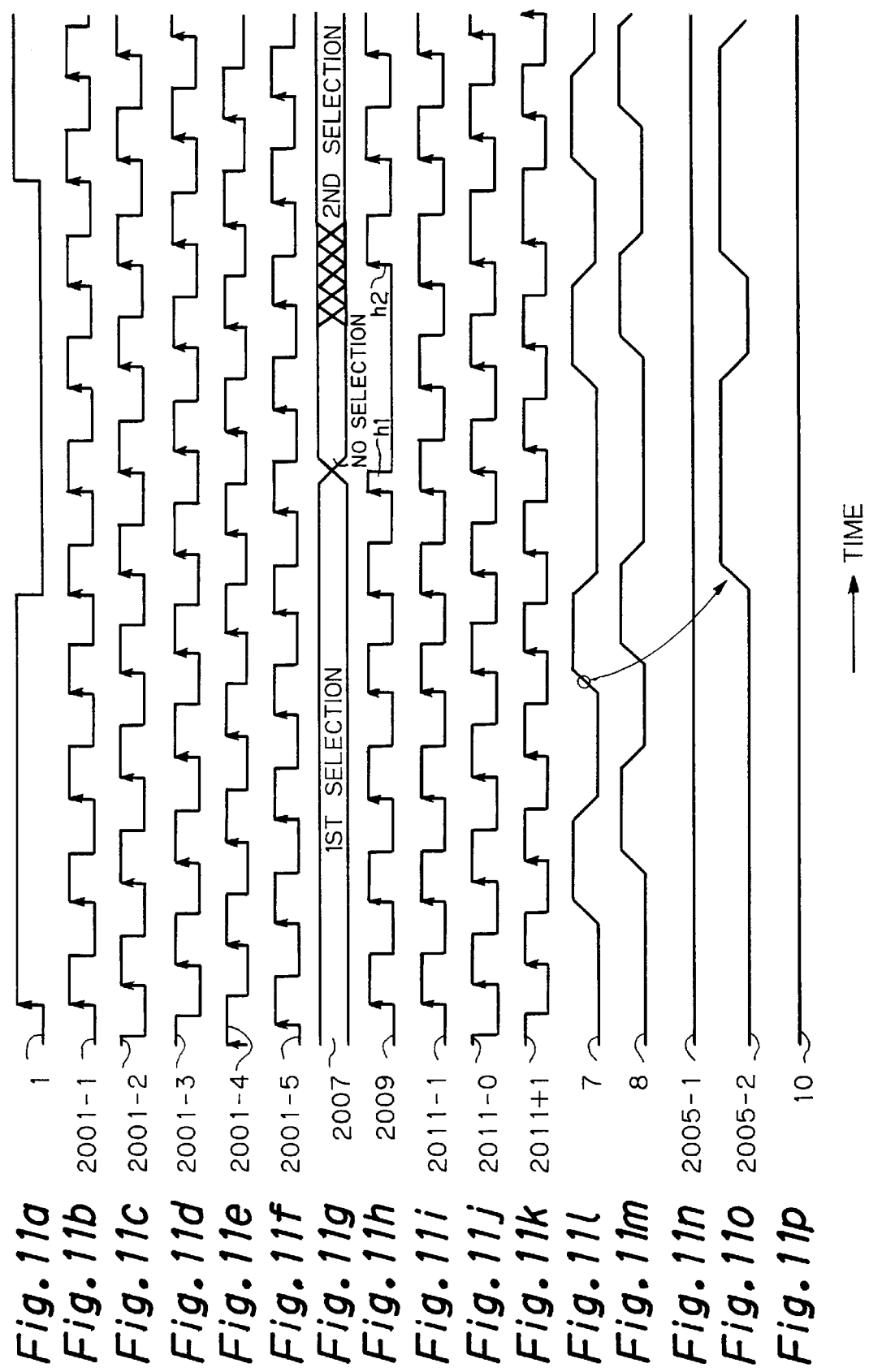
FIGS. 11a–11p are timing charts demonstrating the operation of another alternative embodiment of the present invention.
Figure 12:
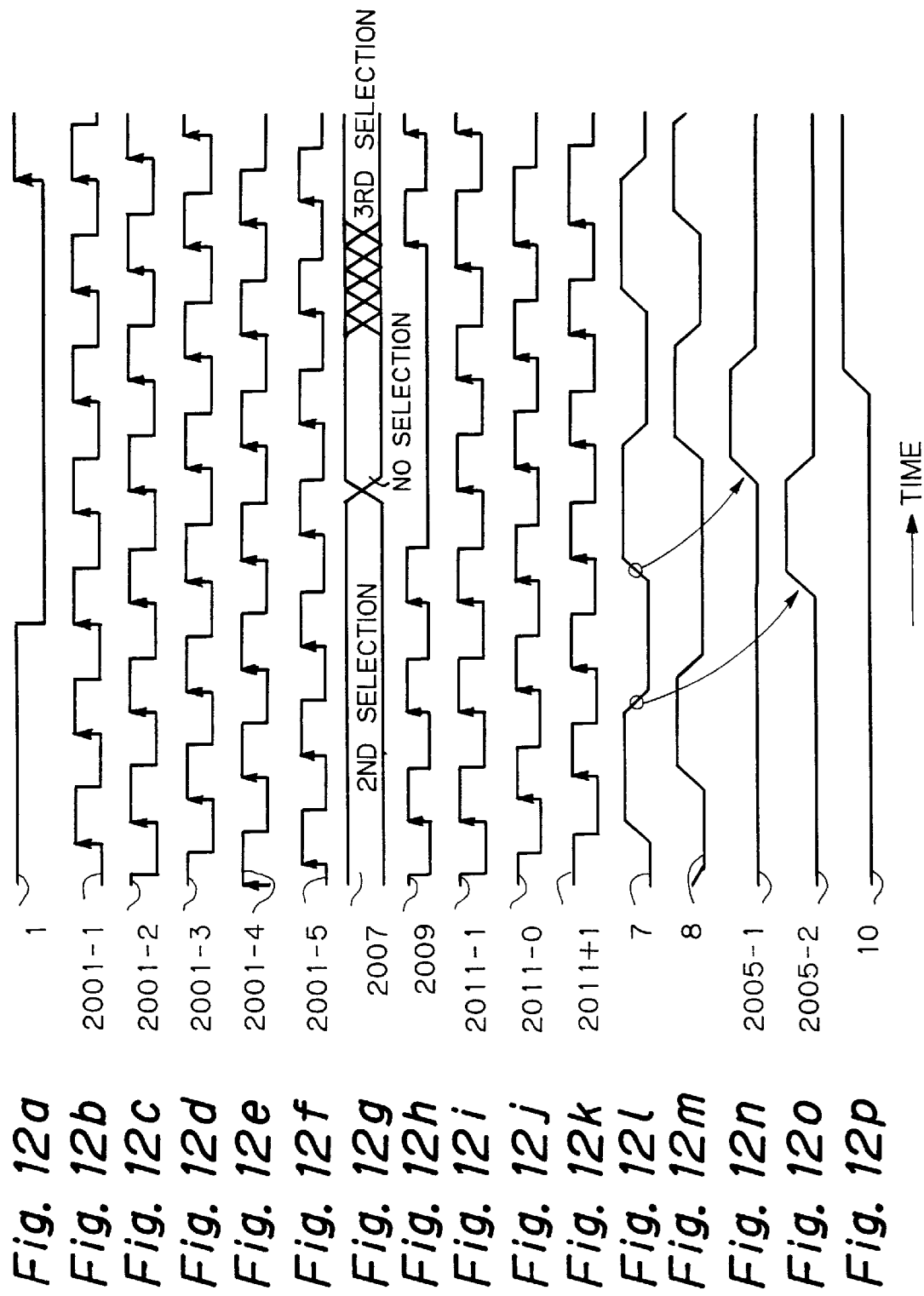
FIGS. 12a–12p are timing charts which are the continuation of FIGS. 11a–11p, respectively.

FIGS. 11a–11p and 12a–12p are timing charts demonstrating the operation of the embodiment shown in FIG. 13. FIGS. 11a–11p are continued to FIGS. 12a–12p, respectively. Assume that the selector 3 selects no clocks between a first and a second selection, as shown in FIGS. 11g and 12g. Then, despite the fact that the signal output from the signal output terminal 2009 (FIGS. 11h and 12h) is a pulse h1, the reset VCO 4 takes in the pulse h1 via its phase control signal input terminal 2009. As a result, despite the fact that a signal is absent between the pulse h1 and the following pulse h2, the reset VCO 4 self-runs based on the frequency control voltage signal 2003 output from the PLL 2. The VCO 4 therefore continuously outputs the triphase clocks 2011 that are stable and without any change, as shown in FIGS. 11i–11k and 12i–12k. When the selector 3 outputs the pulse h2 (FIGS. 11h and 12h) via its output terminal 2009, the VCO 4 continuously outputs the clocks 2011 that are stable as a phase control signal 9.

This embodiment has the following advantage in addition t o the embodiment shown in FIG. 1. Just before and just after the multiphase clocks input to the phase control terminal 2009 of the reset VCO 4, the VCO 4 is masked so as not to input an active signal to its phase control terminal 2009. When a new multiphase clock 2009 is input to the VCO 4 as a phase control signal, an active region, e.g., high level region is successfully prevented from being masked. This frees the phase control input to the VCO 4 from noise in the event of switching without regard to the duty ratio of the multiphase clocks 2009, thereby allowing the phase of the VCO 4 to be smoothly shifted.

Another alternative embodiment of the present invention will be described with reference to FIG. 14. As shown, this embodiment is similar to the embodiment shown in FIG. 1 except that it includes a partial clock generator 11 and an improved selection controller 6B. The operation of this embodiment will be described with reference to FIGS. 15a–15m and 16a–16m. In FIGS. 15a–15m and 16a–16m, assume that the number of phases n of the multiphase clocks is "5", and that the partial clock generator 11 has a pulse omission cycle k of "4". FIGS. 15a–15m are continued to FIGS. 16a–16m, respectively.

The partial clock generator 11 receives the multiphase clocks 2001-1 through 2001-n from the multiplication PLL 2 and generates corresponding multiphase partial clocks 2031-1 through 2031-n (FIGS. 15c1–15c5 and 16c1–16c5; only 2031-1 through 2031-5 are shown). The partial clocks 2031-1 through 2031-n are applied to the selector 3. At the same time, the partial clock generator 11 feeds a switching timing signal 2033 (FIGS. 15m and 16m) to the selection controller 6B. In each of the partial clocks 2031-1 through 2031-n, only one of k (2 or greater integer) cycles of clock pulses appears for associated one of the multiphase clocks 2001–2001-n. The pulses 2009 each being associated with the respective phase are confined in the two clock periods of the multiphase clocks 2001.

When the reset VCO 4 self-runs, its oscillation phase slips due to the difference between oscillation frequency of the multiplied clock 2001 of the PLL 2 and the self-run oscillation frequency of the VCO 4. The number of cycles k is so selected as not to be effected by the width of the above slip. As shown in FIGS. 15m and 16m, the switching timing signal 2033 is generated such that an active pulse appears at the intermediate between the consecutive pulses of the partial clock 2031.

Again, the selection controller 6B is provided with a guard time for a change of the selection control signals 2007 to be accurately reflected on the decision signal 2005 output from the timing decision 5. Subsequently, the controller 6B outputs control signals (FIGS. 15d and 16d) via its output terminal 2007 in response to a decision signal 2005 input thereto. The selection control signals are latched by the multiphase clock 2001-1 before they are output via the output terminal 2007. When the switching timing signal 2033 is active, new selection control signals are taken in. When the signal 2033 is not active, the latched values are held. In this manner, the control over the selector 3 is executed in the region where the signal 2033 is active. At such a time, the partial clocks 2031-1 through 2031-n input to the selector 3 each remains stable at its low or inactive level as a phase control signal 2009 for the reset VCO 4. It follows that noise is prevented from appearing on the phase control signal input terminal 2009 of the VCO 4 (FIGS. 15e and 16e).

The VCO 4 is subjected to phase control substantially once for k cycles without regard to whether or not switching is effected. While the active pulse of the phase control signal 2009 (FIGS. 15e and 16e) is not input to VCO 4, the VCO 4 self-runs based on the voltage input to its input terminal 2003 and at a frequency substantially equal to the oscillation frequency of the PLL 2 (FIGS. 15f–15h and 16f–16h).

Figure 17:
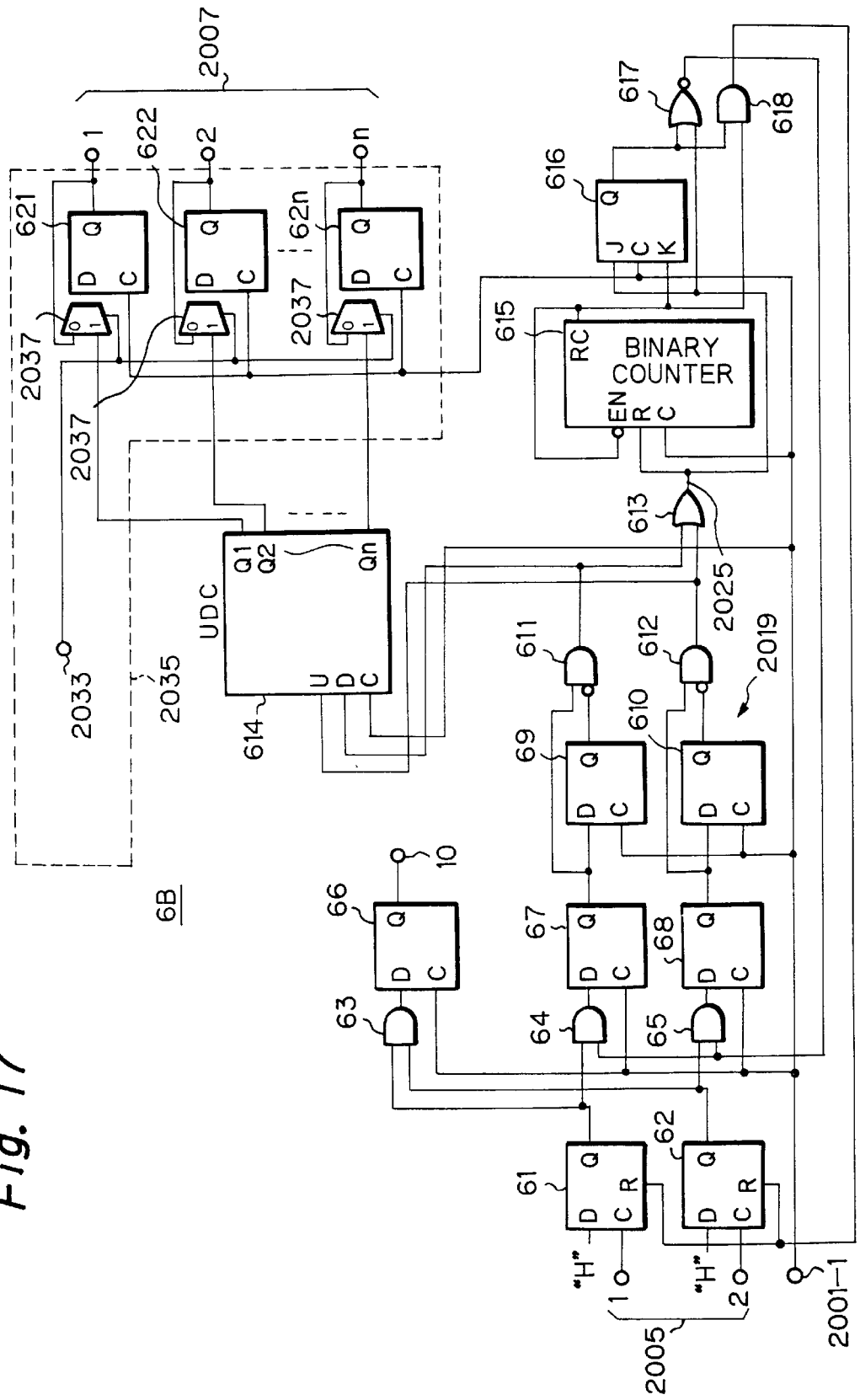
FIG. 17 is a block diagram schematically showing a specific configuration of a selection controller included in the embodiment shown in FIG. 14.

FIG. 17 shows a specific configuration of the selection controller 6B. As shown, the selection controller 6B has selectors 2037 respectively corresponding to the D-type flip-flops 621–62n. A circuit enclosed by a dashed line 2035 in FIG. 17 distinguishes the controller 6B from the controller 6 shown in FIG. 9. The circuit 2035 receives the timing signal 2033 from the partial clock generator 11, causes the flip-flops 621–62n with the selectors 2037 to latch the signal 2033, and thereby outputs selection control signals 2007 of n different phases.

In operation, the decision signals 2005-1 and 2005-2 for respectively advancing and regarding the clock phase are respectively input to the D-type flip-flops 61 and 62 as clocks C. On receiving a positive-going edge of the clock C, the flip-flop 61 or 62 latches it and outputs it at a high level. The output Q of the flip-flop 61 or 62 is latched by the following D-type flip-flop 67 or 68 only if the current time is not the guard time determined by the binary counter 615.

The circuit 2019 consisting of the flip-flops 67–69 and 610 and AND gates 611 and 612, outputs a pulse of one clock width when it detects a positive-going edge of the decision signal 2005. A pulse output from the circuit 2019 and derived from the decision signal 2005-1 for advancing the clock phase is input to the down input D of the UDC 614. On the other hand, a pulse output from the circuit 2019 and derived from the decision signal 2005-2 for retarding the clock phase is input to the up input U of the UDC 614. In response to the D signals, the UDC 614 is sequentially decremented, e.g., from 3 to (n−1) via 2, 3 and n in order to select a clock advanced in phase relative to the current clock. In response to the U signals, the counter 614 is sequentially incremented, e.g., from (n−1) to 3 via n, 1 and 2 in order to select a clock retarded in phase relative to the current clock.

The outputs Q1–Qn of the UDC 614, corresponding in number to the phases of the multiphase clocks 2001, are decoded. When the switching timing signal 2033 is in its high level, the outputs Q1–Qn are respectively latched by the flip-flops 621–62n each having the respective selector 2037 in response to the input clock 2001-1. When the signal 2033 is in its low level, the flip-flops 621–62n hold their data.

The binary counter 615 is cleared by the pulse 2025 derived from either one of the decision signals 2005 and then outputs a carry signal RC after counting several pulses. The interval between the pulse 2025 and the carry signal RC is the guard time. During the guard time, the input D to the flip-flop 67 or 68 is held in its low level. The flip-flop 61 or 62 is cleared by the output signal R of the AND gate 618 representative of an AND of the carry signal RC and guard pulse (output Q of the JK-type flip-flop 616). The binary counter 615 is disabled by the carry signal RC. When both the signal 2005-1 for advancing the phase and the signal 2005-2 for retarding it are input, the D-type flip-flop 66 latches them and then outputs the previously mentioned timing error signal 10.

Figure 18:
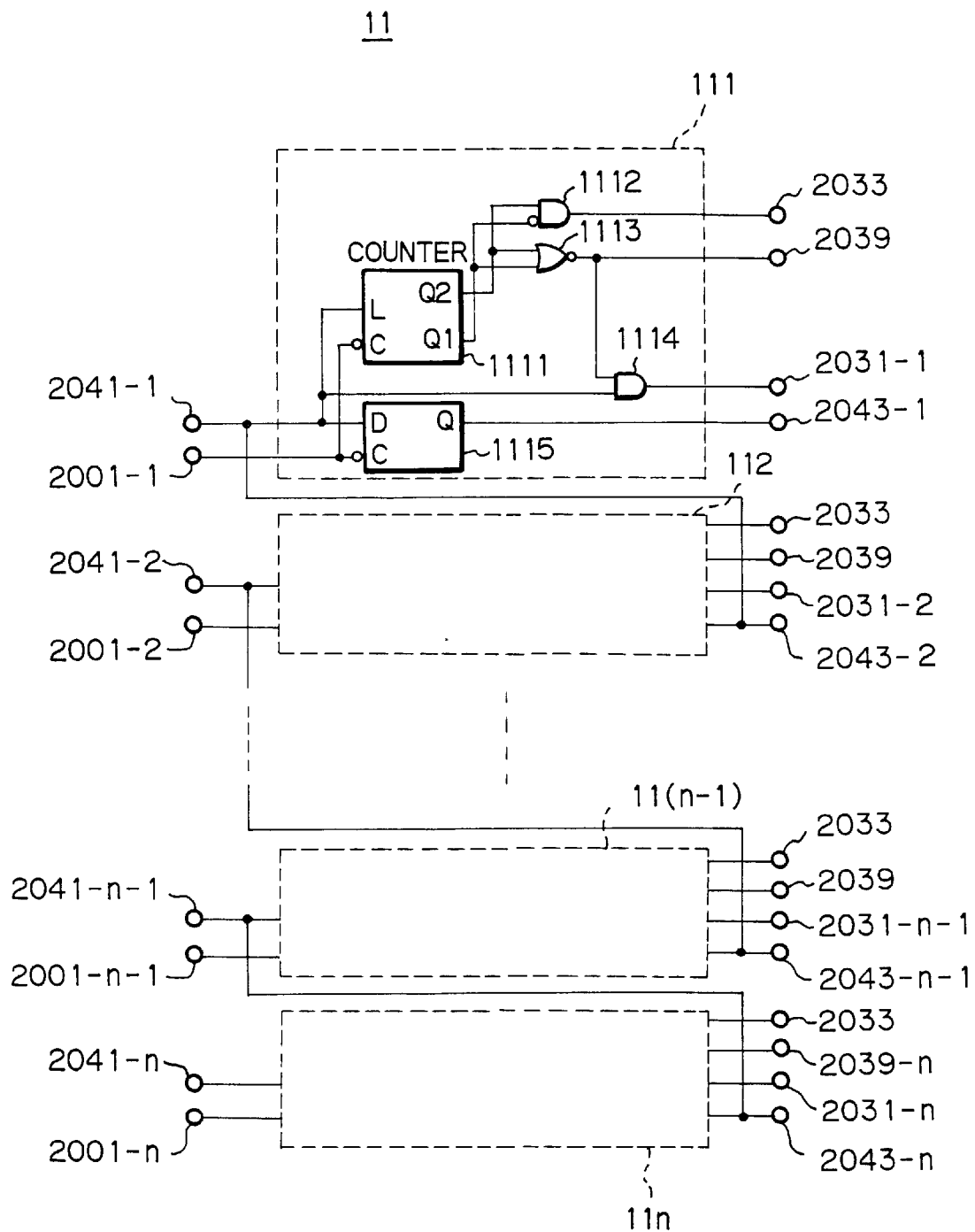
FIG. 18 is a block diagram schematically showing a specific configuration of a partial clock generator included in the embodiment shown in FIG. 14.

FIG. 18 shows a specific arrangement of the partial clock generator 11. As shown, the partial clock generator 11 is implemented by partial clock generating sections 111–11n identical in configuration and each being assigned to one of the multiphase clocks 2001. Let the following description concentrate on the section 111 by way of example. The section 111 has a binary counter 1111, a biinput AND gate 1112 having one inverting input, a biinput NOR gate 1113, a biinput AND gate 1114, and a D-type flip-flop 1115.

The binary counter 1111 operates in response to a clock opposite in phase to the multiphase clock 2001-1. The NOR gate 1113 generates a signal 2039 which goes high once for four clock pulses based on the count of the counter 1111. The AND gate 1114 ANDs the signal 2039 and input clock 2001-1 and thereby outputs the partial clock 2031-1. The AND gate 1112 outputs a signal which goes high at the intermediate between two consecutive high levels of the partial clock 2031-1 on the basis of the count of the counter 1111. The signal output from the AND gate 1112 is the switching timing signal 2033 and is used only for the output of the partial clock generating section 111.

A chain reset input signal 2041-1 is fed to the binary counter 1111 as a load signal L. The binary counter 1111 is loaded with a value determined by the arrangement and the previously mentioned value k of the partial clock generating section 111. The flip-flop 1115 operates in a phase opposite to the phase of the input clock 2001-1. The flip-flop 1115 latches the chain reset input signal 2041-1 and outputs it as a chain reset signal 2043-1. Specifically, the partial clock generating section 11n outputs a chain reset signal first. This signal is input to the next partial clock generating section 11(n−1) as a chain reset input signal 2041-n-1; the section 11(n−1) is dealing with the input clock 2001-n-1 advanced in phase relative to the clock 2001-n. Such a chain closes at the partial clock generating section 111.

How the value to be loaded in the binary counter 1111 is determined is as follows. The reset chain begins at the partial clock generating section 11n, as stated above. Assume that the count of the binary counter 1111 included in the section 1 in is zero. Then, the section 11n outputs a code 0 (zero) signal 2039-n. This signal 2039-n is input to the next section 11(n−1) as a chain reset input signal 2041-n-1. The signal 2041-n-1 loads the binary counter 1111 of the section 11(n−1) with 1 (one) which is the incremented value of 0. In this manner, the value loaded in the previous section 11i(i=1, . . . , n) is incremented by 1 to produce a value to be loaded. When the loaded value reaches k−1, the next section 11i+1 resets its loaded value to 0 and again starts incrementing it. With this configuration, it is possible to confine the pulses of all the partial clocks 2031 in the width of two clock periods.

The above embodiment has the following advantages in addition to the advantages described in relation to the embodiment shown in FIG. 1. The phase control signal 2009 input to the reset VCO 4 is implemented as a partial clock. All the multiphase partial clocks 2031 input to the selector 3 are caused to remain stable at the value of the inactive signal as a phase control signal for the reset VCO 4 over the width of more than 0.5 clock period. It is therefore possible to output the phase control signal 2009 at the timing of a clock of particular phase.

By increasing the number of clock omission cycles, it is possible to increase the timing margin for the selection control signals 1007 to be output at the time of switching. Therefore, a single kind of clock suffices the selection controller 6B and simplifies the circuit arrangement. This allows the timing circuit to be designed with ease.

Figure 19:
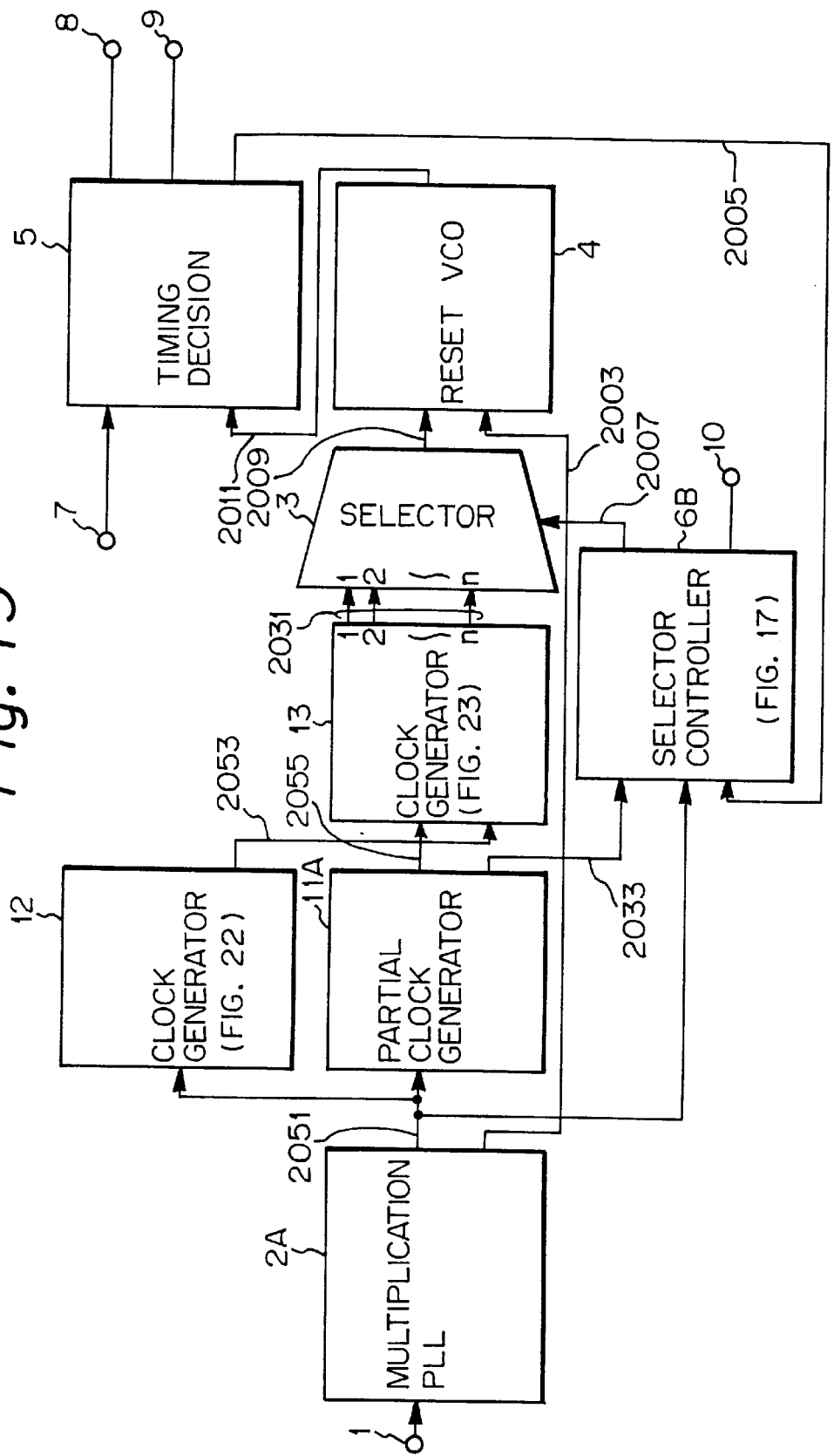
FIG. 19 is a block diagram schematically showing another alternative embodiment of the present invention.

Referring to FIG. 19, another alternative embodiment of the present invention will be described. As shown, this embodiment has a multiplication PLL 2A, a partial clock generator 11A, and a first and a second multiphase clock generator 12 and 13, respectively, in addition to the selection controller 6B. The PLL 2A outputs a single phase clock 2051 in place of the multiphase clocks. The partial clock generator 11A also outputs a single phase clock in place of the multiphase clocks. The rest of the construction is identical with the embodiment shown in FIG. 14. The partial clock generator 11A may be implemented by one of the plurality of partial clock generating sections 111–11n shown in FIG. 18.

The PLL 2A receives the reference clock 1, multiplies it, and delivers the multiplied clock to the first multiphase clock generator 12, partial clock generator 11A, and selection controller 6B. At the same time, the PLL 2A feeds the frequency control voltage signal 2003 to the reset VCO 4.

The first multiphase clock generator 12 produces a delay control voltage signal 2053 from the single phase clock 2051 output from the PLL 2A. The signal 2053 is fed to the delay control voltage input terminal of the second multiphase clock generator 13. The partial clock generator 11A generates a monophase partial clock 2055 based on the clock 2051 and feeds it to the second multiphase clock generator 13. At the same time, the partial clock generator 11A delivers the switching timing signal 2033 to the selection controller 6B. In response to the clock 2055, the second multiphase clock generator 13 generates the multiphase partial clocks 2031–1 through 2031–n by using the delay control voltage signal 2053. The partial clocks 2031–1 through 2031–n are fed to the selector 3.

Figure 20:
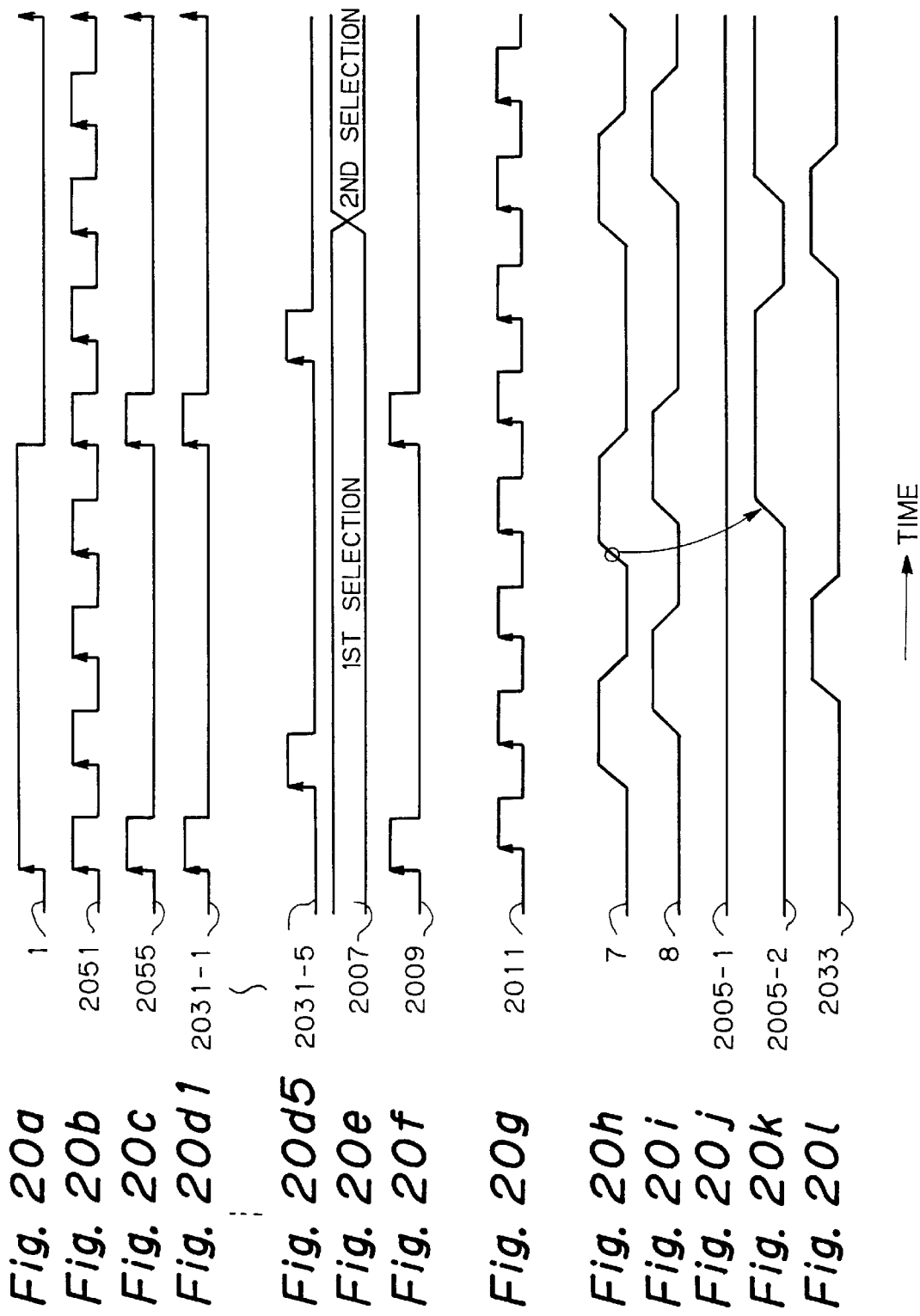
FIGS. 20a–20l are timing charts demonstrating the operation of the embodiment shown in FIG. 19.

The operation of the illustrative embodiment will b e described with reference to FIGS. 20a–20l and FIGS. 21a–21l which are the continuation of FIGS. 20a–20l, respectively. A reference clock (FIGS. 20a and 21a) is input to the input terminal 1 of the PLL 2A assigned thereto. The reference clock has a frequency which is 1/m (M>0) of the frequency equal to the bit rate of the received data 7. In response, the PLL 2A outputs the clock 2051 equal in frequency to the bit rate of the data 7, as shown in FIGS. 20b and 20b. Further, the PLL 2A outputs the frequency control voltage 2003 for controlling the reset VCO 4. The first multiphase clock generator 12 compares, based on a ring oscillation principle, the input clock 2051 and a clock 2057 (FIG. 22) produced by delaying the clock 2051 by a multistage gate circuit. The clock generator 12 outputs the delay control voltage signal 2053 for controlling the delay of the multistage gate circuit such that the difference in phase between the clocks 2051 and 2057 has a width of one clock period.

In response to the clock 2051, the partial clock generator 11A generates a partial clock in which only one of k (2 or greater integer) cycles of clock pulses appears for the input clock 2051. When the reset VCO 4 self-runs, its oscillation phase slips due to the difference between oscillation frequency of the multiplied clock 2051 of the PLL 2A and the self-run oscillation frequency of the VCO 4. The number of cycles k is so selected as not to be effected by the width of the above slip. The switching timing signal 2033 is generated such that an active pulse appears at the intermediate between the consecutive pulses of the partial clock 2055. The partial clock 2055 output from the partial clock generator 11A (FIGS. 20c and 21c) is input to the second multiphase clock generator 13.

The second multiphase clock generator 13, receiving the delay control voltage signal 2053, generates the multiphase partial clocks 2031 (FIGS. 20d1–d5 and 21d1–21d5) sequentially shifted in phase by a value produced by equally dividing one clock width by n. The partial clocks 2031 are applied to the input terminals of the selector 3 assigned thereto. The selector 3 selects one of the signals applied to its input terminals 2031 in accordance with the selection control signals 2007 and delivers it via the output terminal 2009. The signal output via the terminal 2009 (FIGS. 20f and 21f) is fed to the phase control signal terminal of the reset VCO 4.

The reset VCO 4 has the phase of its output clock 2011 forcibly controlled on the basis of the phase of the pulses of the signal input to its terminal 2009. As a result, the VCO 4 selectively outputs any one of the output clocks of n different phases 2011 (FIGS. 20g and 21g) corresponding to the input pulse signal. When no pulse signals are input to the terminal 2009, the VCO 4 self-runs at a frequency determined by the voltage input to its frequency control voltage input terminal. Again, if the VCO 4 is identical in configuration with a VCO constituting the PLL 2A, then the VCO 4 self-runs at a frequency substantially identical with the oscillation frequency of the PLL circuit 2A. The output clock 2011 of the VCO 4 is applied to the clock input terminal of the timing decision 5.

Figure 21:
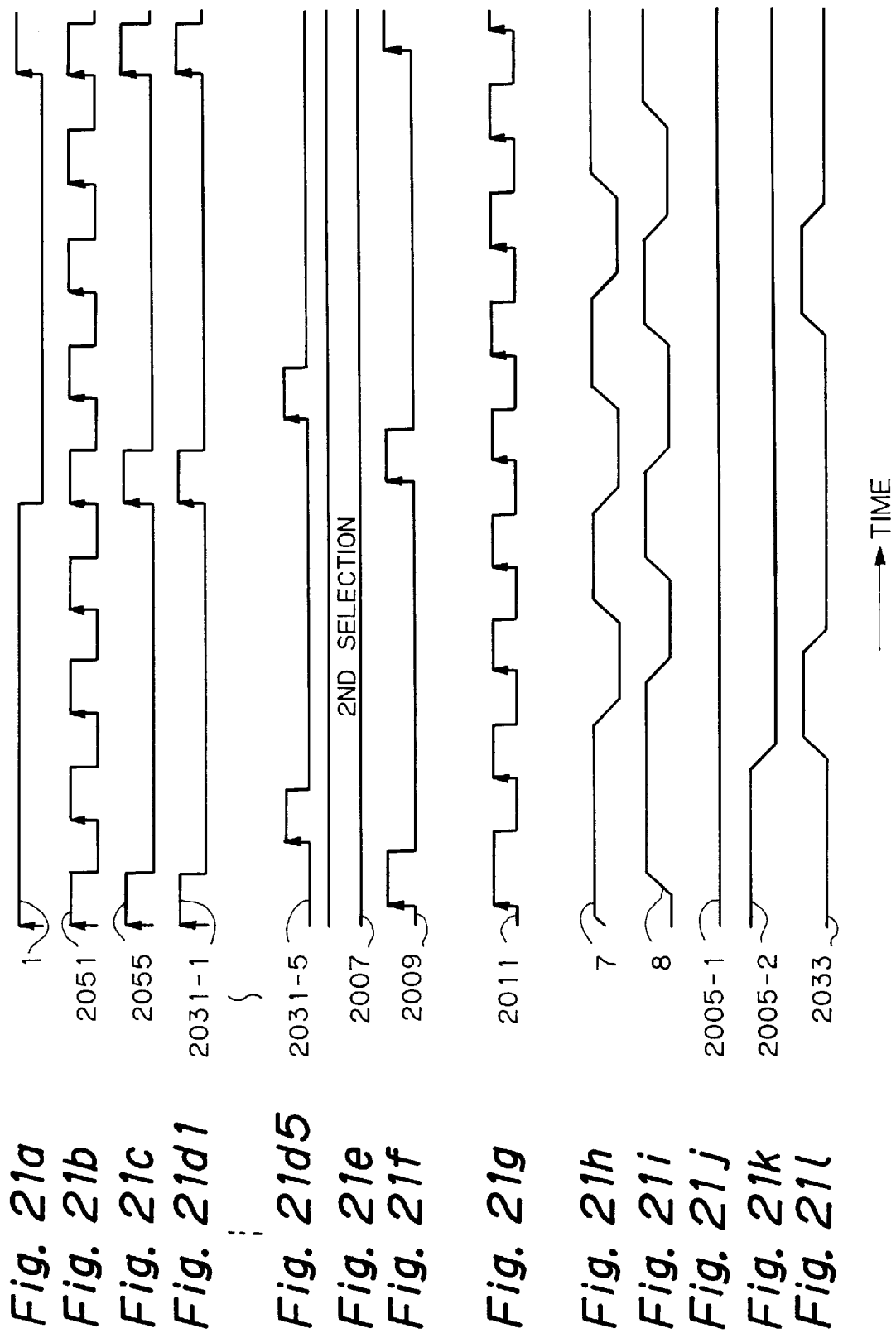
FIGS. 21a–21l are timing charts which are the continuation of FIGS. 20a–20l, respectively.

The received data 7 with an unknown phase is input to the data input terminal of the timing decision 5 (FIGS. 20h and 21h). If the input clock 2011 has an adequate relation in phase to the data 7, the decision 5 maintains the current phase of the clock 2011. If the phase relation of the clock 2011 to the data 7 is inadequate, the decision 5 determines whether the phase of the clock 2011 should be advanced or retarded. The decision signal 2005 representative of the result of decision (FIGS. 20j and 21j or FIGS. 20k and 21k) is fed out via the output terminal 2005. Further, the decision 5 latches the input data 7 in response to the clock 2011 and outputs it via its data output terminal 8 (FIGS. 20i and 21i). At the same time, the decision 5 outputs the clock 2011 used to latch the data 7 via its clock output terminal 2005. The decision signal 2005 is applied to the input terminal of the selection controller 6B assigned thereto.

After the previously stated guard time, the selection controller 6B delivers the control signals via its output terminal 2007 in response to the decision signal 2005. The selection control signals 2007 are latched by the multiphase clock 2051 before they are output via the output terminal 2007. When the switching timing signal 2033 (FIGS. 20l and 21l) is active, new selection control signals 2007 are taken in. When the signal 2033 is not active, the latched values are held. In this manner, the control over the selector 3 is executed in the region where the signal 2033 is active. At such a time, the partial clocks 2031 input to the selector 3 each remain stable at its low or inactive level as a phase control signal for the reset VCO 4. It follows that noise is prevented from appearing on the phase control signal input terminal 2009 of the VCO 4.

The VCO 4 is subjected to substantial phase control once for k cycles without regard to whether or not switching is effected. While the active pulse of the phase control signal 2009 is not input to VCO 4, the VCO 4 self-runs based on the voltage input to its input terminal 2003 and at a frequency substantially equal to the oscillation frequency of the PLL 2A.

Assume that both the information 2005–1 for advancing the phase of the reset VCO 4 and the information 2005–2 for retarding it are present in the decision signal 2005 within the guard time. Then, the selection controller 6B determines that noise has been superposed on the received data 7, or that the input values are unstable due to, e.g., the shut-off of the input channel, or that a tracking error has occurred in the output clock 2011 of the reset VCO 4 relative to the received data 7. In this case, the controller 6B feeds out a timing error signal via its output terminal 10.

Figure 22:
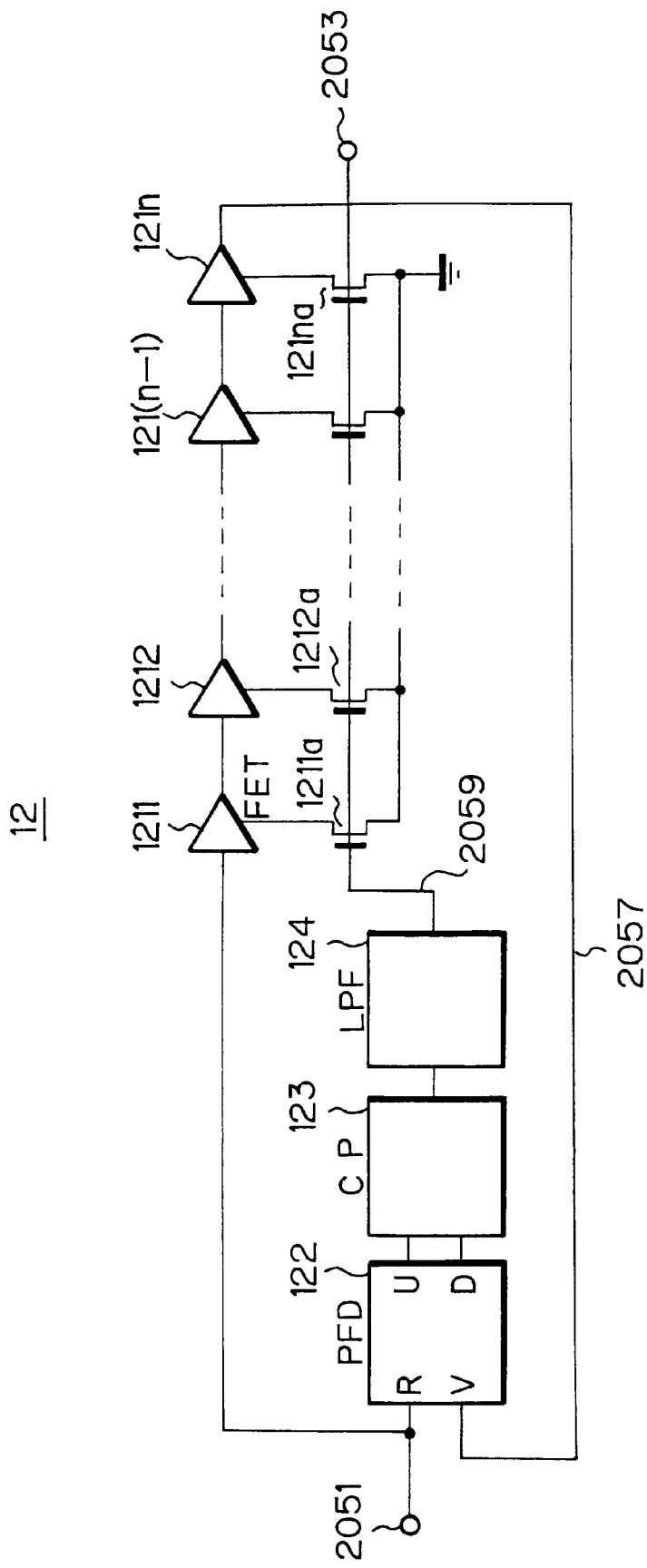
FIG. 22 is a block diagram schematically showing a specific configuration of a first multiphase clock generator included in the embodiment shown in FIG. 19.

FIG. 22 shows a specific configuration of the first multiphase clock generator 12 included in the above embodiment. As shown, the clock generator 12 is made up of n voltage control delay circuits 1211–121n connected in series, a PFD 122, a CP 123, and an LPF 124. The clock applied to the clock input terminal 51 is fed to the delay circuit 1211 and PFD 122. The output 2057 of the delay circuit 121n is fed to the PFD 122. The PFD 122 compares the input clock 2051 and the output 2057 of the delay circuit 121n and then outputs a phase comparison signal U or D. The signal U or D is fed to the CP 123.

The CP 123 charge-pumps the input signal U or D and delivers the resulting signal to the LPF 124. The signal filtered by the LPF 124 is fed to the gate terminals 2059 of FETs 1211a–121na. As a result, the delay circuits 121–121n oscillate and causes the signal applied to the gate terminals 2059 of the FETs 1211a–1231na to be delivered to the output 2053 as a delay control voltage signal. While the total delay of the delay circuits 1211–121n has a width of about one clock period, the circuits 1211–121n are controlled such that the clock 2051 input to the circuit 1211 and the clock 2057 output from the circuit 12 in coincide in phase.

Figure 23:
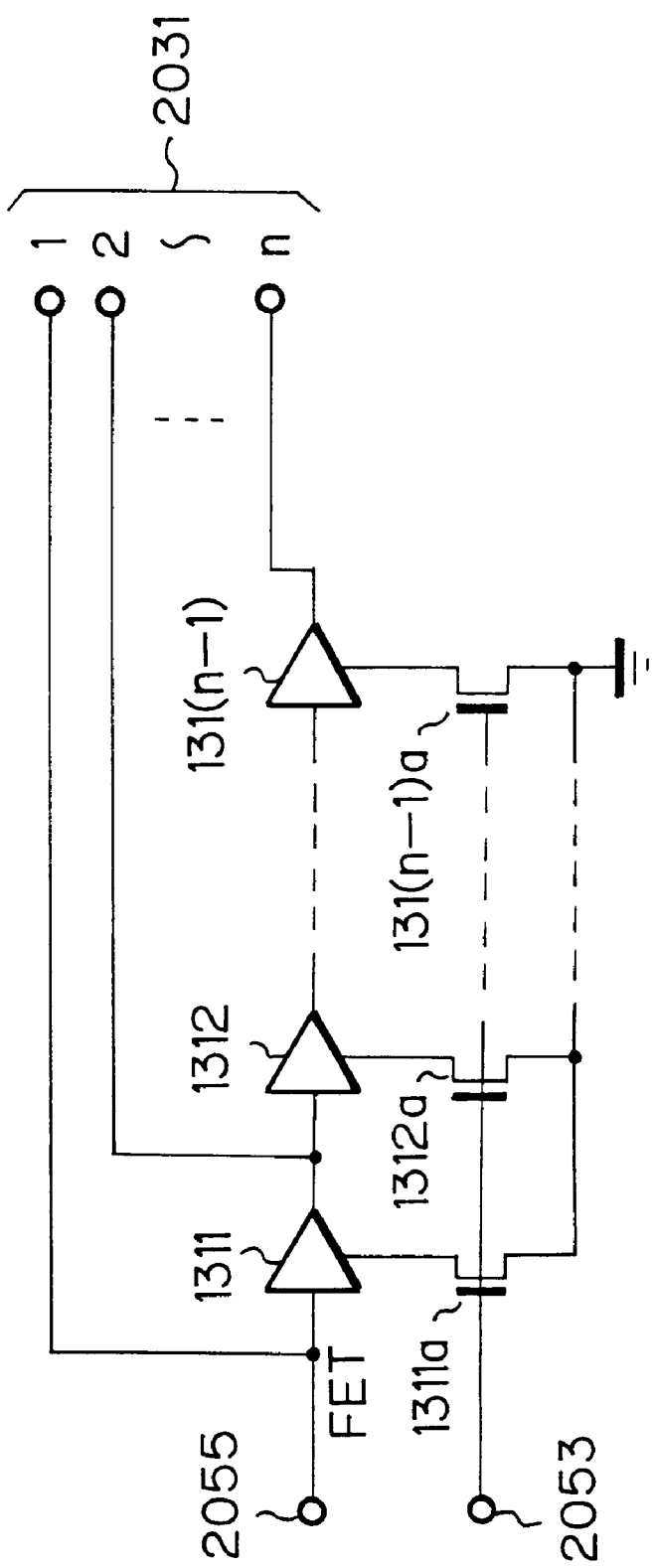
FIG. 23 is a block diagram schematically showing a specific configuration of a second multiphase clock generator included in the embodiment shown in FIG. 19.

FIG. 23 shows a specific configuration of the second multiphase clock generator 13. As shown, the clock generator 13 is implemented as a serial connection of voltage control delay circuits 1311–1131(n–1). The clock applied to the input terminal 2055 is fed to the delay circuit 1311 while the delay control voltage signal applied to the input terminal 2053 is fed to the gate terminals of FETs 1311a–131(n–1). Voltages appearing on the gate terminals of the FETs 1311a–131(n–1) control the propagation delays of the delay circuits 1311–131(n–1). The resulting output signals 2031 of the delay circuits 1311–131(n–1) are fed out as clocks of n different phases.

In the above embodiment, the first and second multiphase clock generators 12 and 13 make it needless for the PLL 2A to generate multiphase clocks by itself. This allows the PLL circuit 2A to be selected from a broad range of circuit configurations.

Figure 24:
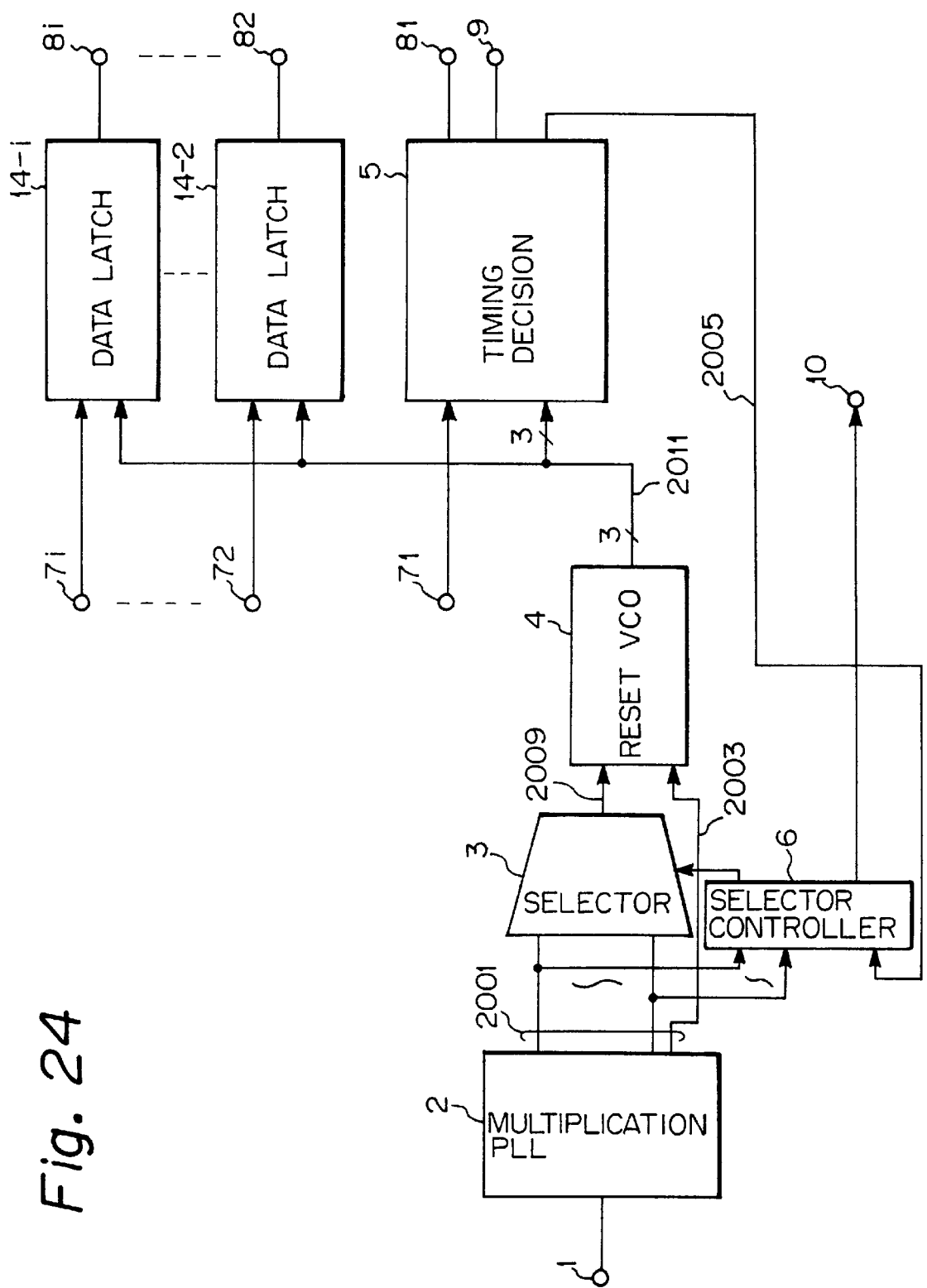
FIGS. 24, 25 and 26 are schematic block diagrams each showing another alternative embodiment of the present invention.

A reference will be made to FIG. 24 for describing another alternative embodiment of the present invention. This embodiment is constructed to deal with a plurality of parallel data streams having the same bit rate. As shown, the embodiment includes data latches 14-i through 14-2. In FIG. 24, the same or similar constituents as or to the constituents shown in FIG. 1 are designated by the same reference numerals, and a detailed description thereof will not be made in order to avoid redundancy. Briefly, the embodiment receives parallel data streams 7i–72 and 71. The timing decision 5 determines the timing of the data stream 71. As a result, recovered data streams 8i–82 and 81 synchronous in bit phase are output.

Specifically, the data latch 14-i receives the data stream 7i and outputs the recovered data stream 8i while setting up based on the triphase clock 2011 output from the reset VCO 4. The data latch 14-2 operates in the same manner as the data latch 14-i except that it receives the data stream 72 and outputs the recovered data stream 82. The timing decision 5 receiving the data stream 71 outputs the recovered data stream 81, the clock 9 used for the recovery, and the decision signal 2005, while setting up synchronization in the same manner as the data latches 14-i and 14-2. The decision signal 2005 is fed to the input terminal of the selection controller 6 assigned thereto.

In operation, i parallel data streams with an unknown phase are input to the data input terminals 71–7i, respectively. The i parallel data streams are synchronous and aligned in phase with each other. The data stream 71 is applied to the data input terminal of the timing decision 5 as master data in respect of timing. The data streams 7i–72 are respectively applied to the data input terminals of the data latches 14-2 through 14-i as slave data.

If the decision 5 determines that the phase relation between the input triphase clock 2011–0 and the data stream 71 is adequate, then it maintains the current clock phase. If the phase relation is inadequate, the decision 5 determines whether or not the current clock phase should be advanced or retarded, and delivers the decision signal 2005 via its output terminal 2005. Further, the decision 5 and data latches 14-2 through 14-i respectively latch the input data 71 and 72-7i in response to the triphase clock 2011–0 and output them via their data output terminals as recovered parallel data 81 and 82-8i. In addition, the decision 5 outputs the clock 2011 used to latch the input data 71 via the clock output terminal 9. It is to be noted that the relation between the data streams 72-7i input to the data latches 14-2 through 14-i and the input clock 2011 in respect of timing is so delayed as to be coincident with the relation between the data 71 input to the decision 5 and the input clock 2011. The decision signal 2005 output from the decision 5 is delivered to the input terminal of the selection controller 6 assigned thereto.

As stated above, this embodiment uses one of the parallel data streams 71 and 72-7i as a representative of timing information, i.e., master data while using the others as slave data. The timing decision 5 determines whether or not the relation between the clock 2011–0 and the master data is adequate with respect to timing, thereby recovering a timing from the master data. The output of the reset VCO 4 is used to latch the slave data. The embodiment is therefore capable of dealing with the parallel data 71 and 72-7i without resorting to additional large-scale hardware, while making the most of the effects of bit synchronization for serial data.

Figure 25:
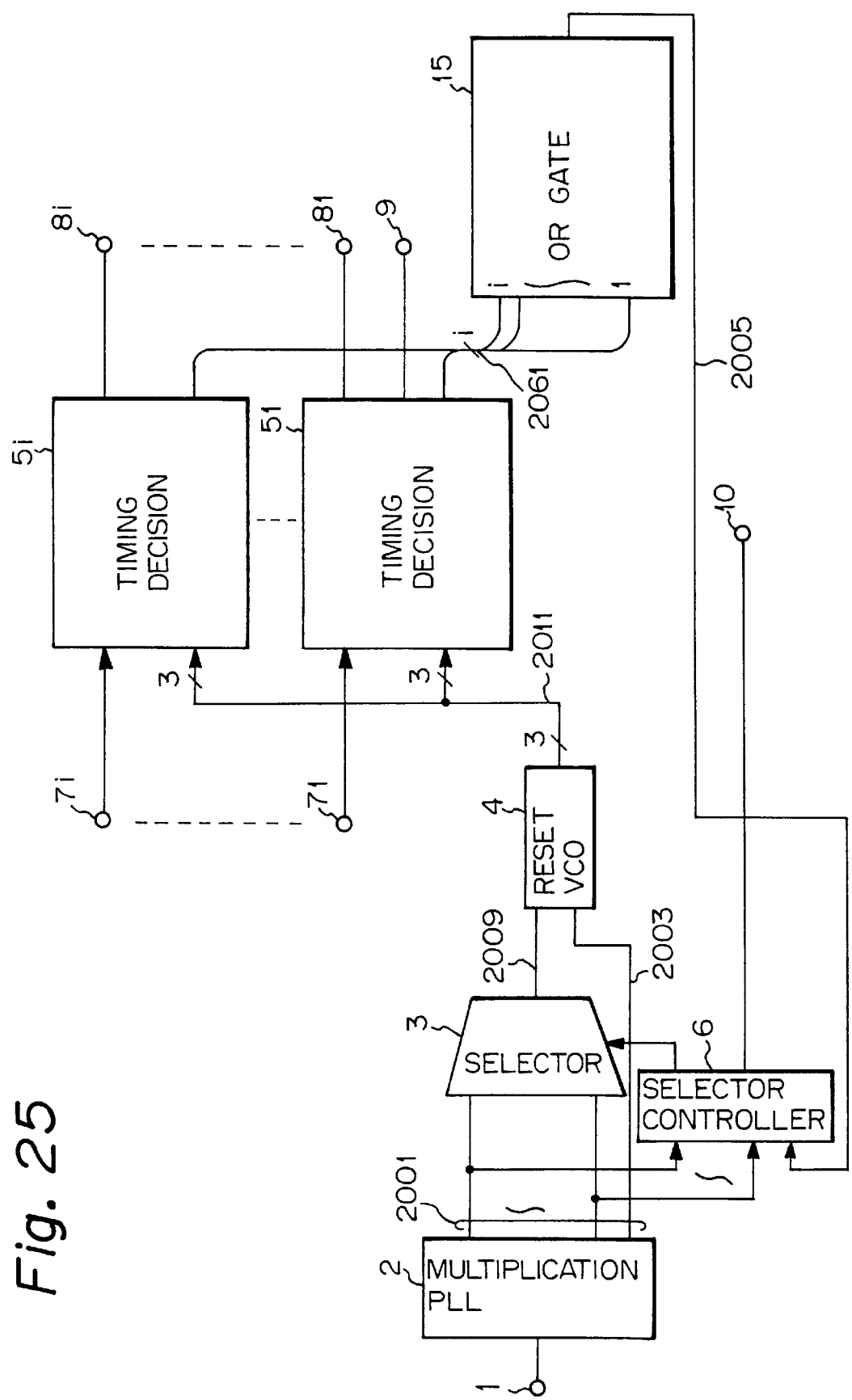

Referring to FIG. 25, another alternative embodiment of the present invention is shown. While this embodiment also deals with parallel data streams, it makes a decision as to timing on a stream-by-stream basis. As shown, this embodiment has timing decisions 51-5i and an OR gate 15. The decision 51 receives the data stream 71, sets up bit synchronization based on the triphase clock 2011 output from the reset VCO 4, and then outputs the recovered parallel data 81, the clock 9 used to recover the data 81, and a decision signal 2061. The decision signal 2061 is fed to the OR gate 15. The decision 5i operates in the same manner as the decision 51 except that it receives the data stream 7i and outputs the recovered parallel data 8i and a decision signal 2061. The decision signal 2061 is also fed to the OR gate 15. The OR gate 15 ORs the decision signals 2061 output from the decisions 51-5i and delivers its output to the decision signal input terminal 2005 of the selection controller 6. Again assume that the parallel data streams 71-7i are synchronous and aligned in phase with each other.

In operation, the parallel data streams 71-7i are applied to the data input terminals of the timing decisions 51-5i, respectively. The decisions 51-5i each determines whether the current clock phase should be advanced or retarded on the basis of the phase relation between the input clock 2011 and the input data. The resulting decision signals from the decisions 51-5i are input to the OR gate 15. Further, the decisions 51-5i each latches the respective input data in response to the triphase clock 2011–0 and outputs it via the respective one of data output terminals 81-8i as recovered data. The decision 51 delivers the clock 2011 used to latch the data via its clock input terminal 9. The OR gate 15 ORs the decision signals 2061 output from all the decisions 51-5i and feeds its output to the selection controller 6.

As stated above, this embodiment sets up bit phase synchronization for all the bit lines assigned to parallel data streams. Therefore, even when any one of the parallel data streams is skewed in phase, the embodiment is capable of dealing with it in the same manner as with serial data as in the embodiments of FIGS. 1–19 without resorting to additional large-scale software.

Figure 26:
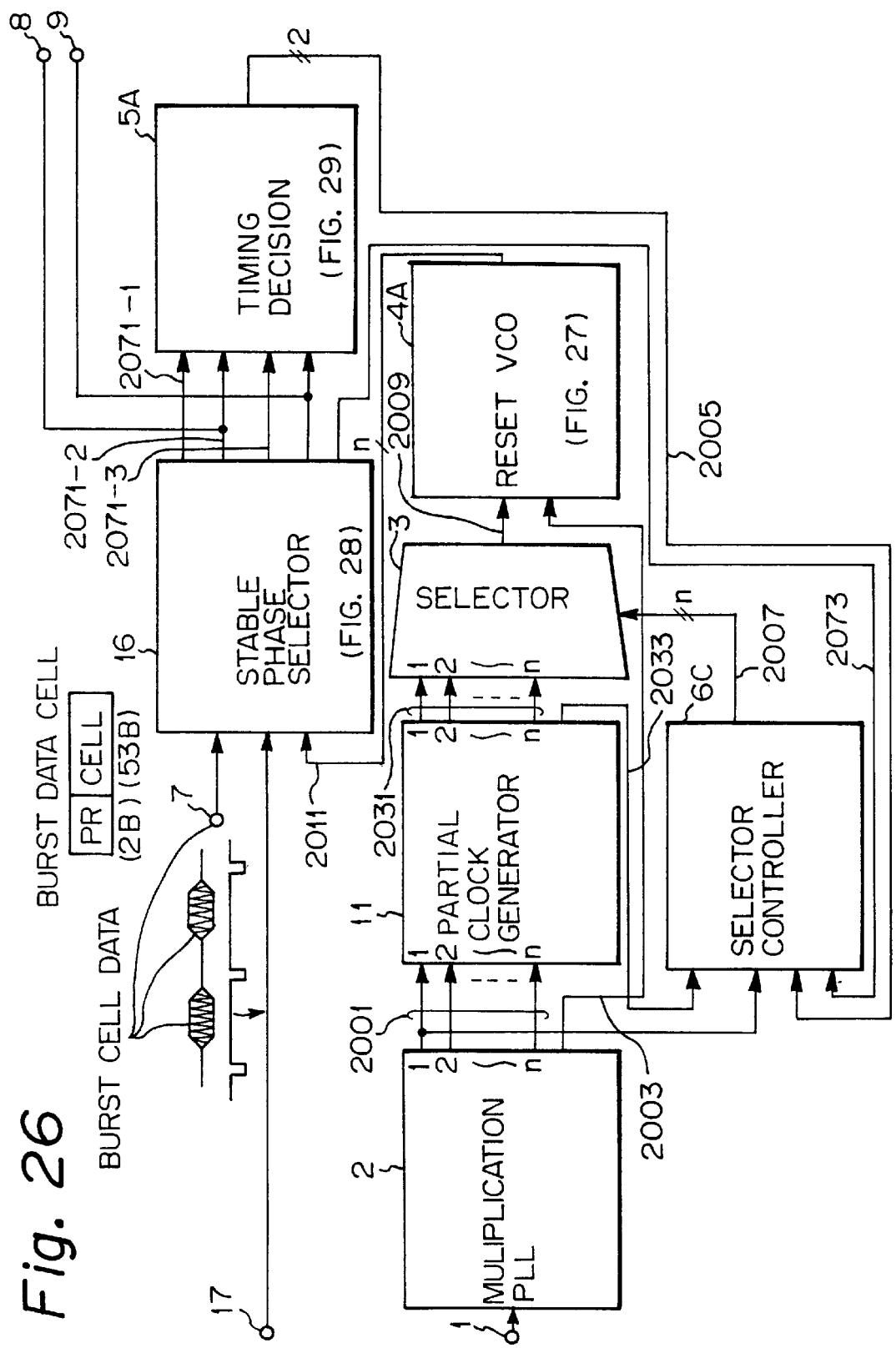

Referring to FIG. 26, another alternative embodiment of the present invention will be described. As shown, the embodiment receives the data 7 having an unknown phase and a burst cell format, a reset signal 17 indicative of the boundary between consecutive burst cells, and the reference clock 1 whose frequency is m (m>0) times as high as the frequency equal to or close to the bit rate of the received data 7. The circuitry includes a reset VCO 4A, a timing decision 5A, and a selection controller 6C.

Figure 27:
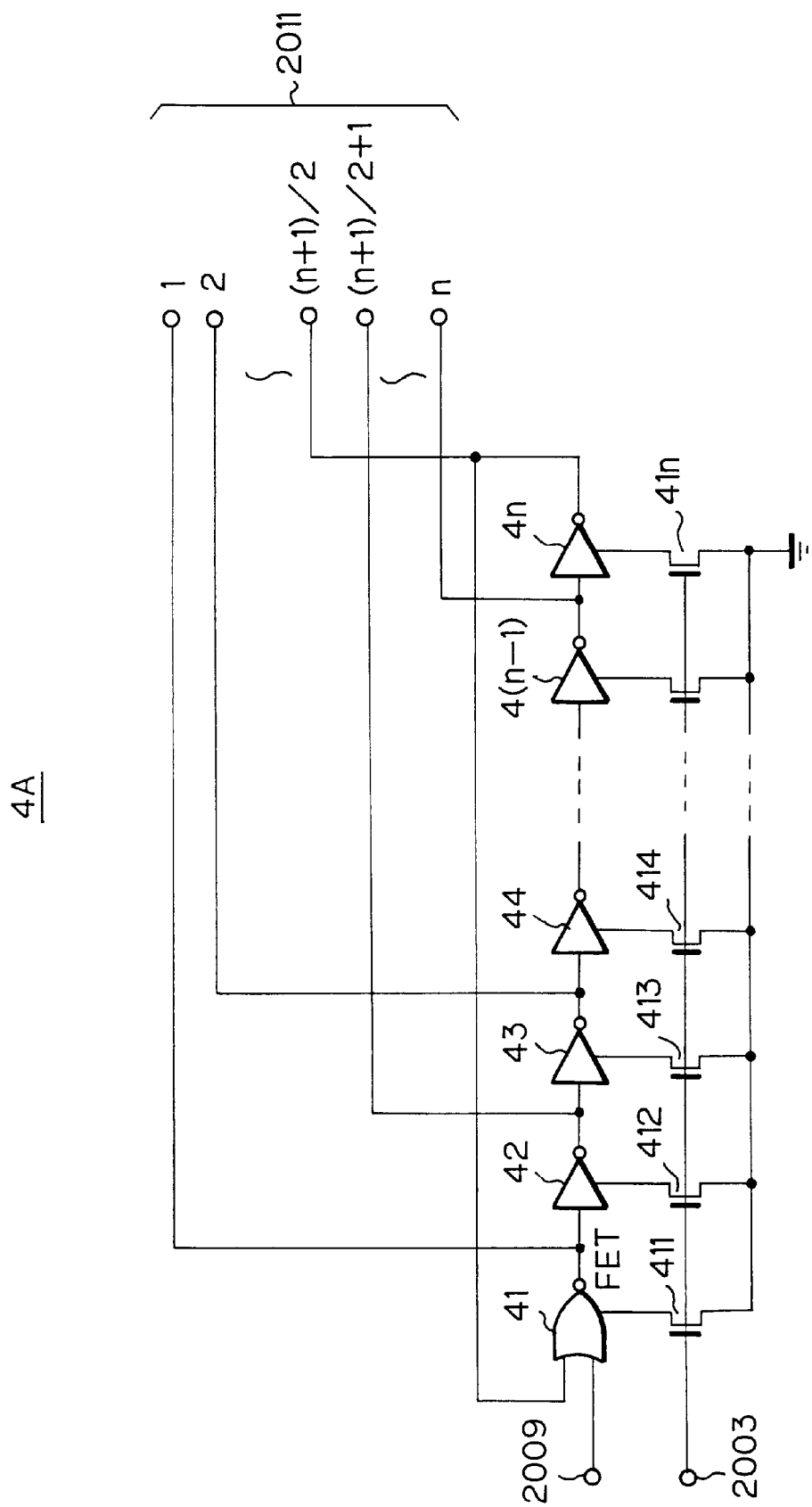
FIG. 27 is a block diagram schematically showing a specific configuration of a reset VCO included in the embodiment shown in FIG. 26.

A stable phase selector 16 is the characteristic feature of the illustrative embodiment. The stable phase selector 16 allows bit synchronization to be set up by detecting the timing of a stable phase at an early stage at the leading end of a burst cell. For the early-stage detection of a stable phase, the multiphase clocks 2011 are fed from the reset VCO 4A to the selector 16. For this purpose, the VCO 4A is so constructed as to output the multiphase clocks 2011, as shown in FIG. 27. The timing decision 5A is configured to receive triphase data 2071-1 through 2071-3 output from the selector 16, and to output the decision signal 2005. The selection controller 6C receives an enable signal 2073 output from the selector 16 for controlling the transition from a multiphase clock selection type synchronization mode to a tracking type synchronization mode.

FIG. 27 shows a specific configuration of the reset VCO 4A. As shown, the reset VCO 4A differs from the reset VCO 4, FIG. 7, in the following respect. To feed the multiphase clocks 2011-1 through 2011-n to the stable phase selector 16, the voltage control delay NOR gate 41 outputs the multiphase clock 2011-1. The voltage control delay inverter 43 outputs the multiphase clock 2011-2. The voltage control delay inverter 4(n-1) outputs the multiphase clock 2011-n. In addition, the voltage control delay inverter 42 outputs a multiphase clock 2011-(n+1)/2+1.

The stable phase selector 16 receives a reset signal via a reset signal input terminal 17 and then receives burst cell data via the data input terminal 7. The selector 16 detects, based on the multiphase clocks 2011-1 through 2011-n, a preamble PR heading the burst cell data and containing a synchronizing pattern. The burst cell data may consist of a preamble PR of 2 bytes and a cell of 53 bytes. The selector 16 detects the timing of a stable phase based on the preamble PR at an early stage. Subsequently, the selector 16 outputs three data 2071-1 through 2071-3 synchronous to the input burst cell data and the clock 9. The data 2071-1 through 2071-3 are the data of most stable phase and two data next to it with respect to phase. These data 2071-1 through 2071-3 are fed to the timing decision 5A. At the same time, the data of most stable phase 2071-2 is fed to the data output terminal 8. The clock 9 is fed out via the clock output terminal 9.

Further, on receiving the reset signal 17, the stable phase selector 16 causes the enable signal 2073 fed to the selection controller 6C to go low (inactive) so as to prevent the controller 6C from operating in the tracking type synchronization mode. After synchronization has been set up by the multiphase clock selection type synchronization mode, the selector 16 causes the enable signal 2073 to go low (active) so as to allow the controller 6C to operate in the tracking type synchronization mode.

Figure 28:
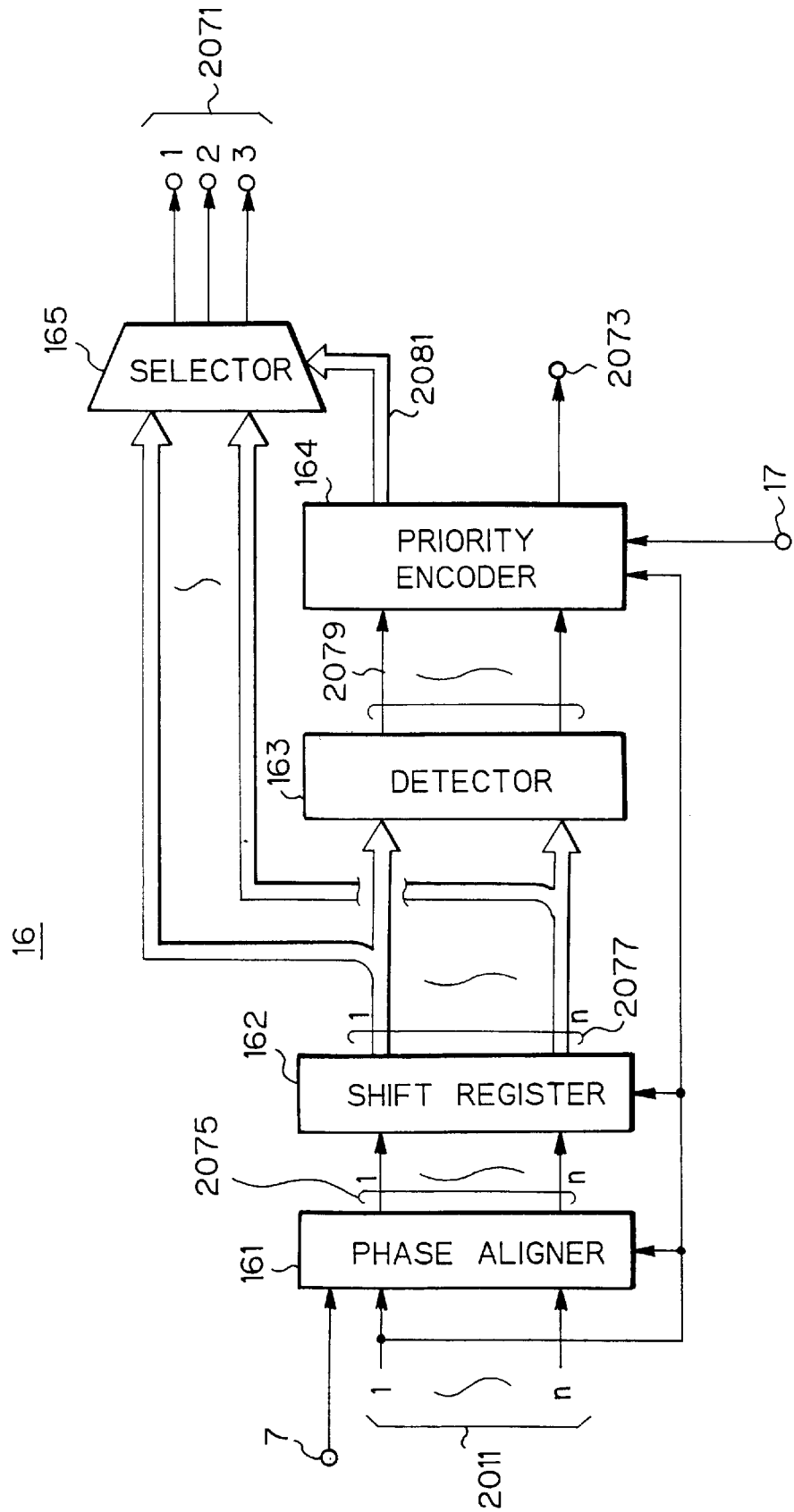
FIG. 28 is a block diagram schematically showing a specific configuration of a stable phase selector included in the embodiment shown in FIG. 26.

FIG. 28 shows a specific arrangement of the stable phase selector 16. As shown, the selector 16 has a phase aligner 161, a shift register 162, a detector 163, a priority encoder 164, and a selector 165. The phase aligner 161 receives the burst cell data 7 and multiphase clocks 2011-1 through 2011-n and latches the former with the latter. The phase aligner 161 delivers the n latched data or signals to the shift register 162, using, e.g., a multiphase clock 2075-1 as a master clock. In response, the shift register 162 shifts the n input signals on the basis of the master clock 2075-1 and delivers the resulting signals 2077 to the detector 163 and selector 165. In this manner, the shift register 162 transforms the preamble signal PR heading the input burst cell data 7 to n parallel signals.

The detector 163 implemented as, e.g., a combination of gates performs pattern recognition for detecting the preamble signal PR. For this purpose, the detector 163 sequentially overlap the first group to third group of signals 2077 output from the shift register 162. As a result, n groups of results of recognition 2079 are fed from the detector 163 to the priority encoder 164. Specifically, assume that the detector 163 has detected the same signal in the three different phases by the pattern recognition based on the adjoining three groups of signals 2077. Then, the detector 163 determines that a stable phase has been detected, and renders its outputs 2079 valid.

When the priority encoder 164 receives the reset signal 17 before the input burst cell data 7, it causes the enable signal 2073 to go high (inactive). As a result, the selection controller 6C is caused to operate in the multiphase clock selection type synchronization mode. The encoder 164 detects one of the n groups to which the group with the valid signals 2079 belongs, and feeds a select signal 2081 to the selector 165. At the same time, the encoder 164 causes the enable signal 2073 to go low (active). Consequently, the selection controller 6C is caused to operate in the tracking type synchronization mode.

The selector 165 selects three groups of data, i.e., the group of data of the phase designated by the select signal 2081 and two groups of data adjoining it as the most stable probable data. The three groups of data are fed out via data output terminals 2071-1 through 2071-3.

Figure 29:
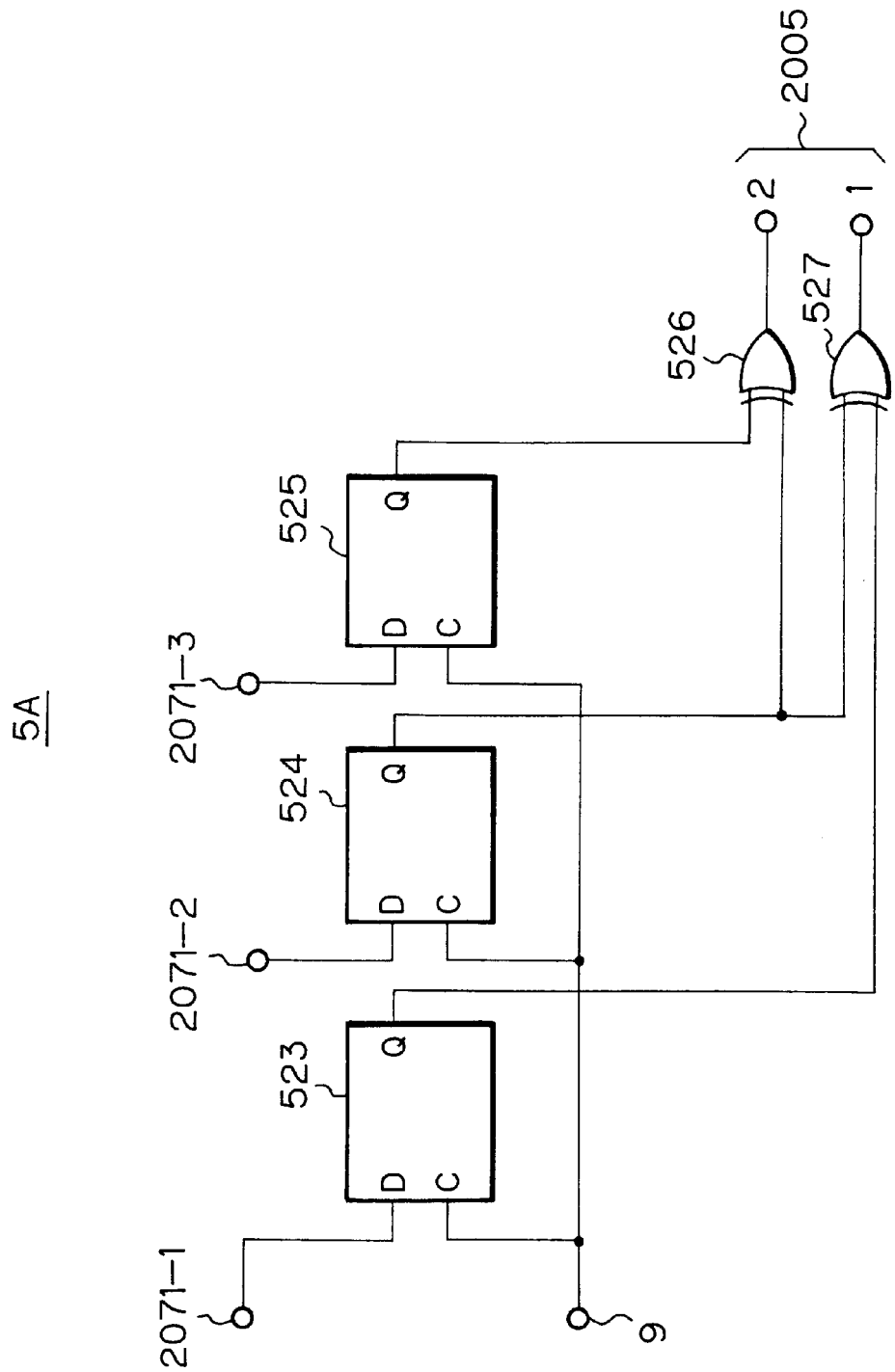
FIG. 29 is a block diagram schematically showing a specific configuration of a timing decision included in the embodiment shown in FIG. 26.

As shown in FIG. 29, the timing decision 5A receives the data of three different phases 2071-1 through 2071-3 and clock 9 from the stable phase selector 16. The decision 5A determines the relation in phase between the data 2071-1 through 2071-3 by identifying their logical levels on the basis of the clock 9. The decision 5A feeds the decision signal 2005 representative of the result of decision to the selection controller 6C. The specific arrangement of FIG. 29 is identical with the arrangement of FIG. 8 or 10 except that the data 2071-1 through 2071-3 are respectively fed to the D flip-flops 523–525, latched by the clock 9, and then fed to the EXOR gates 526 and 527. If the data 2071-1 and 2071-2 are different from each other, then the EXOR gate 527 causes its output to go high in order to retard the oscillation phase. If the data 2071-2 and 2071-3 are different from each other, then the EXOR gate 526 causes its output to go high in order to advance the oscillation phase. If all the data 2071-1 through 2071-3 are identical, then the EXOR gates 526 and 527 both cause their outputs to go low in order to maintain the current oscillation phase.

The selection controller 6C disables the tracking type synchronization mode if the enable signal 2073 is in its high level or enables it if the signal 2073 is in its low level. While the PLL 2, partial clock generator 11, selector 3 and reset VCO 4 are operating in the tracking type synchronization mode, the controller 6C receives the decision signal 2005 from the timing decision 5A. In response, the controller 6C retards or advances the current oscillation phase or maintains it. The controller 6C can be implemented only if the selection controller 6B shown in FIG. 17 is slightly modified. For example, the controller 6B may be modified such that the enable signal 2073 is fed to the UDC 614 in order to control its operation.

In operation, the clock whose frequency is 1/m of the frequency equal to the bit rate of the burst data 7 is input to the reference clock input terminal 1 of the multiplication PLL 2. In response, the PLL 2 outputs the clocks 2001 having the frequency equal to the bit rate of the data 7 and delivers them via the multiphase clock output terminals 2001-1 through 2001-n. The clocks 2001 are generated by a ring oscillator or similar VCO and sequentially shifted in phase by a value produced by equally dividing one clock width of the multiplied clock by n (n≧3). The clocks 2001-1 through 2001-n are respectively applied to the input terminals of the selection controller 6C assigned thereto.

The partial clock generator 11 operates in the same manner as described with reference to FIG. 14. The switching timing signal 2033 goes high (active) at the intermediate between the consecutive pulses of the partial clocks 2031. The selector 3 selects one of the signals input to the input terminals 2031-1 through 2031-n in accordance with the selection control signals 2007. The signal selected is delivered to the reset VCO 4A via the output terminal 2009. The operation of the reset VCO 4A will not be described specifically in order to avoid redundancy. The multiphase clocks 2011-1 through 2011-n output from the VCO 4A are fed to the stable phase selector 16.

Data having an unknown phase and a burst cell format are input to the data input terminal 7 from an apparatus, not shown. The received data are fed to the data input terminal of the stable phase selector 16. The selector 16 latches the input data 7 in response to the multiphase clocks 2011-1 through 2011-n, transfers the latched data to, but not limited to, the multiphase clock 2011-1, and thereby detects a given fixed pattern. The given pattern may be a preamble pattern associated with a burst cell for the detection of a timing, or a frame pattern commonly inserted for data transmission. If the fixed pattern is detected in three adjoining phases, then the selector 16 determines that the intermediate phase allows the data to be latched at a stable timing, and delivers the data 7 latched in the three phases via the data output terminals 2071-1 through 2071-3. It is assumed that as the number (1 through n) decreases, the data is latched by a clock of more advanced phase.

The operation described so far occurs singly in response to the reset signal. During this period, phase control over the reset VCO 4 is apt to cause the stable phase selector 16 to malfunction. In light of this, the enable signal 2073 is rendered inactive in order to disable the selection controller 6C. This successfully sets up the initial synchronization without losing any data including the fixed pattern to be detected.

The data appearing on the data output terminal 2071-2 of the stable phase selector 16 and the multiphase clock 2011-1 are fed to the recovered data output terminal 8 and clock output terminal 9, respectively.

The timing decision 5A feeds the decision signal 2005 to the selection controller 6C. In response, the controller 6C retards or advances the oscillation phase of the multiphase clocks 2011 of the reset VCO 4A or maintains the current oscillation phase, as stated earlier. The controller 6C is provided with a guard time longer than the time necessary for a signal output from the controller 6C to be fed back to the same via the selector 3, reset VCO 4A, stable phase selector 16, and timing decision 5A for the previously stated purpose. It should be noted that when the enable signal 2078 is inactive, the controller 6C is forcibly disabled.

The selection controller 6 controls the selector 3 in response to the switching timing signal 2033 output from the clock generator 11, as stated with reference to FIG. 19. Therefore, noise is prevented from being input to the phase control signal input terminal 2009 of the reset VCO 4A at the time of switching. How the reset VCO 4A self-runs will not be described specifically in order to avoid redundancy.

The above embodiment has various unprecedented advantages, as follows. Multiphase clocks are generated without resorting to a high-speed clock whose rate is an integral multiple of the transmission rate. Therefore, the circuitry can be implemented as an LSI only if devices capable of processing data of the transmission rate digitally are used. With the stable phase selector 16, it is possible to set up bit phase synchronization in a short period without losing even the leading one of the data 8. Subsequently, the oscillation frequency of the reset VCO 4A is controlled to follow the jitter of the phase of the burst cell data 7.

Specifically, in the illustrative embodiment, a multiphase clock selection type synchronizing system and a tracking type synchronization system are used in combination. Therefore, although phase jitter exceeding one clock period width may occur between the received burst data 7 and the reference clock 1, the data can be recovered without synchronization errors. This successfully enhances free clock distribution design and free cell length design. The terms "free clock distribution design" refer to a wiring design for distributing a reference clock unit from a reference clock generating unit to a unit having a plurality of bit phase synchronizing circuits.

The stable phase selector 16 having the specific configuration shown in FIG. 28, can be implemented by the combination of gates and logic circuits which do not need sophisticated processing. The embodiment therefore realizes high-speed operation and is feasible for LSI implementations.

The tracking type synchronization mode is implemented mainly by the multiplication PLL 2, partial clock generator 11, selector 3, reset VCO 4A, timing decision 5A, and selection controller 6C. Hence, it is possible to maintain synchronization without regard to changes in the phase or the frequency of the burst cell data 7. Consequently, the synchronized data 8 and clock 9 are achievable in an extremely stable and rapid manner with a simple construction. The embodiment is particularly feasible for high-speed data transmission systems.

Some possible modifications of the illustrative embodiment are as follows. In the embodiment, the frequency control voltage 2003 is fed from the VCO of the PLL 2 to the reset VCO 4A. However, the signal 2003 may be omitted if the self-running frequency of the VCO 4A is brought close to the oscillation frequency of the PLL 2 by, e.g., a signal input from the outside. While the clock input to the reference clock input terminal 1 has been described as having a frequency m times (m>0) as high as the clock frequency equal to the bit rate of the data 7, the former frequency may be close to the latter frequency.

The VCO of the PLL 2 may be replaced with the combination of a multiplication PLL lacking the function of outputting multiphase clocks, and a multiphase clock generating circuit. The VCO of the PLL 2 and the reset VCO 4A may be different in circuit arrangement from each other, if desired.

In the embodiment, the stable phase selector 16 detects a stable phase timing of the received burst cell data 7 on the basis of the n phase clocks output from the reset VCO 4A; the n phases correspond to the n phase clocks output from the PLL 2. Alternatively, the reset VCO 4A may output three or more multiphase clocks in place of the n phase clocks. For example, an arrangement may be made such that the PLL 2 outputs six phase clocks while the VCO 4A outputs three phase clocks.

The embodiment is practicable even with a variable length packet having a preamble signal PR. The preamble signal PR should preferably be implemented as pattern data having two or more transitions. Moreover, the embodiment is feasible not only for the bit phase synchronization of burst data but also for that of data continuously transmitted. In addition, the partial clock generator 11 intervening between the PLL 2 and the selector 3 may be omitted in which case the multiphase clocks 2001 will be directly fed from the PLL 2 to the selector 3.

The embodiments described above achieve various advantages, as follows. Synchronized data and a clock are achievable in an extremely stable and rapid manner with a simple construction. This is particularly true with high-speed data transmission systems. Only if bit phase synchronization is set up with one of parallel received data streams, synchronization can be set up with all the parallel data streams in an extremely stable and rapid manner with a simple construction. In addition, the synchronization is achievable in an extremely short period not only with continuous data but with burst data.

Figure 30:
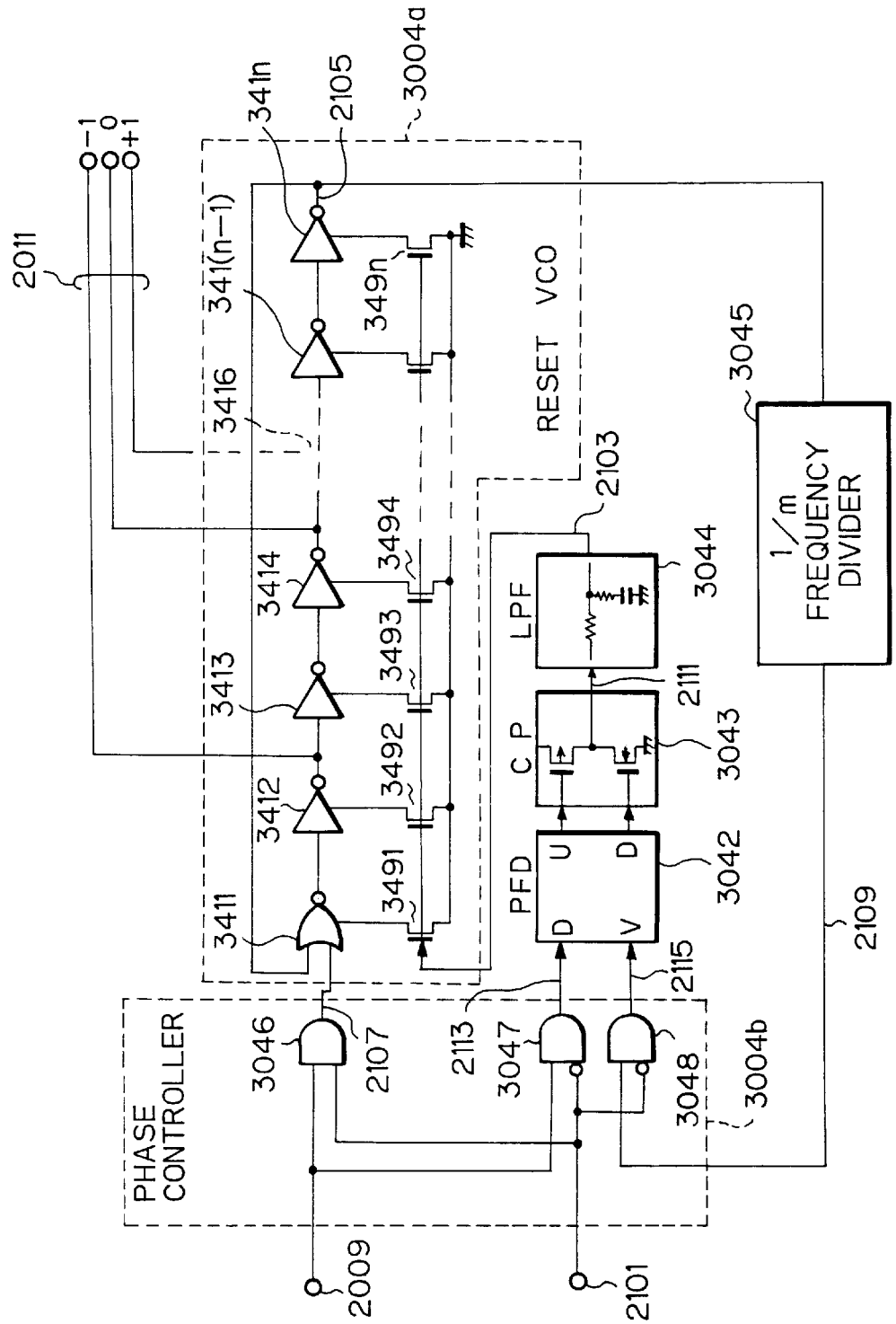
FIG. 30 is a block diagram schematically showing a specific configuration of a direct phase shift PLL circuit also embodying the present invention.

Referring to FIG. 30, a direct phase shift type PLL also embodying the present invention is shown and generally designated by the reference numeral 3004. As shown, the PLL 3004 receives a phase control signal 2009 and a phase switching signal 2101. The phase control signal 2009 has a frequency which is 1/m (m>0) of a desired frequency, and a pulse width which is one half or less of one period of a clock having the desired frequency.

The PLL 3004 is made up of a reset VCO 3004a, a phase controller 3004b, a PFD 3042, a CP 3043, an LPF 3044, and an 1/m frequency divider 3045. The reset VCO 3004a has a biinput voltage control delay NOR gate 3411, voltage control delay inverters 3412–341n, an FET 3491 for controlling the NOR gate 3411, and FETs 3492–349n for controlling the inverters 3412–341n. The reset VCO 3004a is constructed and arranged in the same manner as the reset VCO 4 shown in FIGS. 3a and 3b.

The reset VCO 3004a is implemented by a ring oscillator and receives the output of the LPF 3044 at the gate terminals 2103 of the FETs 3491–349n. In response, the VCO 3004a controls the drain currents of the FETs 3491–349n and thereby controls the propagation delays of the NOR gate 3411 and inverters 3492–349n. The inverter 341n delivers a clock 2105 to one input terminal of the NOR gate 3411 while the phase controller 3004b feeds a phase control signal 2107 to the other input of the NOR gate 3411. The phase control signal 2107 causes the VCO 3004a to oscillate in a phase shift mode.

The VCO 3004a outputs three clocks 2011 of different phases. Specifically, a clock of first phase is fed from the inverter 3412 to a first clock output terminal 2011–1. A clock of second phase (certain reference phase) is fed from the inverter 3414 to a second clock output terminal 2011–0. Further, a clock of third phase is fed from the inverter 3416 to a third clock output terminal 2011+1. The clock 2011–1 adjoins the clock 2011–0 of reference phase and is advanced in phase relative to the clock 2011–0. The clock 2011+3 also adjoins the clock 2011–0, but it is retarded in phase relative to the clock 2011–0.

The 1/m frequency divider 45 divides the clock 2105 output from the reset VCO 3004a by a preselected value m. The output of the frequency divider 45 is applied to a biinput AND gate 3048 having one inverting input and included in the phase controller 3004b. In a multiplication PLL mode in which the phase switching signal 2101 is inactive, the PFD 3042 receives the clock 2109 output from the frequency divider 3045 at its V terminal 2115 via the AND gate 3048. At the same time, the PFD 3042 receives a phase control signal at its R (reference) terminal 2113 via a biinput AND gate 3047 having one inverting input. By comparing the clock 2109 and phase control signal with respect to phase and frequency, the PFD 3042 delivers the result of comparison to the CP 43 in the form of an U signal or a D signal.

The CP 30 inputs and outputs a current proportional to the phase difference signal and can be implemented by a simple transistor circuit. Specifically, the CP 30 charges in response to the U signal or discharges in response to the D signal, outputting a charge pump signal 2111. The charge pump signal 2111 is applied to the LFP 3044 implemented by a simple resistor and capacitor circuit. The output of the LPF 3044 is delivered to the FETs 3491–349n of the reset VCO 3004a.

The phase controller 3004b has a biinput AND gate 3046 and the biinput AND gates 3047 and 3048 which are connected together, as illustrated. The controller 3004b receives the output clock 2109 of the frequency divider 3045 via the AND gate 3048 and receives the phase control signal 2009 and phase switching signal 2101. When the phase switching signal 2101 is in its high level (active), the controller 3004b causes the reset VCO 3004a to oscillate in the phase shift mode. On the other hand, when the signal 2101 is in its low level (inactive), the controller 3004b controls the PFD 3042 to set up the multiplication PLL mode.

To implement the above operation, the phase control signal 2009 is fed to one input terminal of the AND gate 3046 while the phase switching signal 2101 is fed to the other input terminal of the same. When the phase switching signal 2101 is in its high level (active), the AND gate 3046 gates the phase control signal 2009 and applies it to the NOR gate 3411 of the reset VCO 3004a. When the signal 2101 is in its low level (inactive), the AND gate 3411 intercepts the signal 2009 and feeds a low level signal to the NOR gate 3411.

The phase switching signal 2101 is applied to the NAND gates 47 and 48 also. When the signal 2101 is in its high level, the AND gate 3047 intercepts the phase control signal 2009. When the signal 2101 is in its low level, the AND gate 3047 passes the signal 2009 therethrough to the PFD 3042 and thereby controls it to set up the multiplication PLL mode. On the other hand, the AND gate 3048 intercepts the frequency-divided clock 2109 when the phase switching signal 2101 is in its high level (active) or passes it therethrough to the PFD 3042 when the signal 2101 is in its low level (inactive). The signal 2109 reached the PFD 3042 causes oscillation to occur in the multiplication PLL mode.

Figure 31:
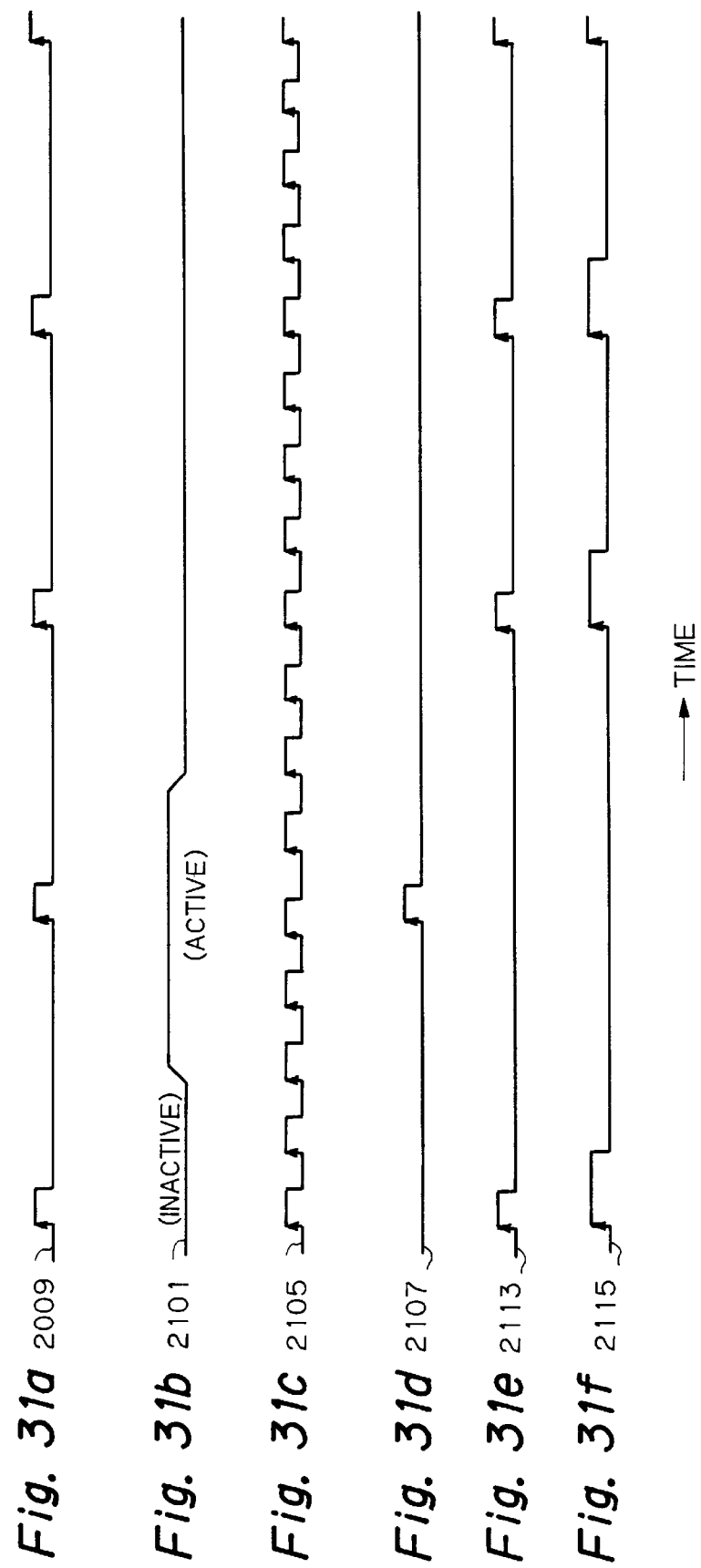
FIGS. 31a–31f are timing charts demonstrating the operation of the PLL circuit shown in FIG. 30.

A reference will be made to FIGS. 31a–31f for describing the operation of the direct phase shift PLL circuit 3004. When the phase switching signal 2101 (FIG. 31b) is in its low level, the reset VCO 3004a oscillates in the multiplication PLL mode in synchronism with a positive-going edges of the phase control signal 2009 (FIG. 31c). At this instant, the phase control signal 2009 is not applied to the reset VCO 3004a, so that the VCO 3004a does not operate in the phase shift mode when the switching signal 2101 is in its high level, the phase control signal 2009 is fed to the NOR gate 3111 of the VCO 3004a. As a result, the oscillation phase is forcibly controlled by the output (phase control signal) 2107 (FIG. 31c) of the AND gate 3046, causing the VCO 3004a to oscillate in the phase shift mode. In this manner, the PLL 3004 is selectively operable in the phase shift mode or the multiplication PLL mode in response to the phase control signal 2009, depending on the logical level of the switching signal 2101.

The phase switching signal 2102 unique to the above PLL 3004 allows the phase shift mode and multiplication PLL mode to be selectively set up. Even at the time of switchover, the clock can be output in a stable without any momentary shut-off or noise. In addition, the phase controller 3004b is extremely simple and miniaturizes the overall arrangement. With these advantages, the PLL 3004 will improve the performance of bit phase synchronizing circuitry.

Figure 32:
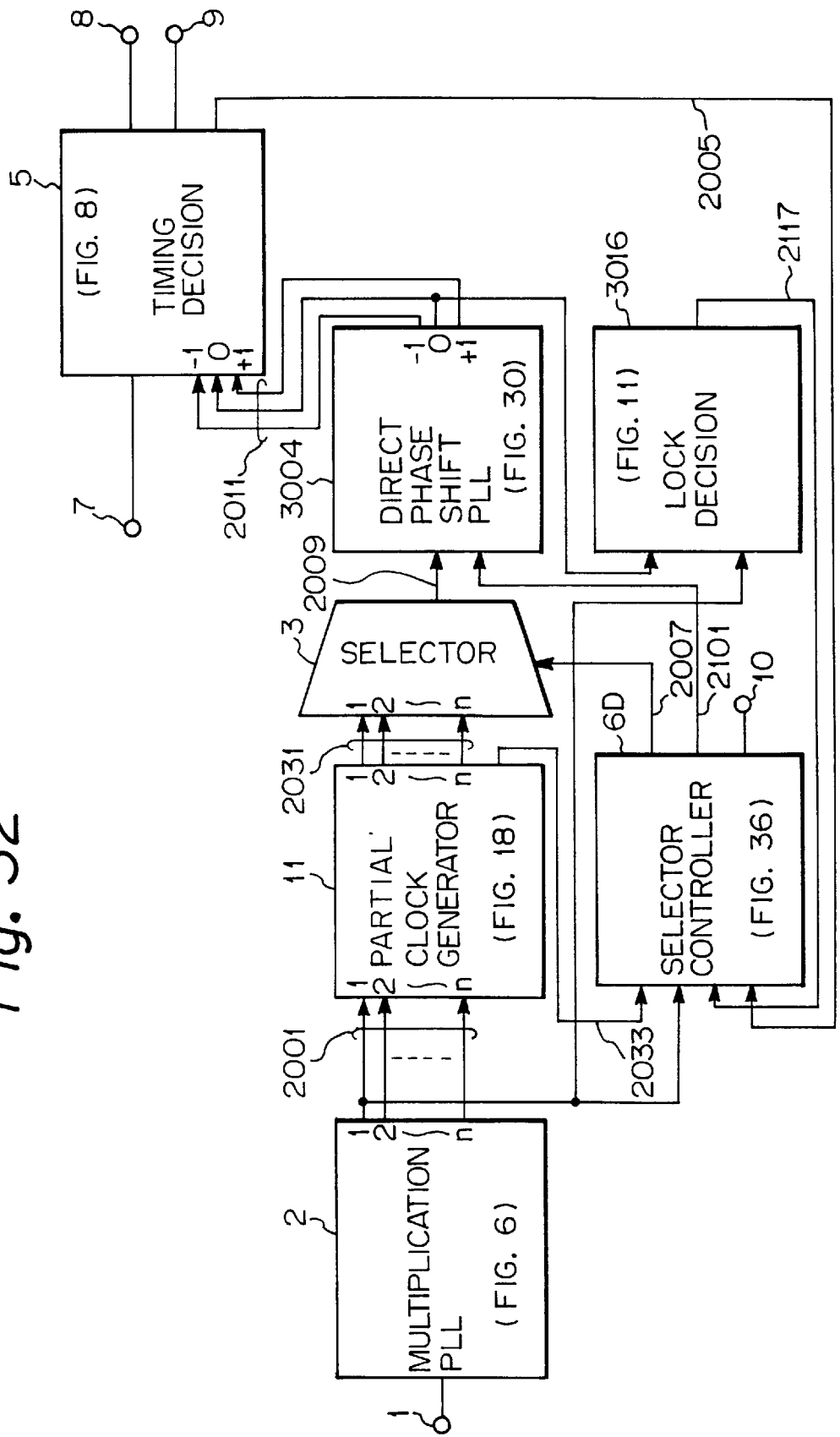
FIG. 32 is a block diagram schematically showing still another alternative embodiment of the synchronizing circuitry in accordance with the present invention.

FIG. 32 shows another alternative embodiment of the circuitry in accordance with the present invention and using the direct phase shift PLL 3004. As shown, the circuitry includes a selection controller 6D and a lock decision 3016 as well as the PLL 3004. The selection controller 6D receives a switching timing signal output from the partial clock generator 11 via its input terminal. Also, the controller 6D receives a multiphase clock output from the output terminal 2001-1 of the multiplication PLL 2 via another input terminal. Further, the controller 6D receives a lock decision signal output from the lock decision 30 via another input terminal. In addition, the controller 6D receives a decision signal output from the timing decision 5 via another input terminal. In response, the controller 6D generates the selection control signals 2007 and delivers them to the selector 3. At the same time, the controller 6D generates the phase switching signal 2101 and feeds it to the direct phase shift PLL 3004. When a timing error occurs, the controller 6D sends a data recognition error signal via the exclusive output terminal 10.

The direct phase shift PLL 3004 receives the partial clocks 2009 selectively output from the selector 3 via its input terminal and receives the phase switching signal 2101 output from the selection controller 6 via another input terminal. While the phase switching signal 2101 is in its high level (active), the PLL 3004 operates in the phase shift mode, i.e., forcibly controls the oscillation phase of the reset VCO 3004a. While the phase switching signal 2101 is in its low level (inactive), the PLL 3004 operates in the multiplication PLL mode in response to the phase control signal or input clock 2009. In any case, the PLL 3004 outputs three clocks of different phases 2011–0, 2011–1 and 2011+1, as stated earlier. The clocks 2011–0, 2011–1 and 2011+1 are respectively fed to the clock input terminals 0, −1 and +1 of the timing decision 5.

The lock decision 3016 receives the clock 2001-1 (master clock) from the multiplication PLL 2 while receiving the output clock of the direct phase shift PLL circuit 3004 (slave clock). In response, the decision 3016 determines whether or not the direct phase shift PLL 3004 is in a locked state. If the PLL 3004 is in a locked state, the decision 3016 causes the decision signal 2117 to go high (active). If otherwise, the decision 3016 causes the decision signal 2117 to go low (inactive). The signal 2117 is applied to the selection controller 6.

Figure 33:
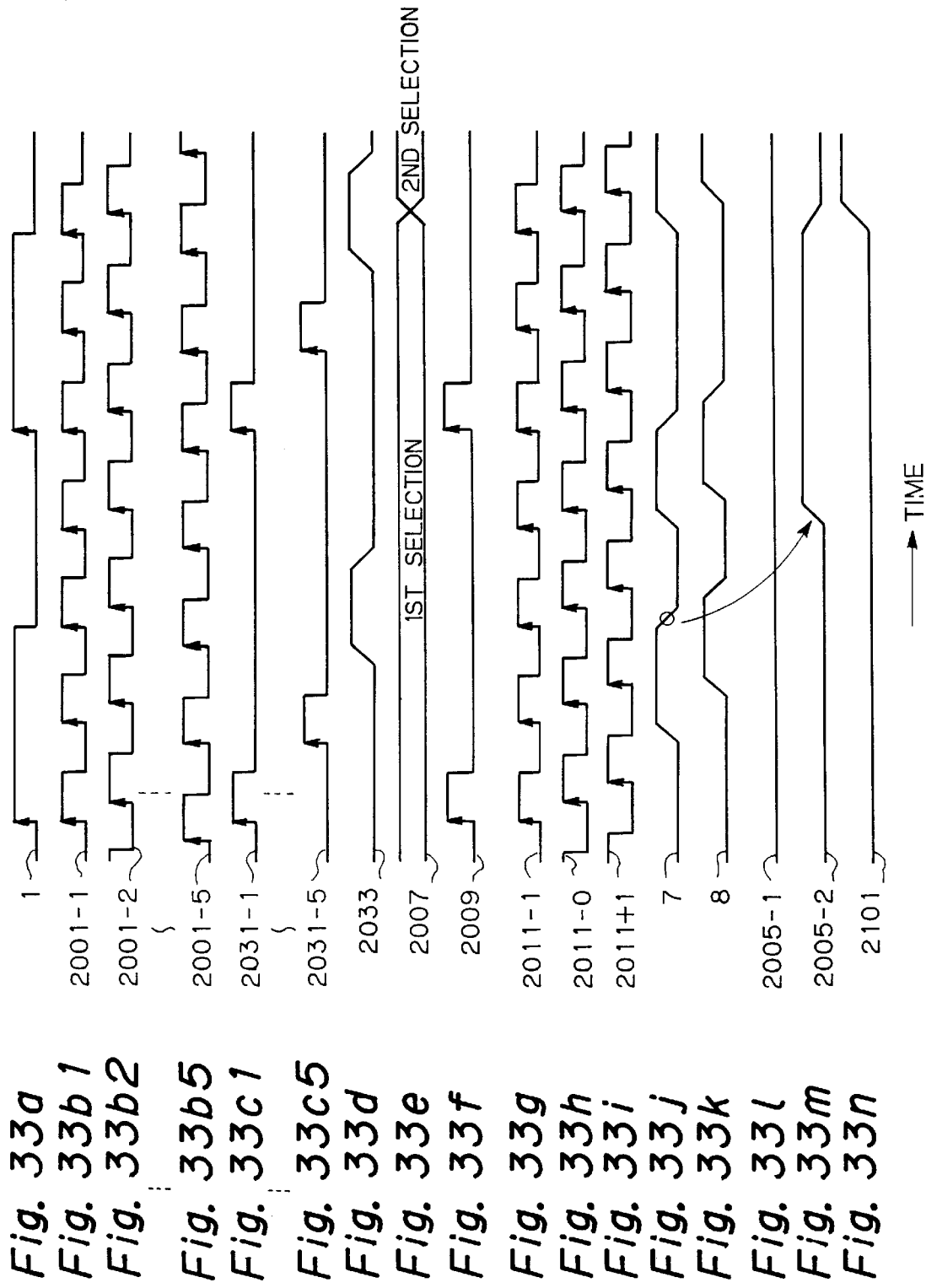
FIGS. 33a–33n are timing charts demonstrating the operation of the embodiment shown in FIG. 32.
Figure 34:
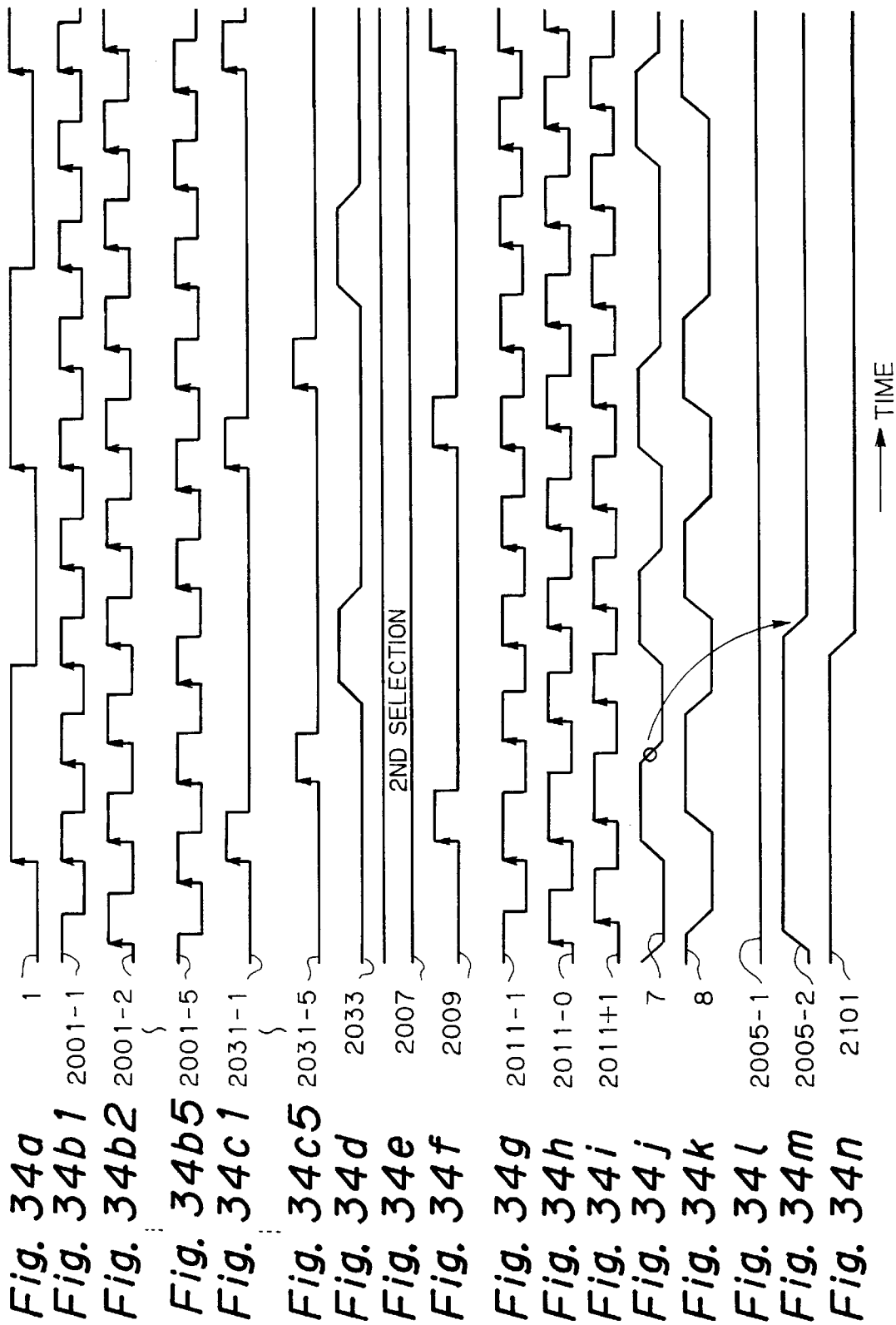
FIGS. 34a–34n are timing charts which are the continuation of FIGS. 33a–33n, respectively.

The operation of the circuitry shown in FIG. 32 will be described with reference to FIGS. 33a–33n and FIGS. 34a–34n which are the continuation of FIGS. 33a–33n, respectively. It is assumed in the figures that the divisor m for frequency division is "4", that the number of phases n of the multiphase clocks 2001 is "5", and that the number of clock omission cycles k of the partial clock 2009 is "4".

Figure 14:
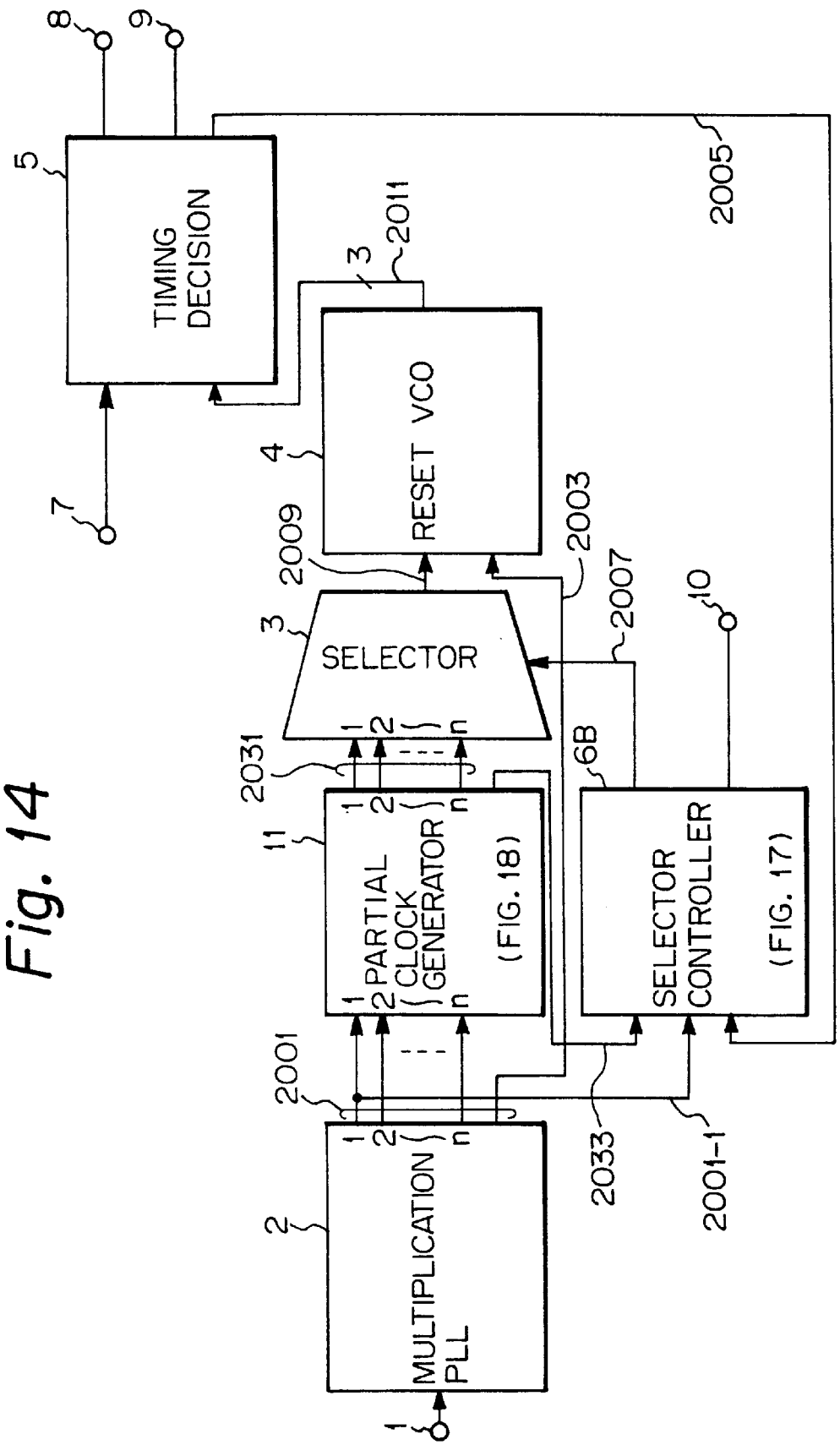
FIG. 14 is a schematic block diagram showing another alternative embodiment of the present invention.
Figure 15:
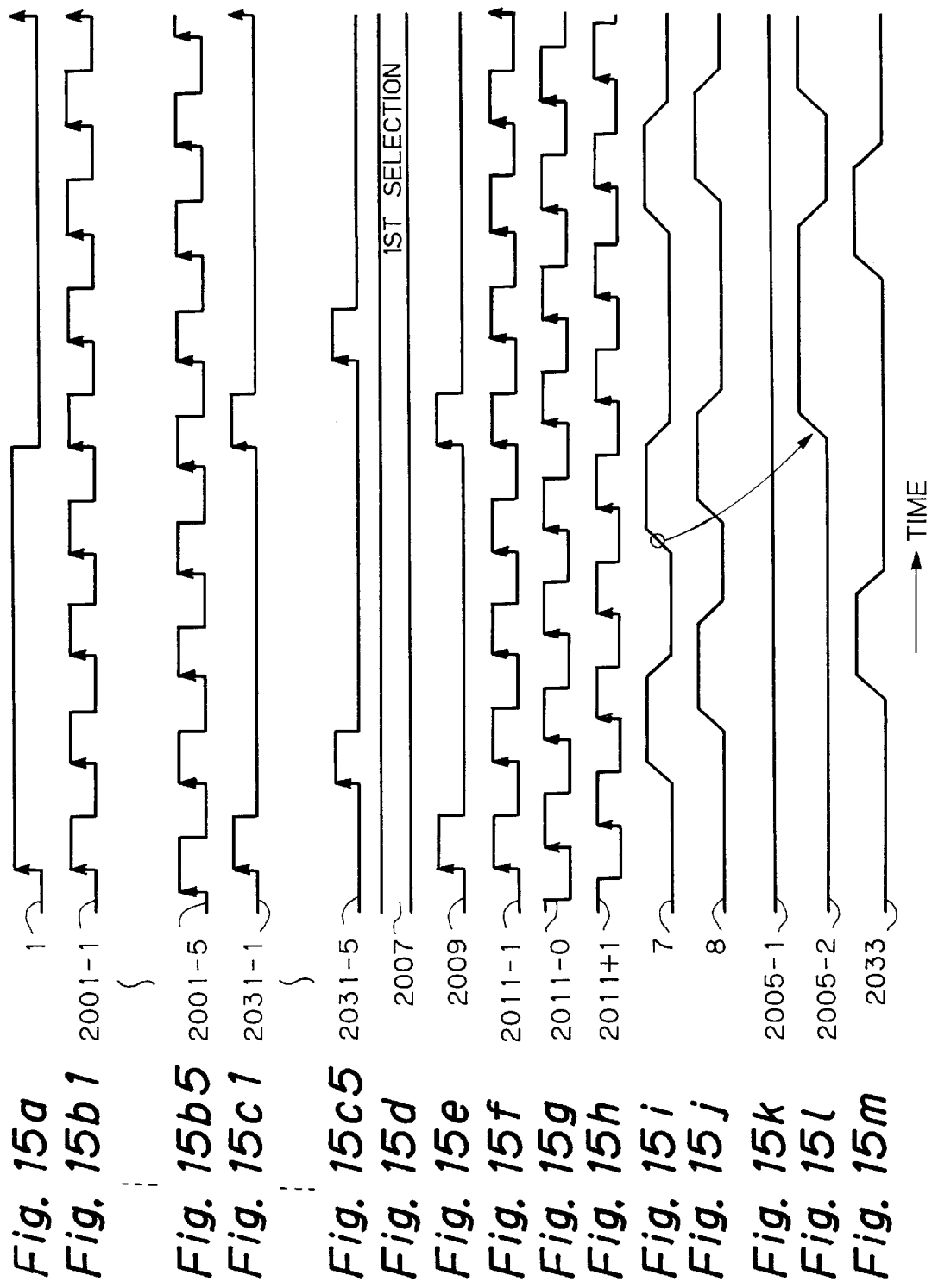
FIGS. 15a–15m are timing charts demonstrating the operation of the embodiment shown in FIG. 14.
Figure 16:
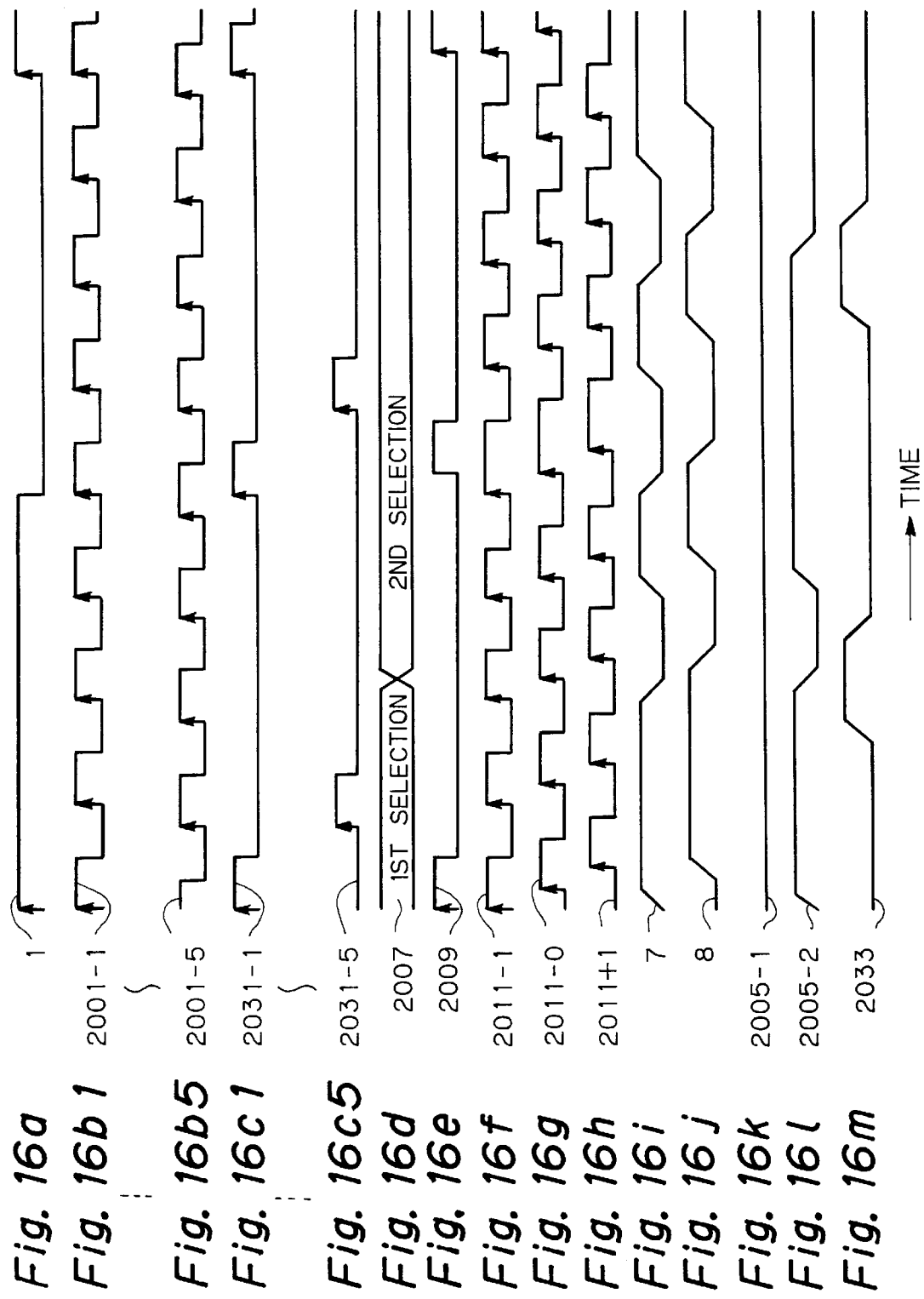
FIGS. 16a–16m are timing charts which are the continuation of FIGS. 15a–15m, respectively.

As shown, the circuitry operates in the same manner as in the embodiment of FIG. 14 up to the step in which the selector 3 outputs one of the partial clocks 2031–2031–n in accordance with the selection control signals 2007. The output 2009 of the selector 3 is fed to the direct phase shift PLL 3004. The PLL 3004 selectively operates in the phase shift mode or the multiplication PLL mode, depending on the logical state of the phase switching signal 2101, as stated earlier.

In the phase shift mode, the oscillation phase of the reset VCO 3004a is directly controlled by the phase of pulses input to the input terminal 2009 of the PLL 3004. As a result, the PLL 3004 selectively gates one of the pulse signals 2009 of n different phases and generates a clock 2011 corresponding in phase to the gated pulse signal 2009. On the other hand, in the multiplication PLL mode, the PLL 3004 uses the pulse signal input via its input terminal 2009 as a reference clock.

Data with an unknown phase and sent from an apparatus, not shown, are input to the timing decision 5 via the data input terminal 7. In response, the decision 5 determines whether or not the relation in phase between the data 7 and the clock 2011-1 is adequate. If the relation is adequate, the decision 5 determines that the current clock phase should be maintained. If otherwise, the decision 5 determines whether the current clock phase should be advanced or retarded. The output 2005-1 or 2005-2 representative of the result of decision is fed from the decision 5 to the selection controller 6D. Further, the decision 5 latches the data 7 in response to the clock 2011-0 and outputs the latched data via its output terminal 8, while outputting the clock 2011 used to latch the data 7 via its output terminal 9.

The selection controller 6D is provided with a guard time for the purpose stated previously. The controller 6D outputs the control signals 2007 in response to the decision signal 2005-1 or 2005-2 received from the timing decision 5 after the guard time has elapsed. In the illustrative embodiment, the guard time should be longer than the period of time necessary for a signal output from the controller 6D to be fed back to the same via the selector 3, direct phase shift PLL 3004, and timing decision 5. The selection control signals 2007 are latched by the multiphase clock 2001-1 before they are output from the controller 6D. When the switching timing signal 2033 is active, new control signals 2007 are taken in. However, when the signal 2033 is inactive, the latched values are held. As a result, noise is prevented from being input via the input terminal 2009 of the direct phase shift PLL 3004, as stated earlier in relation to the other embodiments.

The phases switching signal 2101 goes active at the same time as the selection control signals 2007 change, thereby indicating switchover. Then, the signal 2101 goes inactive in response to the switching timing signal 2033. It should be noted that the signal 2101 is caused to go inactive in response to the signal 2033 because the direct phase shift PLL 3004 ends the phase control in response to a single pulse of the phase control signal 2009. In the case where the PLL 3004 is of the type needing a plurality of pulses for the phase control, the signal 2033 will render the signal 2101 inactive a number of times corresponding to the number of pulses.

Assume that the decision signal 2005 which appeared within the guard time, contains both the information for advancing the phase of the direct phase shift PLL 3004 and the information for retarding it. Then, the selection controller 6D determines that noise has been superposed on the received data 7, or that the input value is indefinite due to, e.g., the shut-off of the input channel, or that a tracking error has occurred in the output clocks 2011 of the PLL 3004 relative to the received data. In this case, the controller 6D produces a timing error signal on the timing error output terminal 10. Further, when the decision signal 2117 output from the lock decision 3016 is inactive and representative of an unlocked state, the controller 6D does not vary the selection control signals 2007 without regard to the value of the decision signal 2005 so as not to obstruct the lock-in process of the PLL 3004.

The lock decision 3016 determines whether or not the direct shift PLL 3004 is in a locked state by using the output clock 2001-1 of the multiplication PLL 2 and the output clock 2011-0 of the PLL 3004 as a master clock and a slave clock, respectively. The decision 3016 outputs an active signal if the PLL 3004 is in a locked state or outputs an inactive signal if otherwise.

Figure 35:
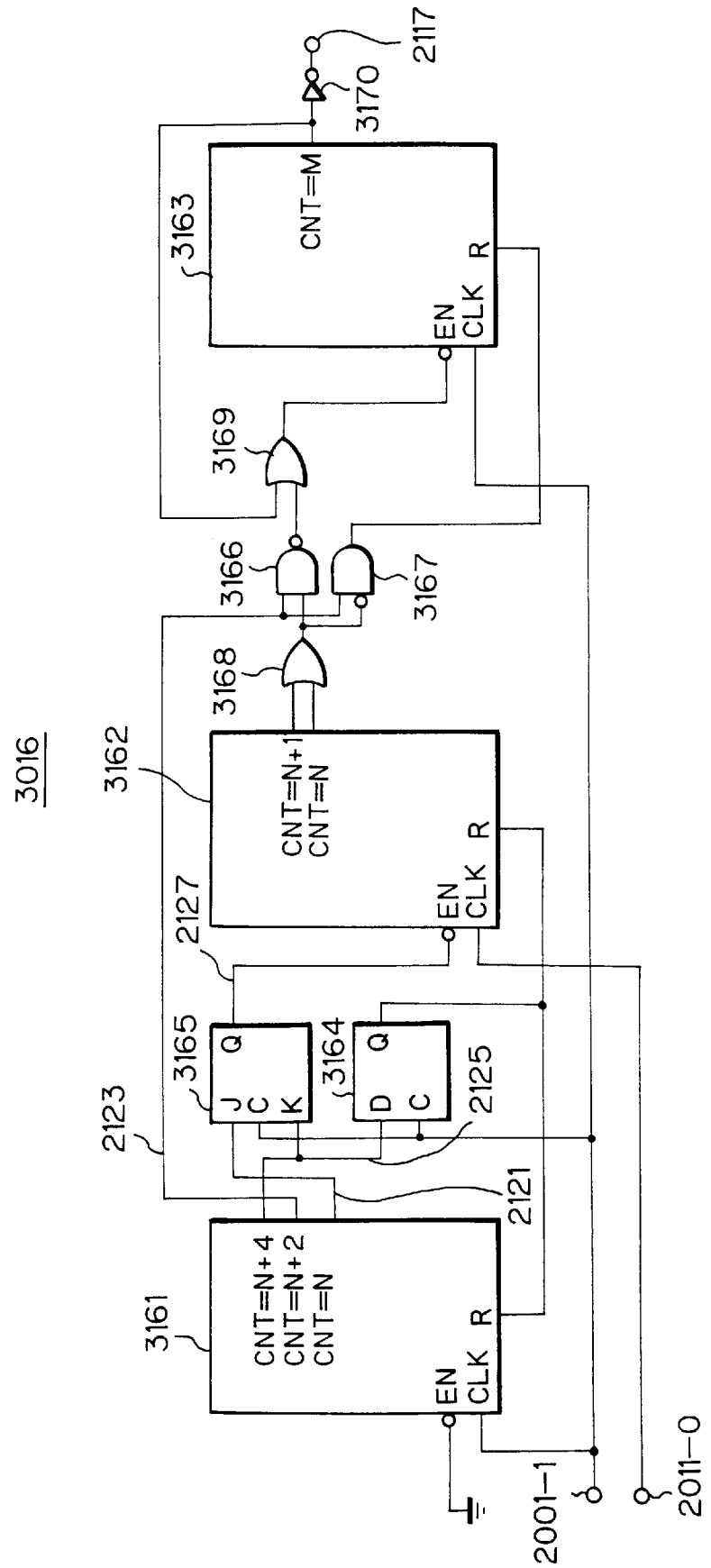
FIG. 35 is a block diagram schematically showing a specific configuration of a lock decision included in the embodiment shown in FIG. 32.

FIG. 35 shows a specific configuration of the lock decision 3016. As shown, the decision 3016 has binary counters 3161–3163, a D-type flip-flop 3164, a JK-type flip-flop 3165, a biinput NAND gate 3166, a biinput AND gate 3167 having one inverting input, OR gates 3168 and 3169, and a NOT gate 3170. The binary counters 3161 and 4163, D-type flip-flop 3164 and JK-type flip-flop 3165 operate in response to the master clock 2001-1 while the binary counter 3162 operates in response to the slave clock 2011-0. When the counter 3161 reaches N (any desired natural number), N+2 and N+4, it outputs active pulses on its output terminals 2121, 2123 and 2125, respectively. In response, the JK-type flip-flop 3165 feeds a pulse 2127 to the counter 1362 so as to disable it.

If the count of the counter 3162 is N or N+1 when the count of the counter 3161 is N+2, then the counter 3163 is incremented. If otherwise, the counter 3163 is reset to zero. To prevent the decision 3016 from erroneously determining that the PLL 3004 is in a locked state, the counter 3163 is caused to disable itself on reaching a count M (2 or greater integer). At this time, the counter 3163 causes the decision signal 2117 to go low, showing that the PLL 3004 is in a locked state. This provides the decision 3016 with M-stage guard.

Figure 36:
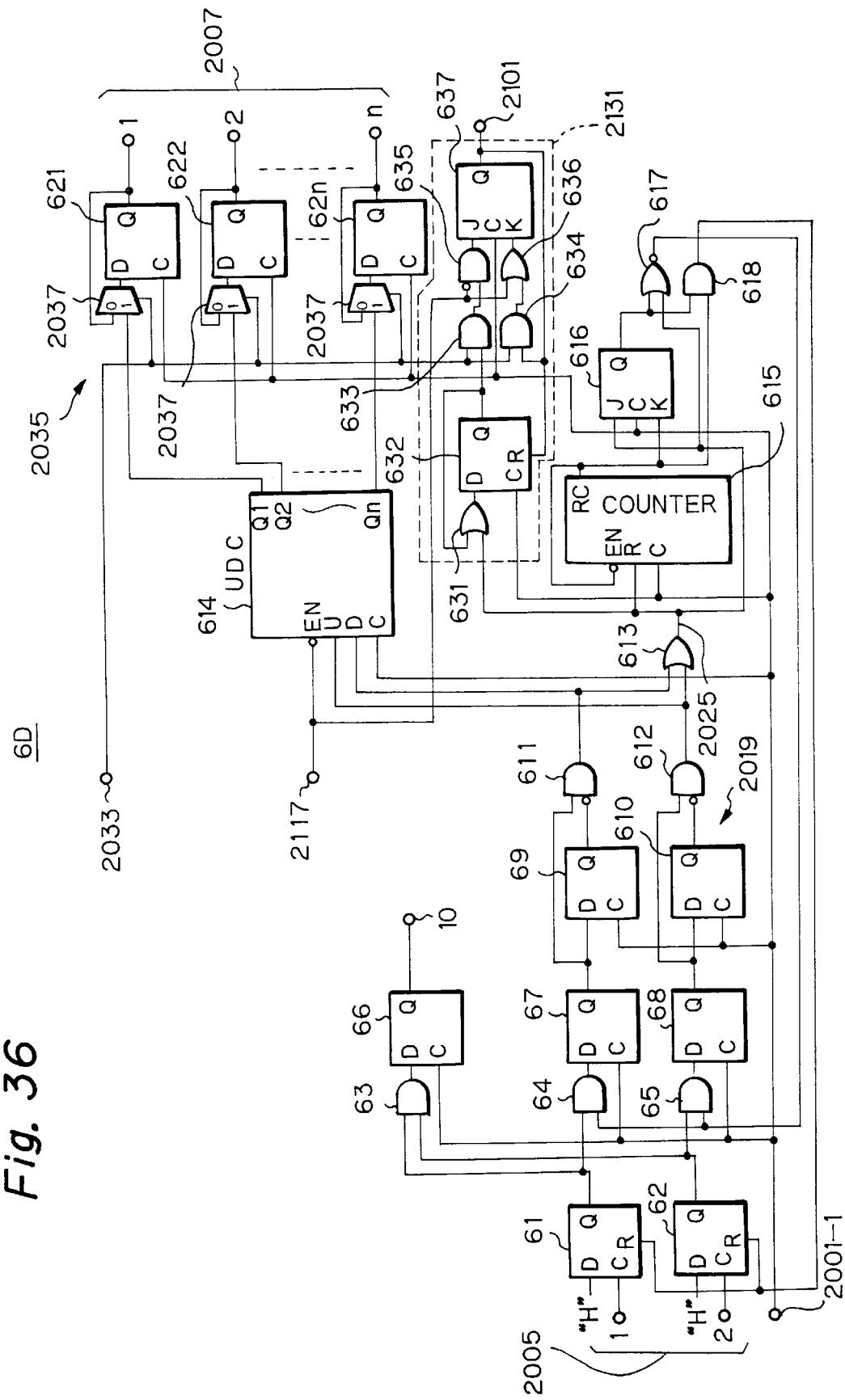
FIG. 36 is a block diagram schematically showing a specific configuration of a selection controller included in the embodiment shown in FIG. 32.

FIG. 36 shows a specific configuration of the selection controller 6D. As shown, the controller 6D is made up of the D-type flip-flops 61, 62, 66–69 and 610, D-type flip-flops 621–62n with selectors, biinput AND gates 63–65 and 618, biinput AND gates 611 and 612 each having one inverting input terminal, OR gate 613, UDC 614, binary counter 615, JK-type flip-flop 616, biinput NOR gate 617, OR gates 631 and 636, D-type flip-flop 632, AND gates 633 and 634, AND gate 635 having one inverting input terminal, and JK-type flip-flop 637. The OR gates 631 and 636, D-type flip-flop 632, AND gates 633 and 634, AND gate 635 and JK-type flip-flop 637 connected as illustrated in FIG. 36 constitute a circuit 2131 for generating the phase switching signal 2101 meant for the direct phase shift PLL 3004.

In operation, the decision signals 2005-1 and 2005-2 for advancing the phase and retarding it, respectively, are respectively input to the D-type flop-flops 61 and 62 as clocks. This is followed by the same procedure as in the embodiment shown in FIG. 17.

When a pulse appears in response to a positive-going edge of the decision signal 2005-1 or 2005-2, a high level signal is set in the D-type flip-flop 632. The switching timing signal 2033 appearing thereafter sets a high level signal in the JK-type flip-flop 637. As a result, a high level (active) signal appears on the phase switching signal output terminal 2101. The next switching timing signal 2033 sets a low level signal in the JK-type flip-flop 637 with the result that a low level (inactive) signal appears on the output terminal 2101. When a high level signal representative of a locked state appears on the terminal 2117, the UDC 614 is disabled so as to fix the selector 3. As a result, a low level signal appears on the output terminal 2101, preventing the lock-in process of the PLL 3004 from being obstructed.

As stated above, in this embodiment, the direct phase shift PLL 3004 is implemented by the reset VCO 3004a. The multiphase clocks 2001 output from the multiplication PLL circuit 2 are transformed to the multiphase partial clocks 2031. The partial clocks are selectively input to the PLL 3004. When the phase should be shifted, the reset VCO 3004a takes in the phase control signal 2009. When the phase should not be shifted, the VCO 3004a does not take in the signal 2009. In this condition, the PLL 3004 operates in the multiplication PLL mode using the phase control signal 2009 as a reference clock. This maintains the output clocks 2011 of the PLL 3004 stable at all times.

Among the stable output clocks 2011 of the direct phase shift PLL 3004, three adjoining clocks are used to execute the previously stated timing decision. If the timing is inadequate, then the partial clock having the phase of one of the clocks 2011 which is estimated to be adequate is fed to the selector 3. As a result, the output clocks of the PLL 3004 are shifted toward the phase estimated to be adequate. The partial clock frees the switching operation from noise. Moreover, the PLL 3004 is capable of outputting new phase clocks at a speed as high as about one to five clock period width without any momentary shut-off or noise. Therefore, bit phase synchronization can be set up rapidly even when the received data 7 are burst data. This is also true when the data 7 includes jitter. So long as the data 7 are stable, the PLL 3004 can output clocks as stable as clocks output from the PLL 2 only if the synchronization is set up once. Consequently, the continuous endurance against codes of the same data can be made substantially infinite. In addition, errors in the data 7 or in the PLL 3004 can be detected with ease.

With the above advantages, the illustrative embodiment implements a high performance apparatus for recovering digital data from received data easily at low cost.

Figure 37:
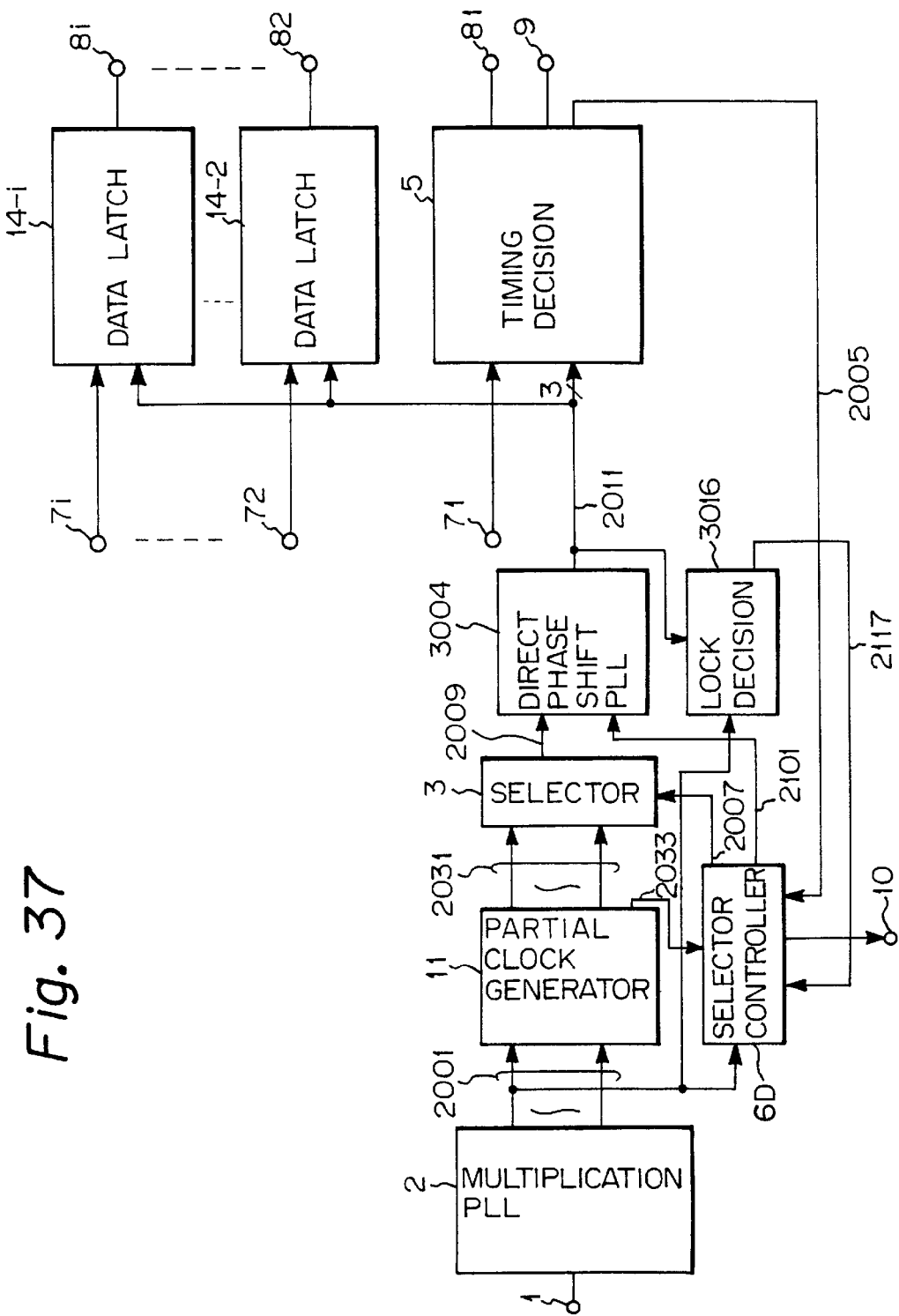
FIGS. 37 and 38 are schematic block diagrams each showing a further alternative embodiment of the present invention.

Referring to FIG. 37, another alternative embodiment of the bit phase synchronizing circuitry in accordance with the present invention will be described. As shown, the circuitry includes data latches 14-2 through 14-i. In FIG. 37, the same or similar constituents as the constituents shown in FIG. 32 are designated by the same reference numerals, and a detailed description thereof will not be made in order to avoid redundancy. Briefly, while the parallel data streams 7i-72 and 71 are input, the timing decision 5 performs a decision with the data stream 71 so as to output the synchronized data streams 8i-82 and 81.

Specifically, the data latch 14-i receives the data stream 7i and outputs the recovered data 8i synchronized on the basis of the triphase clock 2011 output from the direct phase shift PLL 3004. Likewise, the data latch 14-2 receives the data stream 72 and outputs the recovered data stream 82 synchronized on the basis of the triphase clock 2011. The timing decision 5 receives the data stream 71 and outputs the recovered data 81 synchronized on the basis of the triphase clock 2011. At the same time, the decision 5 outputs the clock used for the synchronization and the decision signal 2005. The decision signal 2005 is fed to the selector controller 6D, as stated earlier. The operation and advantages attainable with this embodiment will be understood by analogy with reference to FIG. 24 In this embodiment, the output of the direct phase shift PLL 3004, like the master data, is used to latch the slave data.

Figure 38:
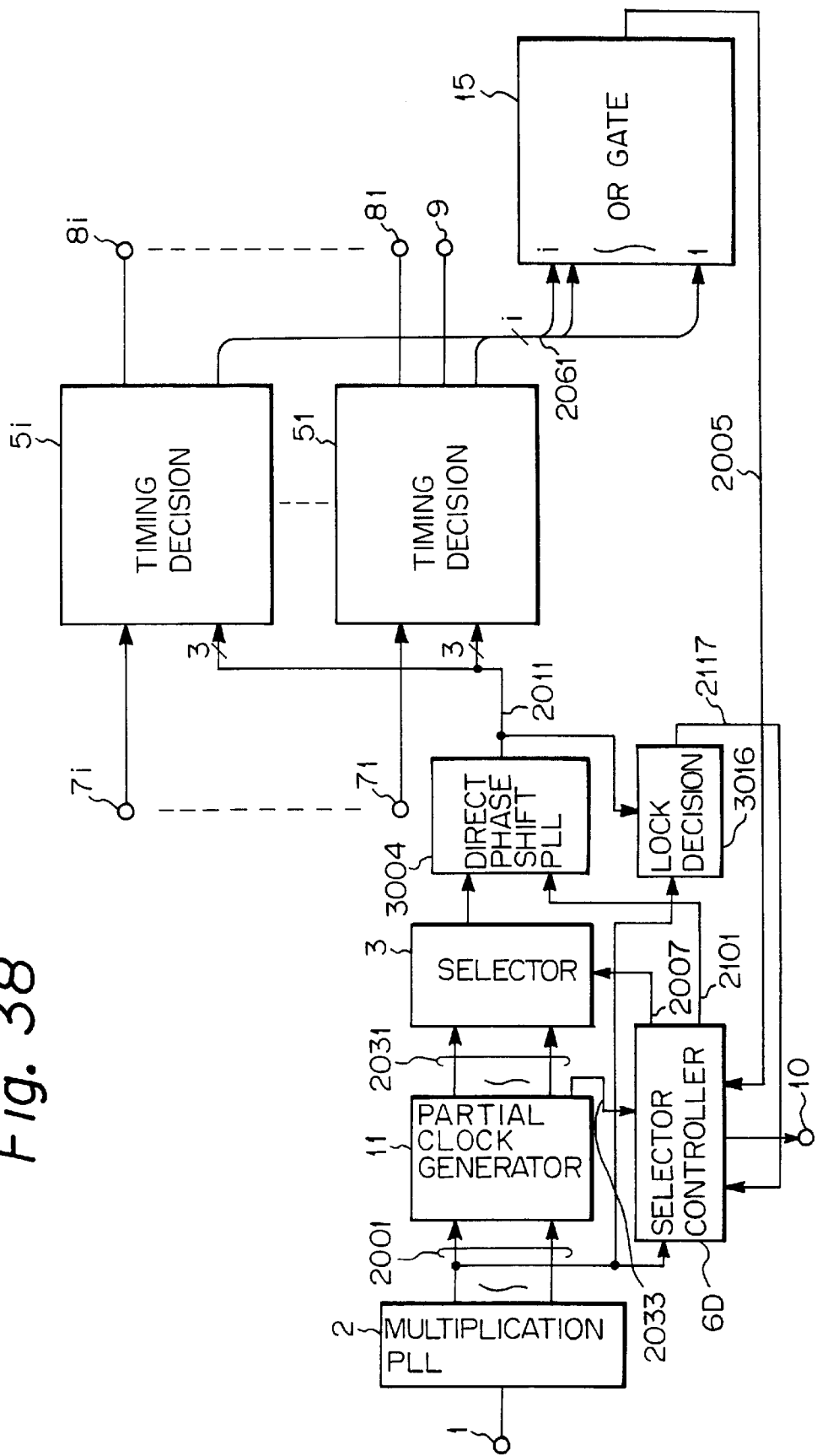

FIG. 38 shows a further alternative embodiment of the present invention. As shown, the circuitry includes the timing decisions 51-5i, OR gate 15, and lock decision 3016. This embodiment, like the embodiment shown in FIG. 25, deals with parallel data streams, and in addition makes a timing decision with each of the parallel received data streams. The timing decision 51 receives the data stream 71, sets up bit synchronization based on the triphase clock 2011 output from the direct phase shift PLL 3004, and then outputs the recovered parallel data 81, clock 9 used to recover the data 81, and decision signal 2061. The decision signal 2061 is fed to the OR gate 15. The timing decision 5i operates in the same manner as the decision 51 except that it receives the data stream 7i and outputs the recovered parallel data 8i and a decision signal 2061. The decision signal 2061 is also fed to the OR gate 15. The OR gate 15 ORs the decision signals 2061 output from the decisions 51-5i and delivers its output to the decision signal input terminal of the selection controller 6D.

In operation, the parallel data streams 71-7i are applied to the data input terminals of the timing decisions 51-5i, respectively. The decisions 51-5i each determines whether the current clock phase should be advanced or retarded on the basis of the phase relation between the input clock 2011 and the input data. The resulting decision signals from the decisions 51-5i are input to the OR gate 15. Further, the decisions 51-5i each latches the respective input data in response to the triphase clock 2011–0 and outputs it via the respective one of data output terminals 81-8i as recovered data. The decision 51 delivers the clock 2011 used to latch the data via its clock input terminal 9. The OR gate 15 ORs the decision signal 2061 output from all the decision signals 51-5i and feeds the resulting output thereof to the selection controller 6D.

As stated above, this embodiment sets up bit phase synchronization for all the bit lines assigned to parallel data streams. Therefore, even when any one of the parallel data streams is skewed in phase, the embodiment is capable of dealing with it in the same manner as with serial data as in the embodiments of FIGS. 32–37 without resorting to additional large-scale software.

While the embodiments have been shown and described on the assumption of signals which go high or active in the event of operation, the polarity of signals is, of course, open to choice so long as it is logically consistent.

In summary, the embodiments shown in FIGS. 30–38 have the following advantages. A PLL far more functional than conventional PLLs and capable of enhancing the performance of bit phase synchronizing circuitry is achievable. Bit phase synchronizing circuitry can output, without regard to the phase of received data, synchronized data and a clock extremely stably and rapidly with a simple arrangement. The circuitry is therefore scarcely susceptible to noise.

The PLL is selectively operable in the conventional PLL mode in response to a phase control signal or in a phase shift mode in response to a phase switching signal unique to the present invention. The PLL therefore achieves the advantages stated above.

While the present invention has been described with reference to the particular illustrative embodiments, it is not to be restricted by the embodiments. It is to be appreciated that those skilled in the art can change or modify the embodiments without departing from the scope and spirit of the present invention.

What is claimed is:

1. Circuitry for bit phase synchronizing parallel received data consisting of a plurality of data having a same bit rate, and a first clock having a clock frequency which is a (natural number) times as high as, or 1/a of the bit rate of the plurality of data, said circuitry comprising:

a PLL circuit;

a reset VCO circuit;

clock generating means for generating the first clock by controlling a phase and a frequency of a reference clock having a frequency m (m>0) times as high as or 1/m of the clock frequency of the first clock with said PLL circuit, said reset VCO circuit, a selector, a frequency control signal, and a selection control signal; and timing decision means for detecting differences in phase between the first clock and the plurality of received data, for generating said selection control signal based on phase difference signals representative of said differences and feeding said selection control signal to said clock generating means, and for latching the plurality of received data with the first clock and outputting synchronized data.

2. Circuitry for bit phase synchronizing received data and a first clock having a clock frequency which is a (natural number) times as high as or 1/a of a bit rate of said received data, said circuitry comprising:

n-phase clock generating means (n being 2 or greater natural number) comprising a PLL circuit for generating, out of a reference clock having a rate m (m>0) times as high as or 1/m of the clock frequency of the first clock, n-phase clocks with a frequency which is α times as high as or 1/a of the bit rate of the received data, and sequentially shifted in phase by a value produced by equally dividing one bit width of the received data, and for generating a frequency control signal;

selecting means for selecting one of said n-phase clocks in response to a selection control signal;

clock generating means for generating the first clock, and comprising a reset VCO circuit for receiving said frequency control signal and one clock selected by said selecting means as a phase control signal to thereby execute phase control and frequency control; and timing decision means for detecting a difference in phase between the first clock and the received data, for generating said selection control signal based on a phase difference signal representative of said difference and feeding said selection control signal to said selecting means, and for latching the received data with the first clock and outputting bit phase synchronized data.

3. Circuitry as claimed in claim 2, wherein said clock generating means controls, when said phase control signal is significant, a phase of the first clock on the basis of a phase of said phase control signal or causes, when said phase control signal is not significant, said reset VCO to self-run at a frequency determined by said frequency control signal to thereby generate the first clock.

4. Circuitry as claimed in claim 3 wherein said selecting means is provided with a preselected guard time which is an interval between a time when said selecting means selects the one phase clock and a time when said timing decision means outputs said phase difference signal, and wherein said selecting means masks said clock generating means in order to prevent a significant clock from being input to said clock generating means during said preselected guard time.

5. Circuitry as claimed in claim 1 wherein said selecting means is provided with a preselected guard time which is an interval between a time when said selecting means selects the one phase clock and a time when said timing decision means outputs said phase difference signal, and wherein said selecting means masks said clock generating means in order to prevent a significant clock from being input to said clock generating means during said preselected guard time.

6. Circuitry for bit phase synchronizing received data and a first clock having a clock frequency which is α (natural number) times as high as or 1/α of a bit rate of said received data, said circuitry comprising:

n-phase clock generating means comprising a PLL circuit for generating, out of a reference clock having a rate m (m>0) times as high as or 1/m of the clock frequency of the first clock, n-phase clocks with a frequency which is α times as high as or 1/α of the bit rate of the received data, and sequentially shifted in phase by a value produced by equally dividing one bit width of the received data, and for generating a frequency control signal;

n-phase partial clock generating means for partly omitting each of said n-phase clocks to thereby output n-phase partial clocks;

selecting means for selecting one of said n-phase partial clocks in response to a selection control signal;

clock generating means for generating the first clock, and comprising a reset VCO circuit for receiving said frequency control signal and one partial clock selected by said selecting means as a phase control signal to thereby execute phase control and frequency control; and timing decision means for detecting a difference in phase between the first clock and the received data, for generating said selection control signal based on a phase difference signal representative of said difference and feeding said selection control signal to said selecting means, and for latching the received data with the first clock and outputting bit phase synchronized data.

7. Circuitry for bit phase synchronizing received data and a first clock having a clock frequency which is α (natural number) times as high as or 1/α of a bit rate of said received data, said circuitry comprising:

first clock generating means comprising a PLL circuit for generating, out of a reference clock having a rate m (m>0) times as high as or 1/m of the clock frequency of the first clock, a second clock with a frequency which is a times as high as or 1/α of the bit rate of the received data, and for generating a frequency control signal;

partial clock generating means for partly omitting said second clock to thereby output a partial clock;

n-phase partial clock generating means for generating a delay control signal for generating n-phase partial clocks sequentially shifted in phase by equally dividing one bit width of the received data, and for generating said n-phase partial clocks based on said partial clock and said delay control signal;

selecting means for selecting one of said n-phase partial clocks in response to a selection control signal;

second clock generating means for generating the first clock, and comprising a reset VCO circuit for receiving said frequency control signal and one partial clock selected by said selecting means as a phase control signal to thereby execute phase control and frequency control; and timing decision means for detecting a difference in phase between the first clock and the received data, for generating said selection control signal based on a phase difference signal representative of said difference and feeding said selection control signal to said selecting means, and for latching the received data with the first clock and outputting bit phase synchronized data.

8. Circuitry as claimed in claim 7, wherein the received data comprise parallel data streams consisting of a plurality of data having a same bit rate, wherein the clock frequency of the first clock is α times as high as or 1/α of the bit rate of the plurality of data, and wherein said circuitry sets up bit phase synchronization for any one of the parallel data streams, and sets up bit synchronization for the other parallel data streams by latching the other parallel data streams with the first clock, thereby outputting the synchronized data.

9. Circuitry for outputting a synchronizing clock set up synchronization with received data, and synchronized data, said circuitry comprising:

initial bit phase synchronizing means for comparing bit data of a leading portion of the received data with multiphase clocks sequentially shifted in phase for stable phase detection to thereby set up initial bit phase synchronization, and outputting the synchronized data and the synchronizing clock; and tracking type bit phase synchronizing means for tracking, after said initial bit phase synchronization has been set up, variation in a phase or a frequency of the received data following the leading portion, and for continuously outputting the synchronized data and the synchronizing clock while maintaining the bit phase synchronization.

10. Circuitry as claimed in claim 9, wherein said initial bit phase synchronizing means comprises:

phase transferring means for sampling the received data with the multiphase clocks having N (3 or greater natural number) phases, and transferring each data sampled to a phase of any one of said N phases; and a stable phase data selector for outputting the synchronized data of, among N phase groups of data output from said phase transferring means, a phase group allowing the leading portion of the received data to be recognized most stably, the synchronizing clock, and an initial bit phase synchronization signal.

11. Circuitry as claimed in claim 9, wherein said tracking type bit phase synchronizing means comprises:

an M-phase clock generator/selector including a PLL circuit for generating M-phase clocks and a frequency control signal, said M-phase clock generator/selector selecting and outputting one of said M-phase clocks in response to a selection control signal;

an N-phase clock generator for generating, in response to the clock selected by said M-phase clock generator/selector and said frequency control signal, said multiphase clocks having N phases while causing a reset VCO circuit to execute phase control and frequency control; and a phase difference detector/selection controller for detecting a difference between the synchronizing clock and the synchronized data, and generating, based on a resulting phase difference signal and in response to said initial bit phase synchronization signal, said selection control signal.

12. A PLL circuit for bit phase synchronizing circuitry, comprising:
  a reset VCO circuit;
  a phase comparison control circuit;
  an input terminal for receiving a phase switching signal; and
  phase control means for feeding, when said phase switching signal has a preselected state, a phase control signal to said reset VCO to thereby set up a phase shift mode in which only said reset VCO oscillates, or feeding, when said phase switching signal does not have said preselected state, said phase control signal to said phase comparison control circuit to thereby set up a PLL mode.

13. Circuitry as claimed in claim 12, wherein parallel data consisting of a plurality of data having a same bit rate are received, wherein said circuitry sets up bit phase synchronization between said parallel data and a first clock having a clock frequency which is a (natural number) times as high as or 1/a of the bit rate of the plurality of data, and wherein said circuitry further comprises:
  clock generating means for generating the first clock from a reference clock having a frequency m (m>0) times as high as or 1/m of the clock frequency of the first clock by controlling a phase and a frequency with said PLL circuit, a partial clock generator, a selector, a selector controller, a lock decision means, a selection control signal, said phase control signal, and said phase switching signal; and
  timing decision means for
    detecting differences in phase between the first clock and the plurality of received data,
    generating said selection control signal based on the detected phase differences,
    feeding said selection control signal to said selector, and
    latching the plurality of received data with the first clock and outputting bit phase synchronized data.

14. Circuitry for bit phase synchronizing received data and a first clock having a clock frequency which is a (natural number) times as high as or 1/a of a bit rate of said received data, said circuitry comprising:
  n-phase clock generating means comprising a PLL circuit for generating, from a reference clock having a rate m (m>0) times as high as or 1/m of the clock frequency of the first clock, n-phase clocks with a frequency which is a times as high as or 1/a of the bit rate of the received data, and sequentially shifted in phase by a value produced by equally dividing one bit width of the received data;
  n-phase partial clock generating means for partly omitting each of said n-phase clocks to thereby output n-phase partial clocks, while generating a switching timing signal between consecutive pulses of said partial clocks;
  selecting means for selecting one of said n-phase partial clocks in response to a selection control signal;
  timing decision means for
    detecting a difference in phase between the first clock and the received data,
    generating said selection control signal based on a phase difference signal representative of said difference and said switching timing signal,
    feeding said selection control signal to said selecting means, and
    latching the received data with the first clock and outputting synchronized data;
  clock generating means for generating the first clock in response to the selected n-phase partial clock and a phase switching signal, comprising:
    a PLL circuit consisting of a reset VCO circuit,
    a phase comparison control circuit,
    an input terminal for receiving said phase switching signal, and
    phase control means for feeding a phase control signal to said reset VCO circuit when said phase switching signal has a preselected state, to thereby set up a phase shift mode in which only said reset VCO circuit oscillates, or feeding said phase control signal to said Phase comparison control circuit when said phase switching signal does not have said preselected state, to thereby set up a PLL mode; and
  lock decision means for
    determining, based on said n-phase clocks and the first clock, whether or not said PLL circuit of said clock generating means is in a locked state, and
    outputting a resulting lock decision signal;
  said timing decision means generating said phase switching signal from said switching timing signal, said lock decision signal and said phase difference signal, and feeding said phase switching signal to said PLL circuit of said clock generating means.

15. Circuitry as claimed in claim 14, wherein said selecting means is provided with a preselected guard time which is an interval between a time when said selecting means selects the one phase clock and a time when said timing decision means outputs said phase difference signal, and wherein said selecting means masks said clock generating means in order to prevent a significant clock from being input to said clock generating means during said preselected guard time.

16. Circuitry as claimed in claim 14, wherein the received data comprise parallel data streams consisting of a plurality of data having a same bit rate, wherein the clock frequency of the first clock is α times as high as or 1/a of the bit rate of the plurality of data, and wherein said circuitry sets up bit phase synchronization for any one of the parallel data streams, and sets up bit synchronization for the other parallel data streams by latching the other parallel data with the first clock.

17. Circuitry for bit phase synchronizing data, comprising:
  a clock multiplier for receiving a reference clock, and based on the reference clock generating n multiphase clocks, each clock being sequentially shifted in phase, where n is a natural number greater than 2;
  a selector for selecting one of the n multiphase clocks;
  a clock phase shifter for
    receiving the selected clock, and
    based on the selected clock generating two additional multiphase clocks including an advanced clock which is the multiphase clock with the phase next in sequence from the selected clock and a retarded clock which is the multiphase clock with the phase prior in sequence from the selected clock; and
  a phase comparator for
    receiving input data,
    performing a comparison which includes comparing the received input data with the selected clock, with the advanced clock and with the retarded clock to determine the result of the comparison, the result indicating whether or not the data is synchronized with the selected clock, and if not, whether the phase of the selected clock needs to be advanced or retarded in phase to obtain synchronization, forwarding a result of the comparison to the selector, the selector selecting one of the n multiphase clocks based on the forwarded results, latching the received input data and the selected clock, and outputting synchronized data if the received input data and the selected clock are synchronized.

18. Circuitry as claimed in claim 17, wherein the received input data is a received data stream, further comprising a plural number of data latches that are adapted to receive and latch a plural number of parallel data streams that are synchronous and aligned in phase with each other and the received data stream, each latch receiving a different one of the parallel data streams; whereby synchronization of all the parallel data streams with the selected clock is obtained by outputting all the data streams when synchronization between the selected clock and the received data stream is obtained.

19. Circuitry for bit phase synchronizing data, comprising:

a clock multiplier for receiving a reference clock, and based on the reference clock generating n multiphase clocks, each clock being sequentially shifted in phase, where n is a natural number greater than 2;

a selector for selecting one of the n multiphase clocks;

a clock phase shifters coupled to the selector for generating based on the selected clock, two additional multiphase clocks including an advanced clock which is the multiphase clock with the phase next in sequence from the selected clock and a retarded clock which is the multiphase clock with the phase prior in sequence from the selected clock;

a plurality of phase comparators, each phase comparator for receiving a different one of a plurality of parallel data streams that are synchronous and aligned in phase with each other, the number of parallel data streams equaling the number of phase comparators, performing a comparison which includes comparing the received data stream with the selected clock, with the advanced clock and with the retarded clock to determine a comparison result, the comparison result indicating whether or not the received data stream is synchronized with the selected clock, and if not, whether the phase of the selected clock needs to be advanced or retarded in phase to obtain synchronization with the received data stream, and latching the received input data and the selected clock; and an OR gate coupled to the phase comparators and the selector, for ORing the results determined by the phase comparators to produce an OR gate ouput and providing the OR gate output to the selector, the selector selecting one of the n multiphase clocks based on the forwarded OR gate output;

whereby synchronization of all of the data streams with the selected clock is obtained by outputting all the data streams when synchronization between the selected clock and any one of the data streams is obtained.

* * * * *